(12) United States Patent  (10) Patent No.: US 7,748,110 B2
Asahi et al.  (45) Date of Patent: Jul. 6, 2010

(54) METHOD FOR PRODUCING CONNECTION MEMBER

(75) Inventors: Toshiyuki Asahi, Hirakata (JP); Seiji Karashima, Hirakata (JP); Takashi Ichiryu, Moriguchi (JP); Seiichi Nakatani, Hirakata (JP); Tousaku Nishiyama, Nara (JP); Koichi Hirano, Hirakata (JP); Osamu Shibata, Nishinomiya (JP); Takeshi Nakayama, Katano (JP); Yoshiyuki Saito, Katano (JP)

(73) Assignee: Panasonic Corporation, Osaka (JP)

( * ) Notice: Subject to any disclaimer, the term of this patent is extended or adjusted under 35 U.S.C. 154(b) by 286 days.

(21) Appl. No.: 11/826,758

(22) Filed: Jul. 18, 2007

(65) Prior Publication Data

US 2008/0047137 A1 Feb. 28, 2008

Related U.S. Application Data

(62) Division of application No. 11/060,550, filed on Feb. 18, 2005, now Pat. No. 7,258,549.

(30) Foreign Application Priority Data

Feb. 20, 2004 (JP) ............................. P2004-044261
Feb. 20, 2004 (JP) ............................. P2004-044262
Jun. 23, 2004 (JP) ............................. P2004-184828

(51) Int. Cl.
 H05K 3/36 (2006.01)
(52) U.S. Cl. ............................. 29/830; 29/825; 174/254
(58) Field of Classification Search ................. 29/825, 29/830, 832, 843; 174/254
See application file for complete search history.

(56) References Cited

U.S. PATENT DOCUMENTS

| 5,369,379 | A | 11/1994 | Fujiki |
| 5,602,490 | A | 2/1997 | Blumenau |
| 5,973,395 | A | 10/1999 | Suzuki et al. |
| 6,014,318 | A | 1/2000 | Takeda |
| 6,027,791 | A | 2/2000 | Higashi et al. |
| 6,031,728 | A | 2/2000 | Bedos et al. |
| 6,040,037 | A | 3/2000 | Imai |
| 6,201,185 | B1 | 3/2001 | Ishida et al. |
| 6,262,895 | B1 | 7/2001 | Forthun |
| 6,350,132 | B1 | 2/2002 | Glatts, III |
| 6,426,549 | B1 | 7/2002 | Isaak |
| 6,729,888 | B2 | 5/2004 | Imaeda |
| 6,830,463 | B2 | 12/2004 | Keller |
| 7,423,219 | B2 * | 9/2008 | Kawaguchi et al. ......... 174/254 |
| 2001/0040793 | A1* | 11/2001 | Inaba .......................... 361/749 |
| 2005/0016765 | A1* | 1/2005 | Higuchi et al. ............. 174/258 |

(Continued)

FOREIGN PATENT DOCUMENTS

EP 0 568 930 11/1993

(Continued)

*Primary Examiner*—C. J Arbes
(74) *Attorney, Agent, or Firm*—Wenderoth, Lind & Ponack, L.L.P.

(57) ABSTRACT

A connection member can be produced without a via-forming step. The connection member includes an insulating substrate which has an upper surface, a lower surface opposed to the upper surface, and a side surface which connects these surfaces; and at least one wiring which extends from the upper surface to the lower surface through the side surface.

8 Claims, 36 Drawing Sheets

U.S. PATENT DOCUMENTS

| | | |
|---|---|---|
| 2005/0142917 A1 | 6/2005 | Verweg et al. |
| 2007/0246250 A1 * | 10/2007 | Tomita et al. ............... 174/258 |

FOREIGN PATENT DOCUMENTS

| | | |
|---|---|---|
| EP | 0 729 182 | 8/1996 |
| EP | 0 847 088 | 6/1998 |
| EP | 0 867 939 | 9/1998 |
| EP | 0 920 058 | 6/1999 |
| JP | 5-174889 | 7/1993 |
| JP | 6-111869 | 4/1994 |
| JP | 6-120671 | 4/1994 |
| JP | 6-268345 | 9/1994 |
| JP | 8-88062 | 4/1996 |
| JP | 8-228059 | 9/1996 |
| JP | 8-236654 | 9/1996 |
| JP | 10-107398 | 4/1998 |
| JP | 11-195729 | 7/1999 |
| JP | 11-220262 | 8/1999 |
| JP | 2000-36648 | 2/2000 |
| JP | 2002-231755 | 8/2002 |
| JP | 2002-313984 | 10/2002 |
| JP | 2003-100962 | 4/2003 |
| JP | 2003-110060 | 4/2003 |
| JP | 2003-197289 | 7/2003 |
| JP | 2004-146856 | 5/2004 |

* cited by examiner

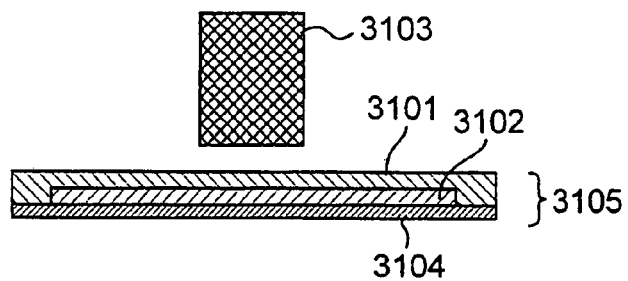
Fig.32(a)
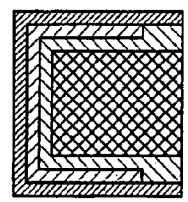
Fig.32(b)
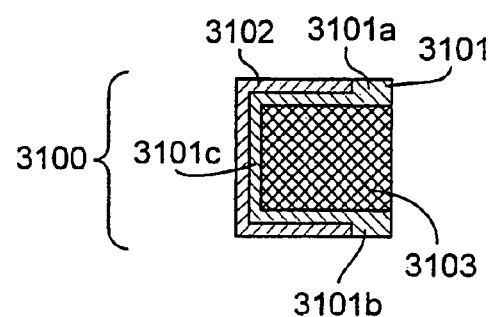
Fig.32(c)
Fig.33
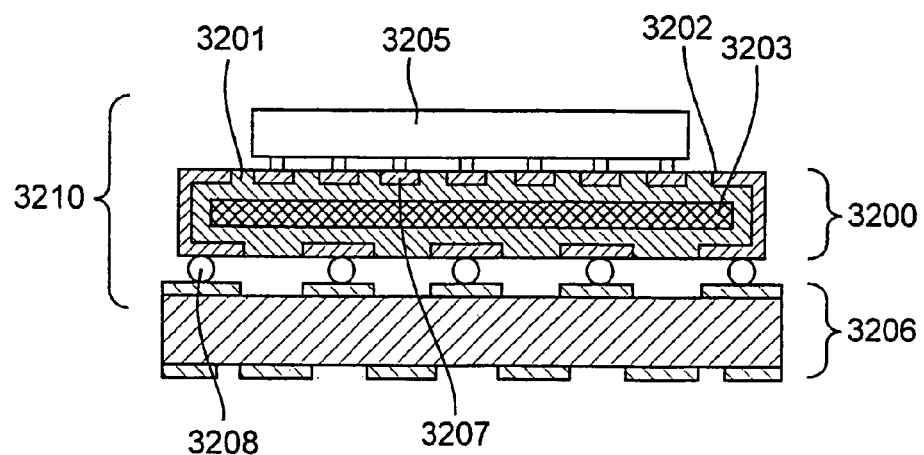

*Fig.38*
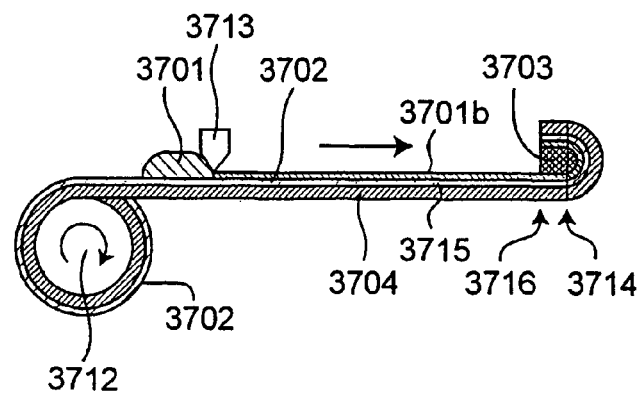
*Fig.39*(a)
*Fig.39*(b)
*Fig.39*(c)
*Fig.39*(d)
*Fig.39*(e)
*Fig.39*(f)
*Fig.39*(g)
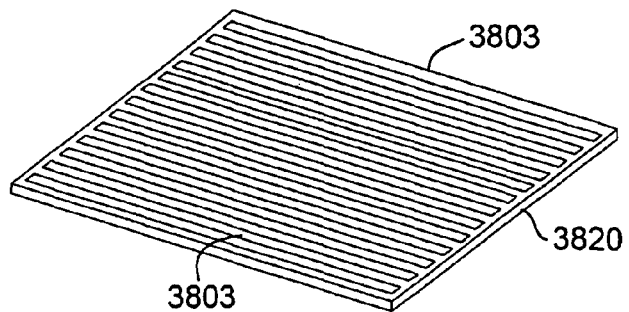

HEAT AND PRESSURE

HEAT AND PRESSURE

Fig.57
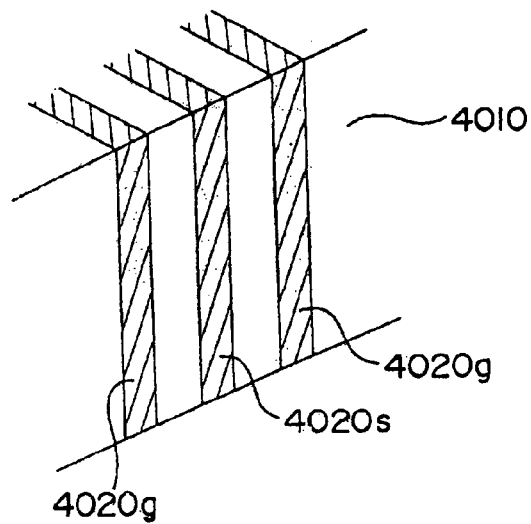
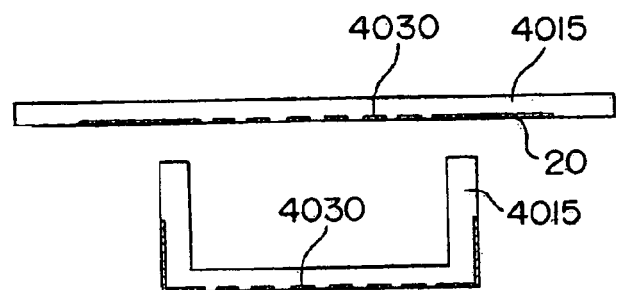
Fig.58(a)
Fig.58(b)
Fig.58(c)
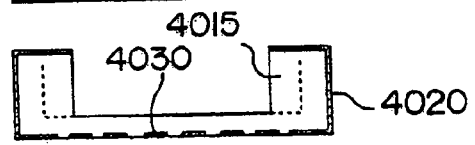
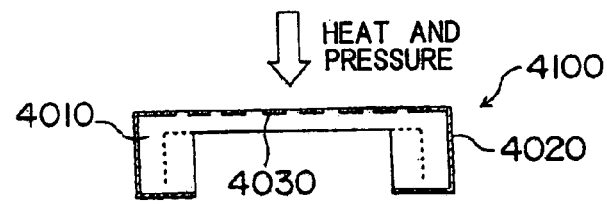
Fig.58(d)
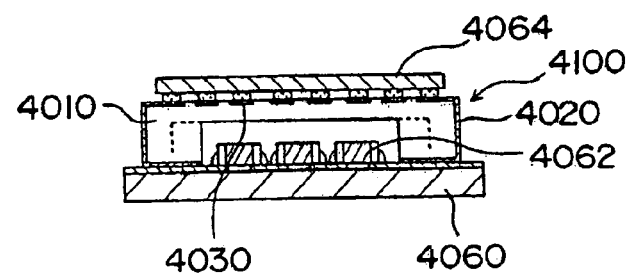
Fig.58(e)

METHOD FOR PRODUCING CONNECTION MEMBER

This application is a divisional application of application Ser. No. 11/060,550, filed Feb. 18, 2005, now U.S. Pat. No. 7,258,549.

TECHNICAL FIELD

The present invention is related to a connection member for connecting circuit boards, or a circuit board and an electronic component, and a method for producing the same, and a mount assembly including the connection member.

BACKGROUND OF THE INVENTION

When a circuit board having a predetermined electrical circuit is connected electrically to another circuit board, they are, in general, electrically and mechanically connected by using a stacking connector. The stacking connector is disclosed, for example in Japanese Patent Kokai (Laid-Open) Publication No. 8(1996)-228059(A).

Further, a technique for electrically connecting circuit boards using an anisotropic conductive film (ACF) has been developed. Such a technique is disclosed, for example, in Japanese Patent Kokai (Laid-Open) Publication No. 5(1993)-174889(A) and Japanese Patent Kokai (Laid-Open) Publication No. 6(1994)-268345(A). Further, as shown in Japanese Patent Kokai (Laid-Open) Publication No. 6(1994)-120671 (A), there is a technique which employs solder as a connection member between circuit boards so as to ensure mechanical and electrical connection therebetween.

As a connection member, a pressure welding electrical connector is disclosed in Japanese Patent Kokai (Laid-Open) Publication No. 2003-197289(A), and a terminal for surface mounting is disclosed in Japanese Patent Kokai (Laid-Open) Publication No. 6-111869(A).

Furthermore, as a dimension of an electronic equipment is recently smaller and thinner, miniaturization of a semiconductor chip and a finer pitch of electrodes are advanced. Not only a higher technique but also a higher cost is required for forming on a printed board many lands and wiring patterns which are adapted to each pad of a semiconductor chip having a small size and fine pitch. For this reason, a method for mounting a semiconductor chip on a mother board as a parent printed board through an intermediate board which is called an "interposer" has been recently employed widely. This method allows a semiconductor chip to be mounted on a board by an existing mounting technique. As the interposer, there are a ceramic interposer and a resin substrate interposer. The ceramic interposer is excellent in terms of thermal conduction, and the resin board interposer has an advantage in terms of cost. This interposer is also a kind of connection member for connecting a circuit board to another circuit board.

A technique for employing the interposer is disclosed, for example, in Japanese Patent Kokai (Laid-Open) Publication Nos. 2002-313984(A), 2003-110060, and 2003-100962. A board whose function is the same as that of the interposer is disclosed, for example, in Japanese Patent Kokai (Laid-Open) Publication Nos. 8(1996)-236654(A), 2000-36648(A) and 10(1998)-107398.

Furthermore, a three-dimensional mounting technique is developed for realizing higher density mounting, by using a module with a built-in component. This technique realizes higher density mounting by disposing an electronic component such as an active component (for example, a semiconductor device), and a passive component (for example, a capacitor) within a substrate.

This three-dimensional mounting provides, for example, a module with a built-in circuit component as shown in FIG. 67 (see Japanese Patent Kokai (Laid-Open) Publication No. 11(1999)-220262(A). A module with a built-in circuit component 2000 shown in FIG. 67 consists of a substrate 2001 formed by staking insulating substrates 2001a, 2001b and 2001c, wiring patterns 2002 (wiring layers) formed on a principal surface and an inside of the substrate 2001, and a circuit component 2003 located within the substrate 2001 and connected to the wiring patterns. The wiring patterns 2002 are electrically connected to a via hole conductor 2004. The insulating substrates 2001a, 2001b and 2001c are made of, for example, a mixture of an inorganic filler and a thermosetting resin.

As described above, various connection members have been used. The connection members, however, have a problem in that they cannot accommodate further miniaturization and a much finer pitch of a circuit board and component. This problem is described below.

When a stacking connector is used, it is necessary to secure a space on a circuit board where the stacking connector is to be disposed. This prevents miniaturization of an electronic device. Further, when the circuit board is a flexible printed board (for example, a polyimide board) and the stacking connector is attached to this flexible printed board, a thickness of an electronic device is difficult to be small because the stacking connector itself has a relatively-large thickness. Further, Japanese Patent Kokai (Laid-Open) Publication No. 8(1996)-228059(A) exemplifies an embodiment wherein a stacking connector is attached to a rigid circuit board (for example, a conventional printed board). Attachment of a rigid stacking connector to a flexible circuit board itself is relatively complicated and decreases a throughput of a production process. In addition, there is a limit as to adaptation to a fine pitch which is achieved by a connection technique with use of a stacking connector.

On the other hand, a technique with use of an anisotropic conductive film (ACF), as disclosed in Japanese Patent Kokai (Laid-Open) Publication Nos. 5(1993)-174889(A) and 6(1994)-268345(A) more easily adapts to a fine pitch as compared with the technique with use of the stacking connector. The anisotropic conductive film, however, is unstable relative to a temperature cycle including a high temperature and a high humidity depending on a base material, which causes a concern for a decreased reliability. Further, since the anisotropic conductive film has a constitution wherein conductive particles are dispersed in a resin film, a number of the conductive particles should be increased in order to ensure good conductivity. If the number of the conductive particles, however, is too large, a problem as to electrical insulation is caused. As a pitch is finer on a circuit board or a component which is to be connected by the ACF (anisotropic conductive film), a good balance between electrical conductivity and insulation is more difficult to be obtained.

A connection member disclosed in Japanese Patent Kokai (Laid-Open) Publication No. 2003-197289(A) includes a foamed member as an element. For this reason, this member is poorly self-sustained and should be disposed in a positioning guide when it is used, which limits mounting sites of an electronic component and a circuit board, and therefore reduces practicability. A connection member disclosed in Japanese Patent Kokai (Laid-Open) Publication No. 6(1994)-111869(A) is used as a surface mount terminal and therefore its shape and usage pattern are very limited. Further, Japanese Patent Kokai (Laid-Open) Publication Nos. 2003-197289(A) and 6(1994)-111869(A) do not teach a connection member for connecting an electronic component itself to a circuit board.

Furthermore, a prior art interposer has a problem described below. In a conventional interposer, electrical conduction between an upper surface and a lower surface is ensured by a via which is filled with a conductor. Therefore, it is necessary to form the via upon producing the interposer. Formation of the via needs a paste-filling step or a plating step in addition to a boring step for forming a through hole, which involves complications. Further, from a viewpoint of production cost, more resin interposers have been used instead of ceramic interposers. Since miniaturization of a semiconductor device gives rise to increase in calorific value, thermal conductivity of the resin interposers is essentially required to be increased.

Further, a connection structure with a solder ball is generally employed in a technique for mounting a semiconductor chip on a mother board as a parent printed board with a conventional interposer. The connection structure with a solder ball is limited by ball size and a connection pitch is larger as the solder ball is larger, which provides a limitation on narrowing pitch. Particularly, with a mounting structure wherein an interposer strides and covers a tall component, it is necessary to use a solder ball having a size corresponding to a height of the component, which results in a very large connection pitch. Further, since there is fluctuation in a size of a solder ball, a solder ball connection may not be made at some positions. Thus, the solder ball connection may be unstable, which reduces a product yield in a worst case. Furthermore, connection with use of a solder ball requires mounting solder balls one by one, and therefore has a problem of low productivity.

On the other hand, a built-in component technique has been developed as a three-dimensional mounting technique as described above. However, in this technique, a built-in component cannot be easily repaired or exchanged and additional cost is required to introduce a special instrument for three-dimensional mounting, which might be an obstacle to practical use of this technique.

The present invention is made in light of the problems of the conventional connection member, and an object of the present invention is to provide a connection member which has a construction different from that of a conventional one, so that it accommodates to fine pitch and it can be produced relatively efficiently, and to provide a method for producing the connection member. Another object of the present invention is to provide a module and a mount assembly which are obtained using the connection member.

SUMMARY OF THE INVENTION

In order to achieve the object as described above, the present invention provides a connection member which includes:

an insulating substrate which has an upper surface and a lower surface which is opposite to the upper surface, and a side surface which connects the upper and the lower surfaces; and at least one wiring which includes i) a side-surface wiring portion which is disposed on at least a part of the side surface and ii) at least one of an upper-surface wiring portion and a lower-surface wiring portion, with the upper-surface wiring portion being connected to the side-surface wiring portion and disposed on at least a part of the upper surface, and with the lower-surface wiring portion being connected to the side-surface wiring portion and disposed on at least a part of the lower surface.

In the connection member of the present invention, "insulating substrates" include a sheet-like or a plate-like substrate wherein a thickness dimension is smaller than other dimensions, and a cube and a rectangular parallelepiped whose thickness dimension is substantially the same as other dimensions. The "side surface" of the insulating substrate corresponds to a surface parallel to a thickness direction, and the "upper surface" and the "lower surface" correspond to surfaces vertical to the thickness direction. In a case where the insulating substrate takes a form wherein the thickness dimension is the same as the other dimensions (for example, a cube), the scope of the present invention covers a connection member wherein a wiring disposed on one surface (which is regarded as the side surface for convenience) further extends on at least one of surfaces which are parallel to each other and at right angles to the side surface, and these two surfaces which shall be at right angles to the side surface are regarded as the upper and the lower surfaces. The insulating substrate has a concavity in the upper surface and/or the lower surface. Further, in a case where the insulating substrate has an opening which penetrates the upper surface to the lower surface, surfaces which define the opening are also side surfaces. Furthermore, the terms "upper" and "lower" are used to refer to two surfaces vertical to the thickness direction, and they are not used to refer to absolute positions when the connection member is used.

The connection member according to the present invention is characterized in that it has wiring which extends from the side surface of the insulating substrate to at least one of the upper surface and the lower surface of the insulating substrate. The wiring is placed on at least a part of the side surface and further extends over a part of the upper surface and/or the lower surface. In this specification, for convenience, this wiring is referred to as a "U/L-shaped side wiring" so as to distinguish this wiring from other wirings which are disposed only on the upper surface or the lower surface. A "U-shaped side wiring" has a side-surface wiring portion on the side surface, and both of an upper-surface wiring portion and a lower-surface wiring portion, and is bent at a right angle or into an arc at each of a border between the side surface and the upper surface and a border between the side surface and the lower surface, whereby it has an approximate "U"-shaped portion. An "L-shaped side wiring" has a side-surface wiring portion and either an upper-surface wiring portion or a lower-surface wiring portion, and is bent at a border between the side surface and the upper surface or the lower surface at a right angle or into an arc, whereby it has an approximate "L"-shaped portion. Herein, these wirings are generically named as the "U/L-shaped side wiring" by using "/". The U/L-shaped side wiring ensures electrical conduction between the upper surface and the lower surface by its side-surface wiring portion, and electrically connects a circuit board or a component on an upper surface thereof to another circuit board or a component on a lower surface thereof. In the connection member of the present invention, the U/L-shaped side wiring is generally the U-shaped side wiring, wherein a part of the U-shaped side wiring extends on the upper surface of the insulating substrate and another part of the U-shaped side wiring extends the lower surface of the insulating substrate, and still another part of the U-shaped side wiring is disposed between these parts and extends on the side surface of the insulating substrate.

When the U/L-shaped side wiring is integrated with another electrical element (for example, a wiring pattern formed on the upper surface), the U/L-shaped side wiring may not be apparently distinguished from the electrical element. Also in that case, as long as the connection member includes a wiring portion which has the side-surface wiring portion and at least one of the upper-surface wiring portion and the lower-surface wiring portion, the connection member is included in the scope of the present invention. Further, the U/L-shaped side wiring may have a twisted or deformed "U" or "L" shape when the side-surface wiring portion extends not parallel to the thickness direction. Such U- or L-shaped side wiring is included in the U/L-shaped side wiring. The U/L-shaped side wiring may be branched, for example, on the side surface. As long as each branched wiring takes an approximate U- or L-shaped course, such a branched wiring is included in the U/L-shaped side wiring.

In one preferred embodiment of the connection member according to the present invention, the U/L-shaped side wiring passes through the side surface of the insulating substrate and extends between electrical elements on the upper surface and electrical elements on the lower surface so as to electrically connect the electrical elements, and therefore via(s) which penetrate from the upper surface to the lower surface do not exist. In other words, the U/L-shaped side wiring substitutes for a via. Preferably, a plurality of electrical elements exist on each of the upper and the lower surfaces, and therefore a plurality of U/L-shaped side wirings which substitute for vias preferably exist, and particularly preferably many electrical elements exist on each of the upper and lower surfaces.

A wiring pattern as an electrical element is a collective of wirings formed on the upper or the lower surface of the insulating substrate, and a part (for example, end portion) of the U/L-shaped side wiring is connected to a part of this wiring. An electrical connection element as the electrical element means an element which lies for electrically connecting a wiring, a wiring board, or an electronic component to the connection member, and may be, for example, a land, a pad, a terminal, a solder ball or a bump. Such electrical connection element may be connected to a part of the U/L-shaped side wiring. In general, it is preferred that the wiring pattern or the electrical connection element is previously formed together with a part of the U/L-shaped side wiring integrally. For example, the U/L-shaped side wiring and the electrical element which are connected to each other may be formed together by etching a single metal layer. When the U/L-shaped side wiring and the electrical element are not formed together, they may be connected using an electrical connection material (for example, an electrically conductive material such as solder, an electrical conductive adhesive, a thin film formed by plating or vapor deposition, or a metal wire).

In the connection member of the present invention, a ratio of [a length of the side surface of the insulating substrate (that is, a thickness)]/[a width of the U/L-shaped side wiring] is preferably at least 1. Further, a minimum pitch of the side-surface wiring portions of the U/L-shaped side wiring is preferably at most 0.4 mm. When a ratio of [a thickness of the insulating substrate]/[the width of the U/L-shaped side wiring] and a wiring pitch are so small, an electronic component with a fine pitch or a wiring board with a fine pitch can be connected to another component or another wiring board. A connection member wherein a plurality of U/L-shaped side wirings of such a narrow width are formed with such a small wiring pitch is a construction which has not been achieved in the prior art, and this construction is realized by forming each U/L-shaped side wiring by bending one wiring as described below.

In the connection member of the present invention, the insulating substrate may be formed of an insulating material which contains a resin or a resin-containing composition, and preferably of a composite material containing a resin and an inorganic filler. The resin may be at least one of a hardening resin (preferably a thermosetting resin or a light curing resin) and a thermoplastic resin. In a case of the hardening resin, the resin is substantially completely cured in a finished connection member. Alternatively, in a case where the upper surface and the lower surface has tackiness and adhesiveness under two different conditions, or a connection operation is performed using adhesiveness or flexibility of an uncured hardening resin, the hardening resin is substantially completely cured in a final product which includes the connection member. Herein, the expression "being completely cured" means being in a state wherein the resin is not hardened any more.

In one embodiment of the connection member of the present invention, at least a part of the side-surface wiring portion of the U/L-shaped side wiring may sink (or dent) in the insulating substrate in a direction perpendicular to a thickness direction of the insulating substrate. As a result, a surface of this sunken wiring is located at a position which is concave from a side surface of the insulating substrate. The sunken wiring may constitute at least a part of the side-surface wiring portion, and preferably all parts of the side-surface wiring portion. In a more preferred embodiment, in addition to the side-surface wiring portion, the upper-surface wiring portion and the lower-surface wiring portion of the U/L-shaped side wiring may sink in the insulating substrate such that these sunken parts are adjacent the side-surface wiring portion, or the sunken parts constitute an entirety of those portions. As a result, a corner portion of the U/L-shaped side wiring, which portion extends around a corner of the insulating substrate, is concave from the surface of the insulating substrate. In another embodiment, a surface of the U/L-shaped side wiring may be flush with a surface of the insulating substrate.

Therefore, in one preferred embodiment wherein at least a part of the wiring portion is concaved as described, an entire exposed surface of the side-surface wiring portion of the U/L-shaped side wiring sinks in the sheet substrate, whereby the exposed surface of the side-surface wiring portion is flush with or concave from the side surface of the substrate. In a particular preferred embodiment, an exposed surface of the U/L-shaped side wiring also becomes a bottom surface of a concave at a corner portion of the U/L-shaped side wiring (where the upper or the lower surface and the side surface of the substrate intersect).

In one embodiment of the connection member according to the present invention, the U/L-shaped side wirings can serve as a coplanar line. The U/L-shaped side wirings serving as the coplanar line preferably sink in the side surface of the insulating substrate.

In one embodiment of the connection member according to the present invention, the insulating substrate may be formed by folding a sheet containing a semi-cured resin and then completely curing this folded sheet. Such folding can form the U/L-shaped side wiring which extends from the upper surface to the lower surface as a single wiring in the connection member. The sheet containing the semi-cured resin is preferably provided with a wiring pattern which includes, as a part, a wiring which is to form the U/L-shaped side wiring. The wiring pattern becomes a wiring pattern on at least one surface of the connection member, which pattern is connected to the U/L-shaped side wiring to provide an electrical circuit.

A shape of the connection member of the present invention may be any shape in any embodiment described below. Specifically, the insulating substrate has an upper surface of an approximate rectangle consisting of long sides and narrow sides shorter than the long sides. In this case, the U/L-shaped side wirings may be arranged so that their side-surface wiring portion(s) are disposed only on side surface(s) adjacent the long side(s).

Alternatively, in the connection member of the present invention, the upper surface of the insulating substrate may be an L-shape, a U-shape, or a rectangular frame with an opening at its center. Alternatively, at least one of the upper surface and the lower surface of the insulating sheet may have at least one of concave portion and convex portion.

The connection member of the present invention may be provided in various embodiments as long as it has the U/L-shaped side wiring. Specifically, the connection member of the present invention may be provided as a sheet-like connection member wherein the insulating substrate is a sheet substrate (hereinafter, this connection member is particularly referred to as a "connector sheet"). Herein the "sheet substrate" refers to a thin substrate wherein a thickness dimension is smaller than other dimensions. The connector sheet may be advantageously used in that it less affects a low profile of a mount assembly. Further, since the connector sheet ensures electrical conduction between the upper surface and the lower surface by the U/L-shaped side wiring, it can well connect two or more printed boards even if its thickness is small. Furthermore, this connector sheet may be formed so as to adapt to a wiring board with a fine pitch or a component with a fine pitch by adjusting a width of the U/L-shaped side wiring and a space between the U/L-shaped side wirings.

In a case where the sheet substrate constituting the connector sheet contains a hardening resin, the hardening resin may be uncured or cured. The hardening resin contained in the sheet substrate preferably has tackiness and adhesiveness as well as flexibility until the connector sheet is connected to an electronic component or a circuit board in a predetermined manner and is preferably hardened in a final product wherein the connector sheet is connected to the electronic component or the circuit board. An uncured state of the resin may be utilized for forming the U/L-shaped side wiring and connecting two circuit boards in a predetermined direction with the connector sheet at the same time by folding a sheet containing the resin (see FIG. 16). Further, when this uncured hardening resin has tackiness, the electronic component or the circuit board may be temporarily connected to the connector sheet and then an examination can be conducted. In this case, when an electrical connection is seen to be bad, a temporal connection is released and a problematic member (for example, an electronic component or the connection member) can be easily replaced by another one. Alternatively, when the uncured hardening resin has adhesiveness, the connector sheet may be easily attached to an electronic component or a circuit board by using this adhesiveness.

In one embodiment of the connector sheet of the present invention, the upper surface of the sheet substrate is a flat surface and eight U/L-shaped side wirings are provided.

In another embodiment of the connector sheet of the present invention, at least one of the upper surface and the lower surface of the sheet substrate has at least one of concave portion and convex portion, and eight U/L-shaped side wirings are provided.

In a case where at least one of the upper surface and the lower surface of the sheet substrate has at least one of the concave portion and the convex portion in the connector sheet, at least one of the upper surface-wiring portion and the lower surface-wiring portion of the U/L-shaped side wiring preferably extends on at least one of an inner side surface of the concave portion and a protruded side surface of the convex portion. In this connector sheet, the inner side surface of the concave portion and/or the protruded side surface of the convex portion are electrically connected to the upper surface or the lower surface of the connection member via the wiring portion extending on the inner side surface of the concave portion and/or the protruded side surface of the convex portion.

In one embodiment of the connector sheet of the present invention, the upper surface of the sheet substrate has an approximate rectangular shape consisting of long sides and narrow sides shorter than the long sides. Alternatively, the upper surface of the sheet substrate has an "L"-shape or a rectangular frame shape.

In one embodiment of the present invention, the upper surface and the lower surface of the sheet substrate may have tackiness under a first condition and adhesiveness under a second condition that is different from the first condition. In that case, the second condition is a condition under which a hardening (or curing) reaction of a material constituting the upper surface and the lower surface proceeds. The connector sheet having tackiness and adhesiveness can be replaced with another one during assembling of a module. Herein, "adhesiveness" means permanent adhesiveness and "tackiness" means that if an object has tackiness, it can be bonded to another object by applying a slight pressure and removed again. In general, the term "tackiness" is used as a word meaning the opposite of permanent adhesiveness. In general, an object (sheet substrate) having tackiness can be bonded to another object or cause another object to be bonded to the object by only applying a slight pressure at room temperature during a short time, without using water, a solvent and heat. The object bonded to the another object by its tackiness is fixedly bonded to the another object, but it can be peeled off from a hard flat surface, since a tack portion has a cohesive power and elasticity. On the other hand, the term "adhesion" refers to a state wherein two faces are integrally bonded by a chemical force or a physical force or both. In general, an adhesive agent can bond two or more objects into one body by adhesion.

A surface having tackiness and adhesiveness preferably contains a material selected from a group consisting of a mixture of a silicone resin and a thermosetting resin, a mixture of a thermoplastic resin and a thermosetting resin, and a mixture of a UV-curing resin and a thermosetting resin. The first condition may be preferably a temperature condition in a range of 0° C. to 80° C. when these materials or other materials are used. That is, the first condition is achieved by placing the upper surface and the lower surface in an atmosphere in this temperature range. The second condition may be preferably a temperature condition under which post-curing reaction of the thermosetting resin proceeds. That is, the second condition is achieved by placing the upper surface and the lower surface in an atmosphere of a temperature at which curing of the thermosetting resin proceeds and then the thermosetting resin is completely hardened.

In the above, the connector sheet is described as one embodiment of the connection member of the present invention. The connection member of the present invention may be provided as a connection member with a core, wherein the insulating substrate is a substrate including (1) a core member and (2) an electrically insulating layer which covers at least a part of the core member. In this connection member, the electrically insulating layer which constitutes the insulating substrate has an upper-surface portion which is disposed on at least a part of an upper surface of the core member, a lower-surface portion which is disposed on at least a part of a lower surface of the core member which is opposite to the upper surface of the core member, and a side-surface portion which is disposed on at least a part of a side surface of the core member and connects the upper-surface portion and the lower-surface portion. Further, in this connection member, the upper-surface wiring portion of the U/L-shaped side wiring is disposed on at least a part of the upper-surface portion of the electrically insulating layer, the lower-surface wiring portion is disposed on at least a part of the lower-surface portion of the electrically insulating layer, and the side-surface wiring portion is disposed on at least a part of the side-surface portion of the electrically insulating layer. In the connection member of this embodiment, the core member is closely adhered to the electrically insulating layer and supports the electrically insulating layer. In a case where the core member is rigid, a shape of the electrically insulating layer can be maintained stably.

In a preferred embodiment of the connection member with a core, a via which penetrates from the upper-surface portion to the lower-surface portion of the electrically insulating layer does not exist. That is, the side-surface wiring portion of the U/L-shaped side wiring which extends on the side-surface portion of the electrically insulating layer substitutes for a via. In a more preferred embodiment, a plurality of electrical elements exist on each of the upper- and the lower-surface portions, and therefore a plurality of U/L-shaped side wirings which connect the electrical elements preferably exist, and particularly preferably many U/L-shaped side wirings exist. Each electrical element is as described above, and a detail description thereof is omitted.

In the connection member with a core, the electrically insulating layer is of an insulating material layer which provides a place where the U/L-shaped side wiring is situated. Therefore, the electrically insulating layer may be preferably formed of a material which is already referred to as the material for the insulating substrate. That is, the electrically insulating layer may be preferably formed of an insulating material containing a resin or a resin-containing composition, and more preferably of a composite material containing a resin and an inorganic filler. The resin may be at least one of a hardening resin (preferably a thermosetting resin or a light curing resin) and a thermoplastic resin. In another embodiment, material of the electrically insulating layer may optionally be flexible.

In a case where the electrically insulating layer contains the hardening resin, the hardening resin may be uncured or cured. That is, the hardening resin contained in the electrically insulating layer is uncured and has tackiness and adhesiveness until the connection member is connected to an electronic component or a circuit board in a predetermined manner, and is preferably hardened in a final product wherein the connection member is connected to the electronic component or the circuit board. In a case where the electrically insulating layer contains the uncured hardening resin, as described in conjunction with the sheet substrate of the connector sheet, the connection member may be easily attached to the circuit board or the electronic component, or an examination and a component replacement may be conducted by utilizing the tackiness of the hardening resin. Further, in a case where the electrically insulating layer contains the uncured hardening resin and the core member has flexibility, the connection member may be optionally bent when it is used.

In one embodiment of the connection member with a core, the core member may be preferably formed of a flexible material (for example, a resin film or a metal foil). In that case, freedom of mounting with use of the connection member is advantageously increased. In another embodiment, the core member may be preferably formed of a metal (such as copper, nickel or aluminum). In that case, since thermal conductivity of the connection member can be increased, the connection member is advantageously used when heat should be released in a large amount from a semiconductor device or a board which includes the device. Further, in a case where the electrically insulating layer does not cover an entire surface of the core member and exposes at least a part of the core member, heat release by the core member can be more effectively exploited. A core member of a metal increases this effect.

In still another embodiment of the connection member with a core, at least a part of a surface of the core member may be roughened. In a case where the electrically insulating layer is formed on this roughened surface, adhesion between the electrically insulating layer and the core member is increased to improve reliability of the connection member.

A configuration of the core member in the connection member with a core is not limited to a particular one, and an entire configuration may be, for example, a rectangular parallelepiped or a configuration having a concave portion. When the core member has a concave portion, an electronic component can be disposed within the concave portion. Further, a shape of the core member seen from a direction in which the upper surface and the lower surface overlap (that is, seen from right above) may be a rectangular frame shape or a U-shape. In that case, an electronic component may be easily disposed three-dimensionally and thereby a mounting density is increased. Further, in the connection member with a core, the side-surface portion of the electrically insulating layer may be curved. A curve of the side-surface portion of the electrically insulating layer may be caused by a curve of the side surface of the core member, or may be caused by folding the electrically insulating layer.

In the connection member of the present invention, the insulating substrate may be a plate substrate. In that case, the connection member of the present invention may be preferably used as an interposer. The "interposer" is an electrode-pitch converting board which is used for mounting a semiconductor device (particularly a bare chip) onto a board. A terminal of the semiconductor chip and a connection terminal of the printed board can be electrically connected through the interposer, or a grid can be converted through the interposer. The "plate substrate" generally means a member wherein a thickness dimension is smaller than other dimensions. The plate substrate is generally a rigid substrate, however, it may have flexibility as long as the flexibility dose not obstruct usage of the connection member. The plate substrate may be formed of material which is already referred to as the material of the insulating substrate. When the plate substrate contains, for example, a hardening resin, the resin may be previously hardened in the plate substrate before the connection member is connected to an electronic component or a circuit board. In that point, the plate substrate is different from the sheet substrate wherein the hardening resin may be uncured before the connection member is connected to the electronic component or the circuit board. Preferred embodiments for the interposer are particularly described below as the connection member including the plate member.

In one embodiment of the interposer of the present invention, the interposer is an organic interposer wherein sixteen or more U/L-shaped side wirings are provided. Herein, the "organic interposer" refers to an interposer which contains an organic material, and the organic materials include an organic resin such as a thermoplastic resin and a thermosetting resin.

In another embodiment of the present invention, at most five hundred U/L-shaped side wirings are provided. In the interposer of the present invention, a width of the U/L-shaped side wiring and a space between the U/L-shaped side wirings can be small, which allows a configuration wherein many (at most five hundred) U/L-shaped side wirings are provided. A semiconductor device with a fine pitch is suitable to be mounted on an upper surface or a lower surface of the interposer having such many U/L-shaped side wirings.

In the interposer of the present invention, one end of the U/L-shaped side wiring may be disposed, for example, in an outer peripheral region of an upper surface of the plate substrate depending on an arrangement of terminals of a semiconductor device. Alternatively, one end of the U/L-shaped side wiring may be arranged into a grid pattern on a lower surface of the plate substrate depending on an arrangement of terminals of a circuit board to which the interposer is mounted.

In one embodiment of the interposer of the present invention, an area of the upper surface of the plate substrate is at most 200 mm$^2$, and the number of the U/L-shaped side wirings is at most sixteen on the upper surface.

In another embodiment of the interposer of the present invention, a land may be formed together with the U/L-shaped side wiring at one end or both ends of the U/L-shaped side wiring.

A shape of the plate substrate constituting the interposer is not particularly limited. For example, the upper surface of the plate substrate may have an approximate rectangular shape consisting of long sides and narrow sides shorter than the long sides. In that case, a length of the long sides may be at most three times a length of the narrow sides, or may be at least ten times the length of the narrow sides. Further, when the plate substrate is rectangular, the U/L-shaped side wirings may be arranged such that the side-surface wiring portions are placed only on a side surface(s) adjacent a long side(s).

In one embodiment of the interposer of the present invention, a width of the side-surface wiring portion of the U/L-shaped side wiring is at most 0.25 mm and a space between the side-surface wiring portions is at most 0.3 mm. A configuration wherein the width and the space as to the U/L-shaped side wirings is small can be realized by a technique of bending wiring for forming the U/L-shaped side wirings, and this configuration is an important characteristic of the present invention. This characteristic allows the connection member to adapt to a semiconductor device having a fine pitch or a circuit board having a fine pitch.

The interposer may have a shield layer inside the plate substrate. The shield layer may be provided for protecting, for example, a semiconductor device mounted on the upper surface of the interposer against an electromagnetic wave from a board (such as a mother board) where the interposer is mounted. The shield layer is difficult to be formed inside a plate substrate having vias. The interposer according to the present invention can be constructed without vias in the plate substrate, whereby the shield layer can be easily formed inside the plate substrate.

In one embodiment of the present invention, the plate substrate has an approximately hexahedral shape wherein the upper and the lower surfaces of the plate substrate each have an approximately rectangular shape. Herein the terms "approximate hexahedron" and "approximate rectangle" are used in the sense that they include, in addition to a geometrical hexahedron such as (a rectangular parallelepiped and a cube) and a rectangle (such as a square and a rectangle), hexahedrons and rectangles whose corners or edges are rounded and those whose surfaces are not completely flat but curved. In that case, a plurality of U/L-shaped side wirings may be provided so that side-surface wiring portions are situated on all of four side surfaces of the approximate hexahedron. In other words, the interposer of the present invention may have at least four U/L-shaped side wirings whose positions of the side-surface wiring portions are different from each other provided that a single U/L-shaped side wiring does not extend over two side surfaces. The words "extending over two side surfaces" means that the U/L-shaped side wiring extends from the upper surface to the lower surface through one side surface and reaches another side surface. Herein, such a U/L-shaped side wiring is regarded as two or more U/L-shaped side wirings corresponding to the number of the side surfaces where the U/L-shaped side wiring passes.

In one embodiment of the interposer of the present invention, the plate substrate may be a rectangular frame shape with an opening in its center. In that case, the side-surface portion of the U/L-shaped side wiring may be disposed on an inner side surface which defines the opening, and a shield layer may be provided on an outer side surface of the plate substrate. The interposer of this constitution effectively reduces noise since the U/L-shaped side wiring is disposed on the inner side surface which is enclosed by the plate substrate, and the outer side surface is covered with the shield layer.

In another embodiment of the interposer of the present invention, the plate substrate may be of a shape which has at least one of a concave portion and a convex portion. This shape may enable an electronic component to be mounted three-dimensionally, whereby more electronic components can be mounted on a printed board (a parent board) having a predetermined mounting area.

The plate substrate may have a U-shape or a C-shape. More specifically, the plate substrate may have a U-shape or a C-shape when one side surface of the plate substrate is seen or when the plate substrate is seen from a direction in which the upper surface and the lower surface overlap. A plate substrate whose side surface is U-shape or C-shape may be of a rectangular shape when it is seen from the upper surface. Further, the plate substrate whose side surface is U-shape or C-shape may have a portion where the side surface does not connect the upper surface and the lower surface.

In the interposer of the present invention, the U/L-shaped side wiring may be a wiring having only the upper-surface wiring portion and the side-surface wiring portion, that is, an L-shaped side wiring. With use of solder or a conductive adhesive, the L-shaped side wiring can electrically connect a semiconductor device which is mounted on the interposer to a board (such as a mother board) where the interposer is mounted. One end portion of the side-surface wiring portion of the L-shaped side wiring is preferably disposed on a boundary portion between the side surface and the lower surface of the interposer. Thereby, the side-surface portion can be more securely connected to the board on which the interposer is mounted.

In a case where the U/L-shaped side wiring is of an L-shape, it is preferable that only the U/L-shaped side wiring provides electrical conduction between the upper surface and the side surface of the plate substrate. Therefore, it is preferable that a via is not formed in the plate substrate. Further, a guide groove which leads to the L-shaped side wiring is preferably formed on the side surface of the plate substrate. Such a groove may be formed, as described above, by locating the top surface of the side-surface wiring portion at an inner position of the plate substrate relative to the side surface of the plate substrate.

The interposer of the present invention is one embodiment of the present invention. Therefore, of course, the interposer of the present invention may have any of the constructions common to all embodiments of the connection member of the present invention which is already described above. For example, one end of the U/L-shaped side wiring may be connected to an electrical element and the electrical element and the U/L-shaped side wiring may be formed together in the interposer of the present invention. Further, in the interposer of the present invention, a portion of the U/L-shaped side wiring which is situated in the corner portion of the plate substrate may be preferably located at an inner position of the plate substrate relative to a surface defining the corner portion.

The connection member of the present invention is combined with two or more circuit boards to construct a mount assembly. That is, the present invention provides a mount assembly including at least one connection member of the present invention and at least two circuit boards, wherein the connection member is disposed between the circuit boards. The connection member may be, for example, the connector sheet as described above.

In this mount assembly, two circuit boards may be connected with a plurality of connection members. The connection member with a core is particularly suitable for such connection, since a plurality of connection members with cores can be formed so that they have a relatively uniform dimension (particularly, thickness).

In the mount assembly of the present invention, two circuit boards may be connected to the connection member by different mounting methods. For example, one circuit board may be connected to the upper surface of the connection member by reflow soldering and the other circuit board may be connected to the lower surface of the connection member by an anisotropic conductive film (ACF).

Another mount assembly including the connection member of the present invention may further include:

a first circuit board having a wiring pattern on a side surface;

a second circuit board having a wiring pattern on a side surface; and the connection member of the present invention, wherein the wiring pattern formed on the side surface of the first circuit board is connected to a side-surface wiring portion on one side surface of the connection member, and the wiring pattern formed on the side surface of the second circuit board is connected to a side-surface wiring portion on another side surface of the connection member, whereby the first and the second circuit boards are electrically connected. This mount assembly has a construction wherein the circuit boards are connected in a horizontal direction (a direction parallel to the upper and lower surfaces). Three or more circuit boards may be connected. This mount assembly may be preferably constructed by using the connector sheet or the connection member with a core.

In the mount assembly described above, an exposed surface of the U/L-shaped side wiring formed in the connection member may be concave from the surface of the connection member, the wiring pattern formed on the circuit board may have a portion protruded from the surface of the circuit board, and this concave exposed surface of the wiring and this protruded wiring portion may contact each other by a fitting operation. Contact between the circuit board and the wiring of the connection member by this fitting operation may ensure more secure electrical conduction. This mount assembly may be preferably constructed by using, for example, the connector sheet as the connection member.

Another mount assembly is constructed by combining the connection member of the present invention with an electronic component. That is, the present invention provides a component mount assembly including the connection member of the present invention, and an electronic component disposed on at least one of the upper and lower surfaces of the connection member, wherein the electronic component is electrically connected to a U/L-shaped side wiring or an electrical element which is connected to the U/L-shaped side wiring. The "electronic component" refers to an active component such as a semiconductor device and a passive component such as a capacitor, an inductor, a resistor and a surface acoustic wave device. This component mount assembly may be preferably constructed by using, for example, a connection member with a core or a connection member having a plate substrate as an insulating substrate (particularly an interposer).

For example, a module may be constructed by combining the interposer with an electronic component. That is, the present invention provides a module including the interposer of the present invention and an electronic component disposed on the upper surface of the interposer. Herein, the "module" is a kind of mount assembly and the term "module" refers to a constitutional element which functions independently. This module is generally mounted on a printed wiring board.

In one embodiment of the component mount assembly of the present invention, two connection members of the present invention and two semiconductor devices as electronic components may be provided. That is, the component mount assembly of the present invention may have a construction wherein a first electronic component is mounted on an upper surface of a first connection member, and a second connection member is disposed on the upper surface of the first connection member and a second electronic component is mounted on the upper surface of the second connection member. The mount assembly of this construction may be constructed by using the interposers as the first and the second connection members and a semiconductor memory or an LSI as each of the first and the second electronic components.

In the component mount assembly of the present invention, the electronic component may be a semiconductor chip whose terminal pitch is at most 150 μm or a semiconductor chip which has at least sixteen terminals. Since the connection member of the present invention (particularly interposer) may be constructed so as to adapt to a fine pitch, the connection member is suitable for mounting, on its upper surface, a semiconductor chip with a fine pitch or a semiconductor chip wherein many terminals are provided.

The present invention also provides a mount assembly wherein a connection member (which is referred to as a "second connection member"), is disposed on at least one of an upper surface and a lower surface of a connection member with a core (which is referred to as a "first connection member") and the second connection member is electrically connected to a U/L-shaped side wiring or an electrical element which is electrically connected to the U/L-shaped side wiring of the first connection member. The second connection member may be the connection member of the present invention or a connection member of known type. Further, instead of the second connection member, a conventional circuit board (which may or may not have a built-in electronic component) may be disposed. In a variation of this embodiment, an electronic component may be mounted on at least one of the upper and the lower surfaces of the first connection member.

In a case where the connection member of the present invention is a connector sheet as described above, a mount assembly including the connector sheet can be constructed, which includes:

a circuit board wherein wiring patterns are formed on both surfaces; and a connector sheet of the present invention, in which a concave portion is formed by bending a sheet containing a semi-cured resin and a U/L-shaped side wiring having a portion extending on an inner side surface of the concave portion, wherein a side surface of the circuit board fits into the concave portion; and a wiring pattern formed on one surface of the circuit board is electrically connected with a wiring pattern formed on the other surface of the circuit board via the wiring portion extending on the inner side surface of the concave portion. In this mount assembly, the circuit board and the connector sheet are electrically connected by fitting the circuit board into the concave portion formed in the connector sheet. In this mount assembly, it is preferred that a via is not formed also in the circuit board.

Any mount assembly of the present invention which is described above can construct an electronic device together with a casing for housing the mount assembly. In other words, the present invention provides an electronic device which includes a mount assembly having a connection member of the present invention and a casing for housing the mount assembly. The electronic device may be preferably a portable electronic device.

The component mount assembly of the present invention and a printed wiring board (for example, a mother board) where the mount assembly is mounted, may construct an electronic device. One embodiment of the electronic device having the component mount assembly of the present invention is a device including the component mount assembly of the present invention which includes an interposer, a connector into which a side surface of the interposer is fitted and a mother board where the connector is provided. This electronic device has a vertical component mounting construction which is achieved by connecting the side surface of the interposer to the mother board utilizing the U/L-shaped side wiring of the interposer. This construction makes it possible to mount more modules on the mother board with a smaller area.

The present invention also provides a method for producing a connection member of the present invention. A production method of the present invention is characterized in that it includes forming a U/L-shaped side wiring by bending a wiring layer that has at least one wiring formed on one plane. Specific procedures of this production method are detailed below.

The present invention provides a method for producing a connection member (which is referred to as "a first production method" for convenience so as to be distinguished from other methods for producing a connection member as described below). The first production method includes steps of:

(1-A) preparing a sheet which includes a wiring layer having at least one wiring and an insulating layer containing a semi-cured resin (this layer may be referred to as a "sheet "A"" for convenience so as to being distinguished from a sheet used in other production methods);

(1-B) bending (or folding) the sheet "A" so that parts of the insulating layer face each other and portions of the at least one wiring face each other across the insulating layer, and another portion of the at least one wiring extends on a side surface of the insulating layer which is formed by a bent part of the insulating layer; and (1-C) curing the resin contained in the insulating layer of bent sheet "A".

In the step (1-B), the parts of the insulating layer preferably face each other while in contact with each other. The meaning of "the parts of the insulating layer face each other" is that the parts of the insulating layer overlap. The parts of the insulating layer may overlap with a space therebetween or in contact with each other.

The insulating layer constitutes the insulating substrate of the connection member. By reducing a thickness of the insulating layer, the insulating substrate becomes a sheet, and thus a connector sheet is obtained by this method. The insulating layer is preferably formed of a composite material containing a thermosetting resin and an inorganic filler.

The step of preparing the sheet "A", that is, the step (1-A) may be performed according to a method which includes steps of:

(1-a) preparing a laminate which includes a carrier sheet and a metal layer formed thereon;

(1-b) processing the metal layer so as to form a wiring layer (or a wiring pattern) having at least one wiring; and (1-c) forming an insulating layer containing a semi-cured resin on the wiring pattern.

In the step (1-c), the wiring layer may be formed by etching. In that case, the etching may be performed such that, in addition to an unnecessary portion of the metal layer (that is, a portion which does not form the wiring pattern), a portion of the carrier sheet which is beneath the unnecessary portion of the metal layer is removed. As a result, a sheet "A" is obtained, wherein the resin goes over the surface of the wiring layer (that is, a contact plane between the metal layer and the carrier sheet) and enters into a concavity formed in the carrier sheet. The connection member produced using such a sheet "A" gives a connection member wherein a surface (an exposed surface) of the wiring is located inside the insulating substrate relative to the surface of the insulating substrate In the first production method, the carrier sheet may be removed before the step (1-B). In that case, the sheet "A" is a sheet consisting of an insulating layer (resin layer) and a wiring layer. Alternatively, the carrier sheet may be removed after the step (1-B) or the step (1-C).

The production method of the present invention may be realized by another method for producing a connection member (which is referred to as "a second production method" for convenience so as to be distinguished from other methods for producing a connection member as described above or below). The second production method includes steps of:

(2-A) preparing a sheet containing a semi-cured resin;

(2-B) bending the sheet;

(2-C) forming an insulating substrate by curing the sheet after the step (2-B); and (2-D) forming on the insulating substrate at least one wiring which includes i) a side-surface wiring portion which is disposed on at least a part of a side surface and ii) at least one of an upper-surface wiring portion and a lower-surface wiring portion, with the upper-surface wiring portion being connected to the side-surface wiring portion and disposed on at least a part of an upper surface, and with the lower-surface wiring portion being connected to the side-surface wiring portion each other and disposed on at least a part of a lower surface. In this production method, a sheet containing a rein in a semi-cured state (this sheet may be referred to as a "sheet "B" for convenience so as to be distinguished from a sheet used in other production methods) is folded to form an insulating substrate of a desired shape and then a U/L-shaped side wiring is formed.

In the second production method, the sheet "B" is preferably formed of a composite material which contains at least 100 parts by weight of an inorganic filler relative to 100 parts by weight of a thermosetting resin.

Alternatively, the production method of the present invention may be realized by another method for producing a connection member (which is referred to as "a third production method" for convenience so as to be distinguished from other methods for producing a connection member as described above or below). The third production method includes steps of:

(3-A) forming a wiring layer including at least one wiring on at least a part of a surface of a carrier sheet;

(3-B) forming on the surface of the carrier sheet a resin layer containing a hardening resin which is to be an insulating layer, so as to cover the wiring layer with the resin layer;

(3-C) disposing a core member on the resin layer and bending the carrier sheet with the resin layer in contact with the core member so that portions of the at least one wiring face each other across the resin layer, and the core member and another portion of the at least one wiring extends on a side surface of the resin layer which is formed by a bent part of the resin layer; and (3-D) curing the resin contained in the resin layer so as to form the insulating layer; and (3-E) removing the carrier sheet so as to expose the wiring layer.

The connection member produced by this production method is a connection member wherein an insulating substrate includes the core member and the insulating layer formed by curing the resin contained in the resin layer which has covered the carrier sheet.

Alternatively, the production method of the present invention may be realized by another method (which is referred to as "a fourth production method" for convenience so as to be distinguished from other methods for producing a connection member as described above or below). The fourth production method includes steps of:

(4-A) forming a wiring layer including at least one wiring on at least a part of a surface of a carrier sheet;

(4-B) forming a resin layer containing a hardening resin on a surface of a core member so as to cover at least a part of a surface of a core member;

(4-C) bending the carrier sheet around the core member with the resin layer in contact with the wiring layer so that portions of the at least one wiring face each other across the resin layer, and the core member and another portion of the at least one wiring extend on a side surface of the resin layer; and (4-D) curing the resin contained in the resin layer so as to form an insulating layer; and (4-E) removing the carrier sheet so as to expose the wiring layer.

The connection member produced by this production method is a connection member wherein an insulating substrate includes the core member and the insulating layer formed by curing the resin contained in the resin layer which is formed around the core member.

Alternatively, the production method of the present invention may be realized by another method (which is referred to as "a fifth production method" for convenience so as to be distinguished from other methods for producing a connection member as described above or below). The fifth production method includes steps of:

(5-A) forming a wiring layer including at least one wiring on at least a part of a surface of a carrier sheet;

(5-B) bending the carrier sheet with the wiring layer inside so that portions of the at least one wiring face each other and a space is formed between these opposed portions;

(5-C) forming a resin layer by introducing a material containing a hardening resin into the space; and (5-D) curing the resin contained in the resin layer so as to form an insulating layer; and (5-E) removing the carrier sheet so as to expose the wiring layer.

According to this production method, the wiring which is bent so that portions thereof are opposed to each other becomes a U/L-shaped side wiring.

In the fifth production method, the step (5-C) may be performed as a process including steps of:

(5-c') introducing a resin containing a hardening resin into the space; and (5-c") inserting a core member into material introduced into the space.

The connection member produced by the fifth production method including the steps (5-c') and (5-c") is a connection member wherein the insulating substrate has a core.

There is no need to form a via in the connection member of the present invention, since the connection member of the present invention has a U/L-shaped side wiring which extends from an upper surface to a lower surface of an insulating substrate through a side surface thereof, or which extends from the upper surface or the lower surface to the side surface and terminates on the side surface of the insulating substrate. Therefore, the present invention provides a connection member which is more efficiently produced than a conventional connection member. Further, the connection member of the present invention can adapt to a fine pitch since the connection member can be provided wherein a width of the U/L-shaped side wiring and a space between the U/L-shaped side wrings are narrow. Furthermore, a shape of the connection member may be constructed to have a concave portion or a convex portion, whereby a plurality of components can be mounted three-dimensionally on a board of a predetermined dimension. Therefore, mount assemblies, modules and electronic devices of various embodiments can be provided by using the connection member of the present invention. Furthermore, an entire single component can be stably connected to a circuit board or another component using fewer connection members of the present invention by adjusting a location and pitch of the U/L-shaped side wirings. A connection operation using the connection member of the present invention makes it possible to produce a mount assembly or an electronic device with a higher productivity compared to a conventional connection operation which involves mounting solder balls one by one.

By selecting a shape and material of the insulating substrate, the connection member of the present invention may be provided in various embodiments, such as a connector sheet, a connection member with a core, and an interposer. For example, since the connector sheet is a connector in a thin sheet form, it can contribute to miniaturization of an electronic component. The connection member with a core has an improved dimensional stability and a very stable precision in height by virtue of the core. Therefore, when the connection member with a core is used in an electronic device, bad connection is reduced and a yield is improved. The interposer of the present invention can be more efficiently produced compared with a conventional interposer since the interposer of the present invention does not require a via.

BRIEF DESCRIPTION OF THE DRAWINGS

A more complete appreciation of the invention and many of attendant advantages thereof will become readily apparent with reference to the following detailed description, particularly when considered in conjunction with the accompanying drawings, in which:

FIGS. 32(a) to 32(c) are sectional views which schematically show steps in a third method for producing a connection member;

FIG. 33 is a sectional view of a connection member 3200 and a mount assembly 3210 in accordance with embodiments of the present invention;

FIG. 38 is a sectional view which schematically shows steps in a method for producing a connection member;

FIGS. 39(a) to 39(g) are sectional views which schematically show steps in a third method for producing a plurality of connection members;

FIGS. 55 to 57 are enlarged views of a substantial part of a U/L-shaped side wiring 4020 in an interposer of the present invention;

FIGS. 58(a) to 58(e) are sectional views which schematically show steps in a method for producing an interposer 4100;

DETAILED DESCRIPTION OF THE PREFERRED EMBODIMENTS

Figure 1:
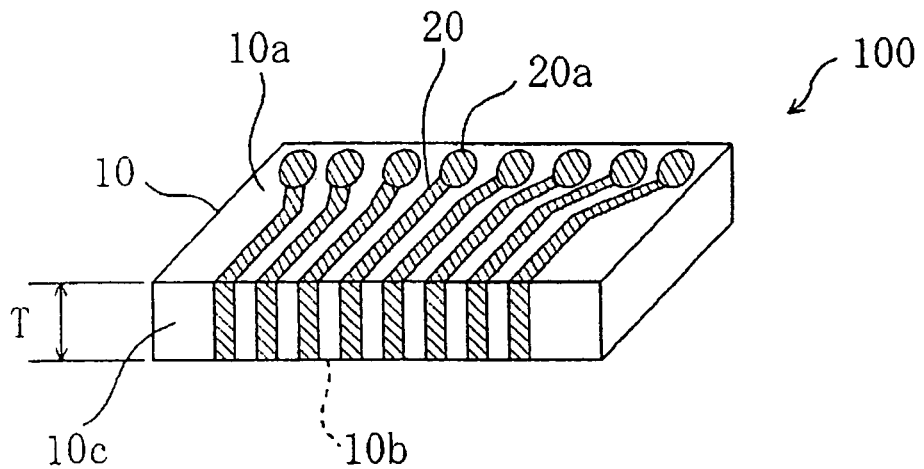
FIG. 1 is a perspective view schematically showing a connector sheet 100 in accordance with an embodiment of the present invention.

Embodiments of the present invention are described with reference to the attached drawings. In the drawings, elements which have substantially the same function are denoted by the same reference numeral in principle for simplicity of description.

Embodiment 1

Figure 2:
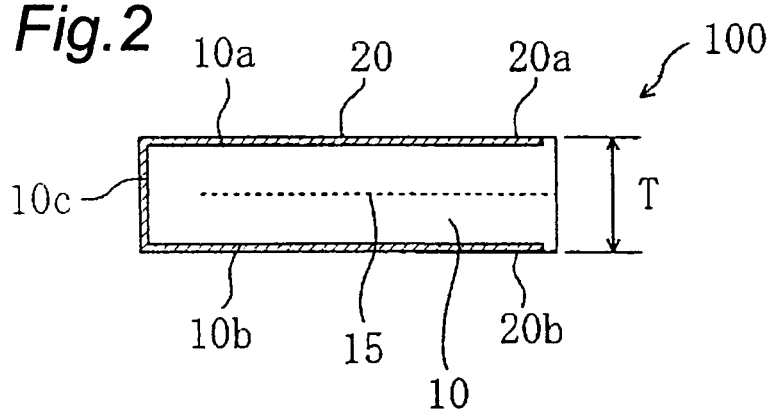
FIG. 2 is a perspective view schematically showing a connector sheet 100 in accordance with an embodiment of the present invention.

A connector sheet which is an embodiment of a connection member of the present invention is described as a first embodiment. FIG. 1 is a perspective view which schematically shows a connector sheet of the present invention and FIG. 2 shows a section where a U/L-shaped side wiring 20, and lands 20a and 20b shown in FIG. 1, are placed. The connector sheet 100 of this embodiment has a sheet substrate 10 and a plurality of U/L-shaped side wirings 20. The sheet substrate 10 has an upper surface 10a, a lower surface 10b which is opposite to the upper surface 10a, and a side surface 10c connecting the upper surface 10a and the lower surface 10b. One end portion 20a (land) of the U/L-shaped side wiring 20 exists on the upper surface 10a of the sheet substrate 10, the U/L-shaped side wiring 20 extends from the end portion 20a and passes the side surface 10c of the sheet substrate 10 and reaches the lower surface 10b, and the other end portion 20b of the wiring 20 exists on the lower surface 10b of the sheet substrate 10.

In this embodiment, both ends of the U/L-shaped side wiring 20 is connected to the lands and the U/L-shaped side wiring 20 and the lands 20a and 20 are formed together. The upper surface 10a (and the lower surface 10b) of the sheet substrate 10 is substantially flat. In the connector sheet 100 shown in FIG. 1, the upper surface 10a and the lower surface 10b have substantially the same shape and they are connected by the side surface 10c vertical thereto. Therefore, shapes of the upper and the lower surfaces of the connector sheet 100 are described as the shape of the upper surface 10a for simplicity.

As shown in FIGS. 1 and 2, electrical conduction between the upper surface 10a and the lower surface 10b in the connector sheet 100 of this embodiment is made only by the U/L-shaped side wiring 20. Therefore, in the sheet substrate 10, a via is not formed for electrically connecting the upper surface 10a and the lower surface 10b.

In the specification, the term "via" is used as a generic term which refers to both of "inner via" and "through hole." Although the terms "via" and "through hole" are generally used without being distinctly distinguished from each other, the term "via" means a through bore which electrically connects wiring patterns and which is generally formed for connecting the wiring patterns on both sides of an insulating layer of a multilayer board. The term "through hole" generally means a through bore for electrically connecting a wiring pattern on the upper surface to a wiring pattern on the lower surface. Herein, the term "via" means a bore which passes through a sheet substrate and serves to provide electrical conduction. The bore may be filled with a conductive material or covered with a thin film of the conductive material.

The U/L-shaped side wiring 20 may be formed of, for example, a copper foil, and its thickness may be, for example, in a range of about 3 μm to about 50 μm. The number of the U/L-shaped side wirings 20 is, for example, eight or more. The connector sheet shown in FIG. 1 has eight U/L-shaped side wirings 20. In the illustrated configuration, ends of lands 20a of the U/L-shaped side wirings 20 are arranged in line. The arrangement of these ends of the U/L-shaped side wirings is not limited to this and may be appropriately selected depending on arrangement of terminals of wiring boards that are connected by the connector sheet 100. For example, the lands 20a and 20b may be arranged in a grid, or arrangement patterns of the lands 20a and 20b may be different from each other.

The sheet substrate 10 is preferably formed of a material containing a resin. Thickness "T" of the sheet substrate 10 may be, for example, in a range of about 20 μm to 100 μm. In one embodiment, the thickness "T" of the sheet substrate 10 may be in a range of about 25 μm to about 50 μm. In one embodiment, the sheet substrate 10 is formed of a composite material containing a resin (for example, a thermosetting resin and/or a thermoplastic resin) and an inorganic filler. The resin is preferably a thermosetting resin. The sheet substrate 10 may be formed of only the thermosetting resin without using the inorganic filler. The thermosetting resin may be, for example, an epoxy resin. When the inorganic filler is added, a filler of $Al_2O_3$, $SiO_2$, MgO, BN or AlN may be used. By adding the inorganic filler, various properties of the sheet substrate 10 can be controlled. For this reason, the sheet substrate 10 is preferably formed of the composite material containing the inorganic filler.

The sheet substrate 10 in this embodiment is formed by folding a sheet containing a semi-cured resin and then completely curing this folded sheet substrate of a semi-cured state. For representing this, an overlapped plane which is created by folding the sheet is shown by a dotted line 15. The resin is softened or melted to become a unified body upon curing completely and therefore the overlapped plane 15 may often disappear.

Figure 3:
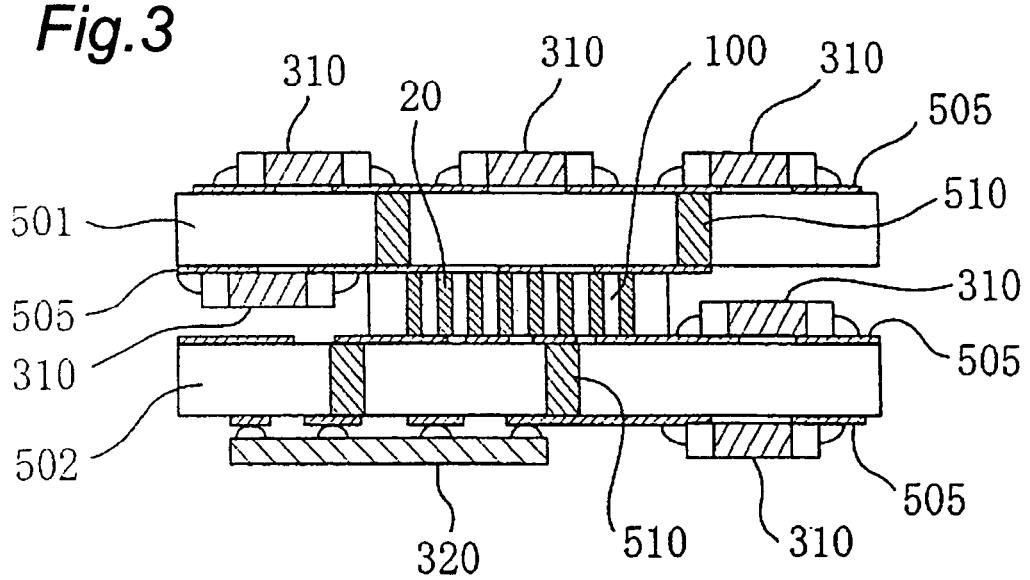
FIG. 3 is a sectional view of a mount assembly including a connector sheet 100.

This connector sheet 100 may be disposed between two circuit boards 501 and 502 (printed circuit boards) to connect them electrically, as shown in FIG. 3. In other words, FIG. 3 shows a mount assembly wherein the two circuit boards are connected by the connector sheet. In each of the circuit boards 501 and 502, wiring patterns 505 (conductor patterns) are formed and surface mount electronic components 310 and semiconductor chips 320 are mounted on the wiring patterns 505. It is noted that, in FIG. 3, the circuit boards 501 and 502 are illustrated in section so as to show through holes 510, while the connector sheet 100 is illustrated not in section but in a side external appearance.

The lands 20a and 20b which are terminals of the connector sheet 100 may be connected to terminals of the circuit boards 501 and 502 respectively with an electrical conductive material such as solder or a conductive adhesive. A resist may be formed on a surface of the sheet substrate of the connector sheet. The resist prevents the solder from short-circuiting. Alternatively, the connector sheet 100 can be closely adhered (attached) to the circuit board 501 or 502. In that case, preferably at least one of the upper surface 10a and the lower surface 10b of the sheet substrate 10 has adhesiveness, and more preferably both of the upper surface 10a and the lower surface 10b have adhesiveness. The adhesiveness can be given by applying an adhesive on a surface of the connector sheet 100 or forming an adhesive layer on the surface. Alternatively, as described below, the adhesiveness can be given by forming the upper surface and/or the lower surface of the sheet substrate from a material which has tackiness under a first condition and adhesiveness under a second condition. For convenience of handling, a releasing film (for example, a resin sheet such as a PE film, a PET film, a PES film or a PEN film) may be preferably attached to this adhesive upper surface 10a and/or adhesive lower surface 10b.

Each of the circuit boards 501 and 502 shown in FIG. 3 is a double-sided printed wiring board which has two wiring pattern layers 505. A circuit board connected to the connector sheet 100 is not limited to this. For example, multilayer printed wiring boards with four or more wiring pattern layers may be connected electrically by the connector sheet 100. Further, not only rigid wiring boards, but also flexible circuit boards may be electrically connected by the connector sheet 100. Alternatively, a flexible circuit board and a rigid circuit board may be electrically connected by the connector sheet 100.

In the mount assembly shown in FIG. 3, the connector sheet and the circuit boards 501 and 502 may be connected by a conventional mounting technique. Further, a connection method for connecting the circuit board 501 to the connector sheet 100 may be different from a connection method for connecting the circuit board 502 to the connector sheet 100. For example, the former may be a method wherein an anisotropic conductive film is employed, and the latter may be a reflow soldering method.

In the mount assembly shown in FIG. 3, there is a space (a gap) around the connector sheet 100 which is sandwiched between the circuit boards 501 and 502. This space may be filled with a filling material (for example, a resin) by, for example, injecting the filling material between the circuit boards 501 and 502. Alternatively, a sheet of the filling material may be disposed around the connector sheet 100 and sandwiched between the circuit boards 501 and 502 so that the filling material fills around the connector sheet 100 simultaneously with connection of two circuit boards with the connector sheet 100.

Figure 4:
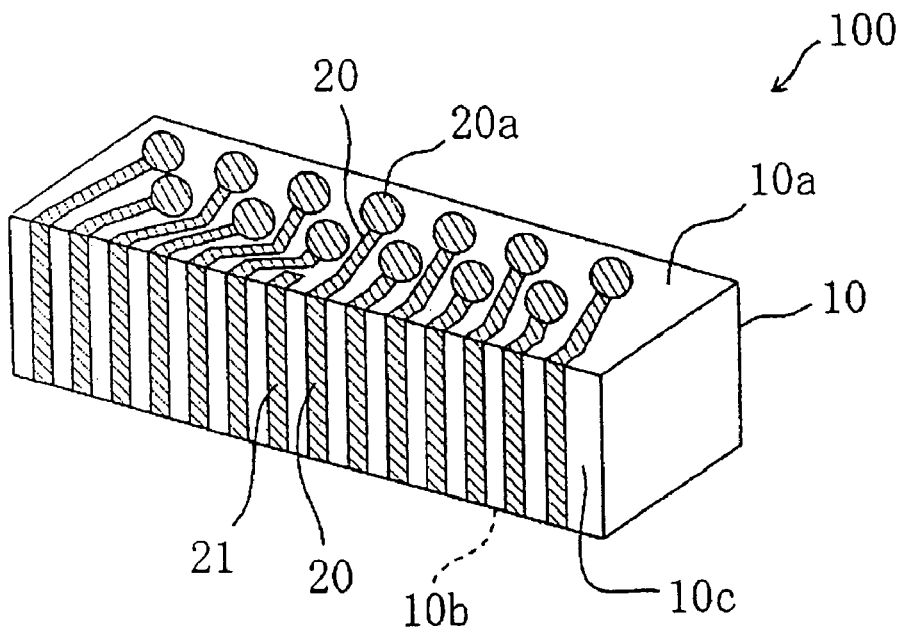
FIG. 4 is a perspective view schematically showing a connector sheet 100 in accordance with an embodiment of the present invention.

FIG. 4 shows a variation of the connector sheet shown in FIG. 1. As shown in FIG. 4, lands 20a connected to ends of U/L-shaped side wirings 20 may be arranged in two lines in connector sheet 100. In the connector sheet shown in FIG. 4, the U/L-shaped side wirings 20 extend on only one side surface 10c. In the connector sheet shown in FIG. 4, dummy wirings 21 are provided which are not connected to either terminals 20a or 20b. The dummy wiring 21 serves to even a wiring density.

In the connector sheet shown in FIG. 4, upper surface 10a has a more elongate shape compared to that in the connector sheet shown in FIG. 1. The number of the U/L-shaped side wirings 20 would not decrease significantly, even if the upper surface has such an elongate shape. This detail is described below.

In a case of a connector sheet wherein vias (or through holes) are formed for ensuring electrical conduction between an upper surface and a lower surface, a shape of the upper surface of the connector sheet is advantageously a square and disadvantageously elongate, if it is desired that more vias are formed. On the other hand, since the side surface 10c is utilized for forming the U/L-shaped side wiring 20 that ensures electrical conduction in the connector sheet 100 of this embodiment, the elongate upper surface does not cause an adverse effect to formation of many U/L-shaped side wirings 20. In the connector sheet 100 of this embodiment, the U/L-shaped side wirings 20 can be appropriately arranged by determining a line-space (L/S) of the U/L-shaped side wirings 20. Therefore, many U/L-shaped side wirings 20 can be effectively provided not only in a substrate whose upper surface is a square but also in a substrate whose upper surface is a rectangle (for example, a rectangle whose long side is equal to or greater than 1.4 times a length of its narrow side). In other words, even if the upper surface 10a of the connector sheet 100 is either a square or an elongate shape (for example, a rectangle, an ellipse or an oblong shape), the connector sheet 100 can easily adapt to a trend of higher pin counts and finer pitch of a circuit board.

In the U/L-shaped side wiring, T/W is preferably at least 1, wherein "W" is a width of a side-surface wiring portion and "T" is a thickness of the sheet substrate (that is, a length of the side-surface wiring portion). T/W corresponds to an aspect ratio of a via. This range of T/W is larger than an aspect ratio of a via which can be generally achieved. Also for this reason, the U/L-shaped side wirings 20 can be formed in a larger number compared to vias. In the embodiments shown in FIGS. 1 and 4, the width of the wiring 20 may be, for example, at most 0.25 mm and a space between side-surface wiring portions of the wirings 20 may be at most 0.3 mm.

In a case of a connector sheet wherein upper and the lower surfaces are electrically connected with vias, it is difficult to change (particularly thicken) a thickness of the connector sheet. In other words, when the thickness is too large in the connector sheet with vias, the vias (through holes) having a high aspect ratio have to be formed, which makes it difficult to form the vias appropriately. For example, when a laser beam is used for perforation, a tapered via tends to be formed. On the other hand, when a drill is used for perforation, the via tends to curve or the drill may bend or break. In the connector sheet of the present invention, such problems can be avoided since formation of vias is unnecessary. Therefore, the present invention can provide a thick connector sheet.

Since the connector sheet 100 consists of the sheet substrate 10 and the U/L-shaped side wiring 20, there is no need to reserve a connector-locating space (which prevents miniaturization of a device) when using the connector sheet, differently from using the stacking connector as disclosed in Patent Kokai (Laid-Open) Publication No. 8(1996)-228059 (A). Further, the connector sheet 100 is thin, and therefore it can contribute to thinning of a device. A shape and area of the connector sheet depend on a mounting space of a circuit board, and are not limited to those shown in FIGS. 1 and 4. For example, when the upper surface 10*a* of the sheet substrate is a rectangle, the area may be, for example, in a range of 5 to 1000 mm$^2$.

Further, the connector sheet 100 can be adhered to a circuit board so that it is physically and electrically connected to the circuit board, particularly in a case where the connector sheet 100 contains an uncured hardening resin. Therefore, the connector sheet 100 may be easily adhered to a circuit board even if the circuit board is soft, such as, a flexible circuit board. This is an important characteristic of the connector sheet of the present invention compared to the stacking connector which is relatively difficult to be attached to a soft circuit board (flexible circuit board).

In addition, the connector sheet can easily adapt to a fine pitch (and/or high pin counts). In that point, the connector sheet is more advantageous than the stacking connector. Specifically, when the stacking connector is used, it is actually very difficult to adapt to a fine pitch of at most 0.3 mm, while the connector sheet 100 can sufficiently adapt to a fine pitch of at most 300 μm (preferably in a range of 100 μm to 300 μm).

Further, the connector sheet 100 is stable when subjected to a temperature cycle of a high temperature and a high humidity since it connects circuit boards with the U/L-shaped side wiring 20, and represents a higher reliability compared to anisotropic conductive film (ACF). Further, difficulty in achieving both of conductivity and insulation, which is seen in ACF, can be avoided in the connector sheet 100.

Furthermore, the electrical conduction conferred by the connector sheet 100 tends to be maintained even if the sheet substrate 10 deforms due to thermal expansion, since continuous single U/L-shaped side wiring 20 ensures electrical conduction. To the contrary, a via connection requires contact between a land portion formed on upper and lower surfaces and a via portion (a conductive paste portion or a plated portion). For this reason, connection may not be maintained, if the via portion is out of contact with the land portion due to expansion of the substrate. Therefore, the connector sheet of the present invention has a higher connection reliability compared to a connection member which employs a via connection.

As described above, the present invention can provide a new connection member (the connector sheet) which resolves the problem of the conventional connection members and adapts to a fine pitch.

Figure 5:
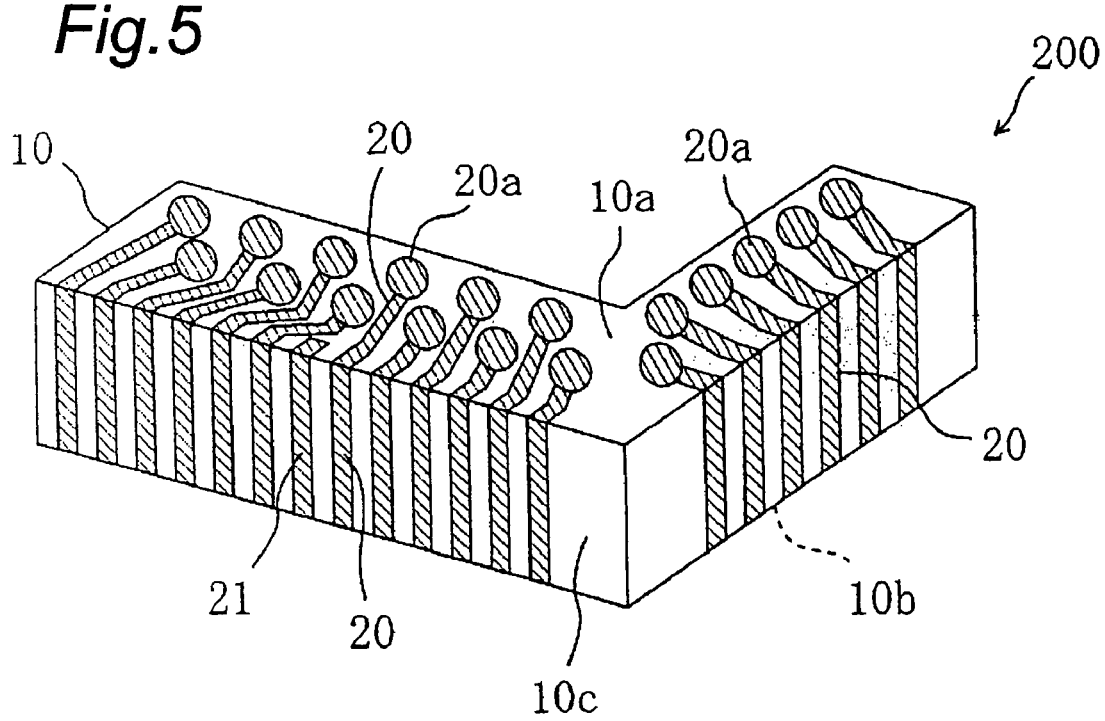
FIG. 5 is a perspective view schematically showing a connector sheet 200 in accordance with an embodiment of the present invention.

Variants of the connector sheet of this embodiment are described with reference to FIGS. 5 to 9. FIG. 5 schematically shows a construction of a connector sheet 200 wherein upper surface 10*a* of sheet substrate 10 is an L-shape. In the connector sheet 200 shown in FIG. 5, upper surface 10*a* and a lower surface 10*b* have the same shape, and they are connected by a vertical side surface 10*c*. Therefore, a shape of the connector sheet 200 is described by referring only to the shape of the upper surface 10*a* for simplicity.

Also in the connector sheet 200 shown in FIG. 5, electrical conduction between the upper surface 10*a* and the lower surface 10*b* is ensured by a U/L-shaped side wiring. Therefore, even if the upper surface 10*a* is an L-shape, a function of the connection member of the present invention can be sufficiently ensured. To the contrary, when electrical conduction is ensured by a via and surfaces (upper surface and lower surface) where vias are formed are not a rectangle or a square, registration may be difficult. Alternatively, if a connection member wherein vias have been formed is machined into another shape, the vias may deform. An anisotropic conductive film is generally difficult to be machined into any form and such machining may reduce connection reliability, since the film is subjected to a thermocompression bonding process after mounting.

The connector sheet 200 shown in FIG. 5 may be formed by folding a sheet containing a semi-cured resin and then completely curing this folded resin sheet of a semi-cured state. Folding may give a connector sheet of such a shape, which is an advantageous characteristic of the present invention.

Connector sheet 200 which has a shape other than a rectangle, such as an L-shape may be attached to a circuit board (for example, a mother board), thereby avoiding collision with a relatively tall electronic component which has been mounted to the circuit board.

Figure 6:
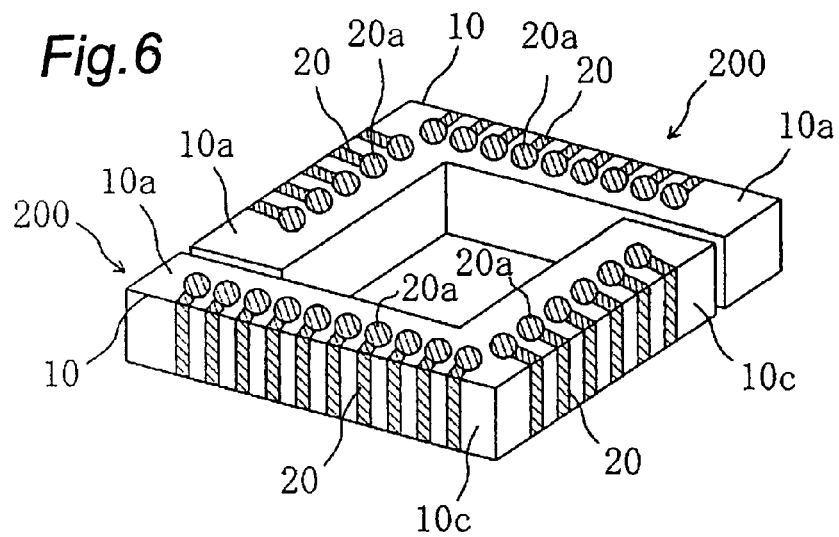
FIG. 6 is a perspective view schematically showing a combination of connector sheets 200 shown in FIG. 5.

The connector sheets 200 shown in FIG. 5 may be combined to give a construction shown in FIG. 6. FIG. 6 shows a combination of two L-shaped connector sheets 200. This embodiment can reduce unevenness of thickness of the connector sheet 200. Further, an area enclosed by the connector sheets 200 can be utilized. For example, an electronic component may be mounted in this area.

Figure 7:
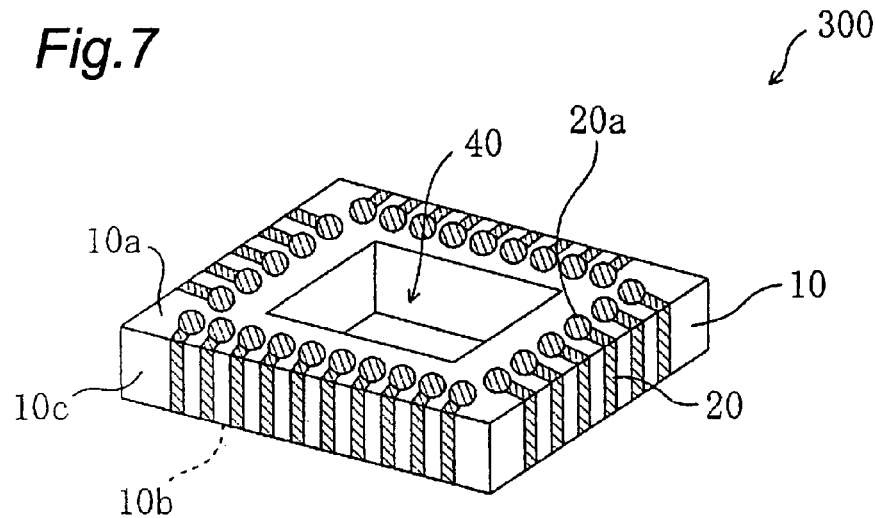
FIG. 7 is a perspective view schematically showing a connector sheet 300 in accordance with an embodiment of the present invention.

FIG. 7 shows a connector sheet 300 whose upper surface 10*a* is a rectangular frame. The connector sheet 300 shown in FIG. 7 has a shape which has an opening 40 in a center of sheet substrate 10. Also, this connector sheet 300 contributes to an increase in mounting area similarly to the configuration shown in FIG. 6, since a component can be mounted on an area of a circuit board, which area is exposed at the opening 40. This sheet substrate 10 of this shape may be obtained by, for example, punching a solid rectangular sheet substrate.

With reference to FIGS. 5, 6 and 7, a connector sheet whose upper surface 10*a* of the sheet substrate 10 is an L-shape or a rectangular frame shape is described. The upper surface of the sheet substrate of the connector sheet may be a U-shape or a C-shape, or a shape having a convex portion or a concave portion.

Figure 8:
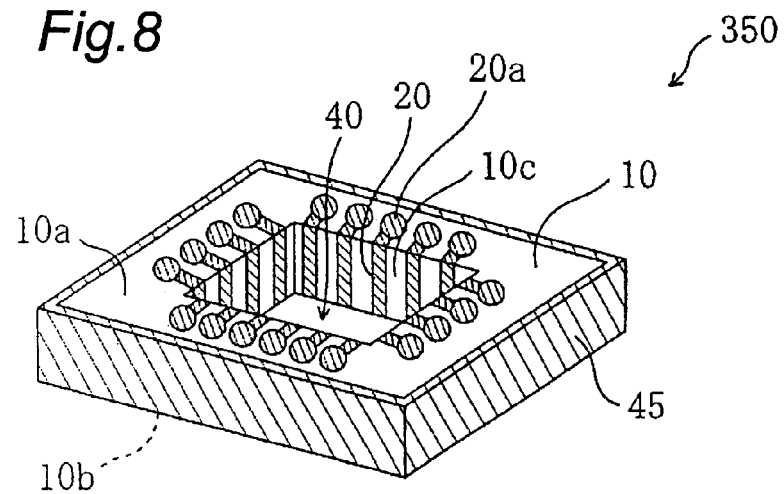
FIG. 8 is a perspective view schematically showing a connector sheet 350 in accordance with an embodiment of the present invention.

FIG. 8 shows a variant of the connector sheet 300 shown in FIG. 7. In a connector sheet 350 shown in FIG. 8, a side-surface portion of a U/L-shaped side wiring 20 is situated on a side surface 10*c* which is an inner wall of an opening 40 of a sheet substrate 10 having a rectangular frame shape. It should be noted that this side surface 10*c* is a side surface which connects an upper surface 10*a* and a lower surface 10*b*. Further, a shield layer 45 (for example, a metal shield layer) is formed on outer circumferential surface of the sheet substrate 10. A shield function of this shield layer 45 can reduce noise. The connector sheet shown in FIG. 8 can be formed by making a slit in a center and folding slit portions.

Figure 9:
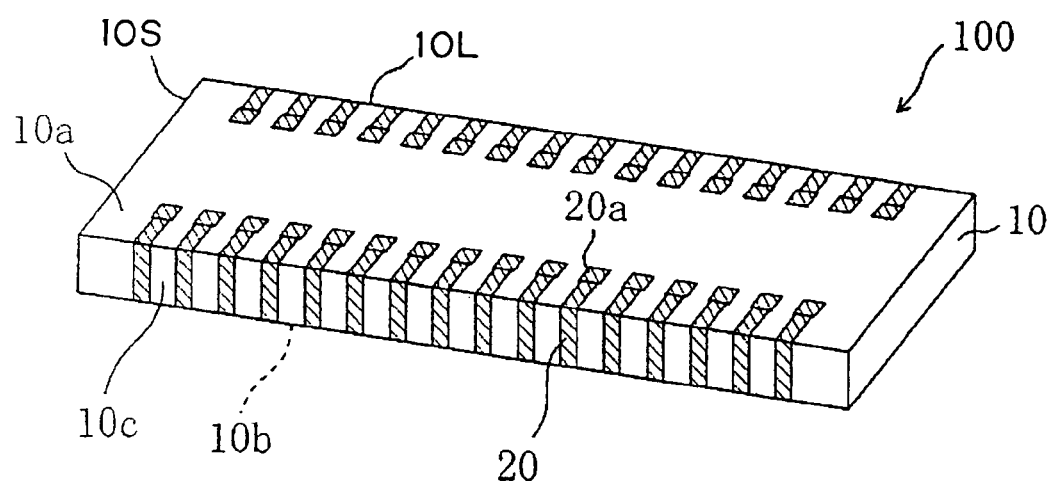
FIG. 9 is a perspective view schematically showing a connector sheet 100 in accordance with an embodiment of the present invention.

A connector sheet 100 shown in FIG. 9 is a variant of the connector sheet shown in FIG. 1, wherein an upper surface 10a is an approximate rectangle having long sides 10L and narrow sides 10S, and U/L-shaped side wirings 20 are situated on two side surfaces adjacent the long sides. In the upper surface 10a, a length of the long side 10L is equal to or greater than 1.4 times a length of the narrow side 10S. In the connector sheet 100, a land 20a which is a terminal is a square land. Such a square land may substitute for a round land which is provided in any of other connector sheets shown in other drawings. This illustrated connector sheet may have U/L-shaped side wirings which are placed on side surfaces adjacent the narrow side 10S, whereby more lands 20a can be arranged.

Next, a method for producing the connector sheet 100 is described with reference to FIGS. 10 and 11(a)-13(b).

Figure 10:
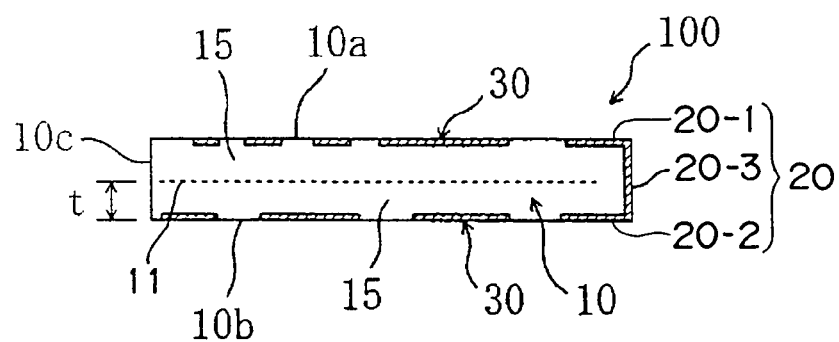
FIG. 10 is a perspective view schematically showing a connector sheet 100 in accordance with an embodiment of the present invention.

FIG. 10 schematically shows a sectional construction of the connector sheet 100 produced by a production method shown in FIGS. 11(a) to 13(b). This connector sheet has wiring patterns 30 as electrical elements on an upper surface 10a and a lower surface 10b of a sheet substrate 10, and U/L-shaped side wiring 20 is formed as a part of the wiring patterns 30. The U/L-shaped side wiring 20 has an upper-surface wiring portion 20-1, a lower-surface wiring portion 20-2 and a side-surface wiring portion 20-3. In FIG. 10, an overlapped plane of a sheet 15 is indicated by a dotted line 11 for easily understanding that the sheet substrate 10 is formed by folding the sheet 15. In FIG. 10, "t" corresponds to a thickness of the sheet 15.

The production method shown in FIGS. 11(a) to 13(b) corresponds to a first production method. Specifically, FIGS. 11(a) to 11(d) show step (1A) of forming a sheet "A" including a wiring pattern and an insulating layer containing a semi-cured resin. FIG. 12(a) shows step (1-B) of folding the sheet "A", and FIG. 12(b) shows step (1-C) of curing resin in the semi-cured state.

The sheet "A" may be produced by a method including steps of:

(1-a) preparing a laminate which includes a carrier sheet and a metal layer formed thereon;

(1-b) processing the metal layer so as to form a wiring layer having at least one wiring; and (1-c) forming an insulating layer containing a semi-cured resin on the wiring layer. The method shown in FIGS. 11(a)-11(d) further includes a step of removing the carrier sheet.

Firstly, the step (1-a) of preparing the laminate is performed, as shown in FIG. 11(a), by preparing a carrier sheet 50 which has a metal layer 32 formed on one surface thereof. The metal layer 32 may be formed of, for example, a copper foil, and the carrier sheet 50 may be formed of, for example, a metal foil (for example, a copper foil or an aluminum foil) or a resin sheet. Thicknesses of the metal layer 32 and the carrier sheet 50 may be, for example, in a range of about 3 μm to about 50 μm and in a range of about 25 μm to about 200 μm, respectively. Various laminates suitable for this laminate are known for producing a circuit board.

The metal layer 32 (that is, U/L-shaped side wiring 20) may be preferably formed from an electrolytic copper foil (an ED foil). The electrolytic copper foil has a uniform thickness, which is advantageous to formation of the wiring layer. Further, the U/L-shaped side wiring 20 can be formed uniformly from the electrolytic copper foil, which is advantageous to an impedance control.

Next, the step (1-b) of processing the metal layer 32 of the laminate may be performed by any appropriate known method. As shown in FIG. 11(b), a patterning step is known as a step for forming predetermined wiring layer 30 (or a wiring layer having a wiring pattern). This step may be performed by, for example, an etching process wherein a mask is used.

Next, the insulating layer is formed in the step (1-c). As shown in FIG. 11(c), insulating layer 15 is formed by applying resin to the carrier sheet 50 so that the layer 15 covers the wiring layer 30. The resin may be an electrically insulating thermosetting resin and/or an electrically insulating thermoplastic resin. A semi-cured hardening resin is particularly preferably used and a semi-cured thermosetting resin is more particularly preferably used. The resin may contain a filler as described above. Thickness "t" of the insulating layer 15 may be, for example, in a range of about 50 μm to 100 μm.

For example, a composite material containing a thermosetting resin in a B-stage state and an inorganic filler may be applied to the carrier sheet 50. In one embodiment, the composite material may contain at least 100 parts by weight (preferably 140 to 180 parts by weight) of the inorganic filler to 100 parts by weight of the thermosetting resin. The "B-stage state" means a state wherein a hardening reaction stops at a middle stage. Resin in the B-stage state is once softened (or melted) and then completely hardened by further being heated. This completely hardened state is referred to as a "C-stage."

Addition of $Al_2O_3$, BN or AlN as the inorganic filler may improve a thermal conductivity of the connector sheet. Further, it is possible to adjust a thermal expansion coefficient by selecting an appropriate inorganic filler. A resin component has a relatively large thermal expansion coefficient. Addition of $SiO_2$ or AlN can reduce a thermal expansion coefficient of the insulating layer (the sheet substrate of the connector sheet). Alternatively, addition of MgO may improve thermal conductivity and increase a thermal expansion coefficient of the insulating layer. The addition of $SiO_2$ (particularly an amorphous $SiO_2$) can reduce a dielectric constant of the insulating layer as well as the thermal expansion coefficient.

Next, as shown in FIG. 11(d), the carrier sheet 50 is removed and the sheet 15 having the wiring layer 30 is obtained before a folding step. In the illustrated production method, a next folding step is performed after removing the carrier sheet. Alternatively, the folding step may be performed without removing the carrier sheet, and then the carrier sheet may be removed.

In the step (1-B), a construction as shown in FIG. 12(a) is obtained by folding the sheet 15. In the illustrated embodiment, the sheet 15 is folded in half. That is, the insulating layer 15 is folded such that parts thereof are opposed to and contact each other on a plane indicated by dotted line 11, and portions 20-1 and 20-2 of at least one wiring 20 constituting the wiring pattern become an upper-surface wiring portion and a lower-surface wiring portion, which face each other across the insulating layer 15, and another portion 20-3 of the at least one wiring 20 becomes a side-surface wiring portion which extends on a side surface of folded insulating layer 15. Therefore, the wiring 20 consisting of the upper-surface wiring portion 20-1, the lower-surface wiring portion 20-2 and the side-surface wiring portion 20-3 constitutes at least one wiring which extends from an upper surface to a lower surface of the insulating layer 15 through a side surface of the insulating layer 15, that is, a U/L-shaped side wiring. The sheet may be folded so that the side surface where the U/L-shaped side wiring 20 is positioned is a curve face, and such folding is easier than folding at a right angle as shown in FIG. 12(a).

Next, the structure shown in FIG. 12(a) is heated and pressurized in the step (1-C) so that it is completely cured, whereby overlapped portions of the insulating layer become one sheet substrate 10 as shown in FIG. 12(b) and the connector sheet 100 of the present invention is obtained. In a state as shown in FIG. 12(b), the sheet substrate 10 is completely hardened into the C-stage state. When the resin is thermoplastic, it becomes a hardened state by merely cooling after heating and pressurizing. In FIGS. 10 and 12(b), contact plane 11 of the insulating layer is indicated, although the plane may not exist distinctly after curing.

If necessary, the step (1-C) may be performed after the structure produced by conducting the steps up to the step (1-B) is connected to a circuit board or an electronic component. That is, the connection member may be completed at the same time as connection of the connection member to the circuit board or the electronic component. Such a production method is preferably performed when adhesiveness of an uncured resin is utilized for connection or when tackiness of the uncured resin is utilized for temporarily connecting the connection member to the circuit board for examination as described below with reference FIG. 21. A technique wherein a curing step of the insulating layer is performed at the same time as, or later than, a connection step of the connection member to the circuit board, may be applied not only to production of the connector sheet of the first production method, but also to another production method.

Figure 13A:
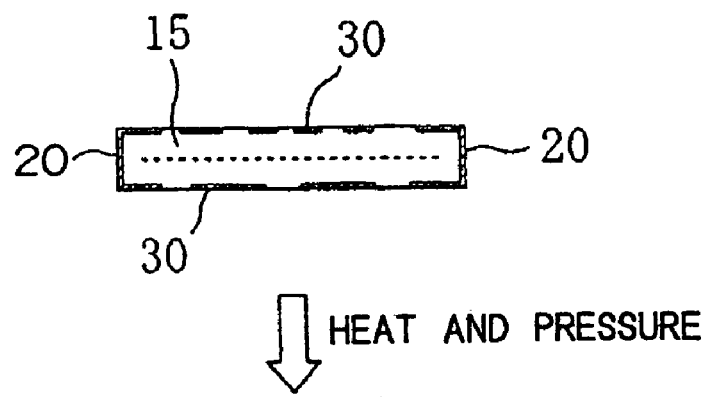
FIGS. 13(a) and 13(b) are sectional views which schematically show a folding step and a heating and pressurizing step.
Figure 13B:
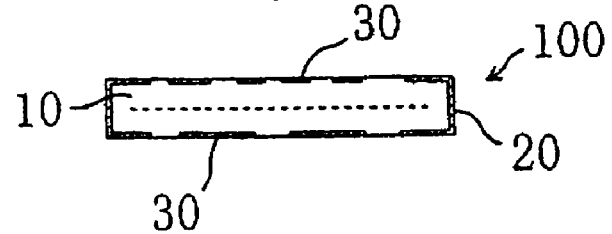

The connector sheet 100 may take different constructions depending on a manner of folding the sheet 15. For example, the sheet 15 may be folded at two positions as shown in FIG. 13(a) and then heated and pressurized. As a result, a connector sheet is obtained wherein U/L-shaped side wirings exist on two side surfaces as shown in FIG. 13(b). Also in FIG. 13(b), a contact plane of an insulating layer is indicated by the dotted line, however an overlapped plane may not exist distinctly after curing.

As described above, vias do not need to be formed in the connector sheet of the present invention, which eliminates a limitation to material of the sheet substrate, which limitation is involved in via processing employing a punch or laser. Therefore, it is possible to mix a filler which hardly absorbs a laser beam (such as a glass or a silica) into a material for the sheet substrate (that is a material for the insulating layer). As a result, such a filler can be used to adjust a property (such as a thermal conductivity and a thermal expansion coefficient) of material for the sheet substrate. Further, a via connection with a conductive paste generally requires optimization of a viscosity of material for the insulating layer so as to stabilize a via shape, which limits material of the insulating layer. On the contrary, such limitation is not imposed upon production of the connector sheet of the present invention and an appropriate resin can be relatively freely selected.

Further, the method for producing a connector sheet of the present invention can simplify production procedures and reduce production cost since a via forming process which requires a high precision can be omitted. In addition, since apparatuses such as a puncher and laser equipment are not required, the production cost is reduced in this point. Further, since the connector sheet is formed by folding a sheet which has a wiring layer and an insulating layer formed thereon, it is not necessary to perform registration of positions of lands on upper and lower surfaces of the connection member, which registration is required in a via connection. Further, in the production method of the present invention, it is not necessary to perform a step of registering a via and a land, which step is conducted in a method for producing a connection member with a via.

Figure 11:
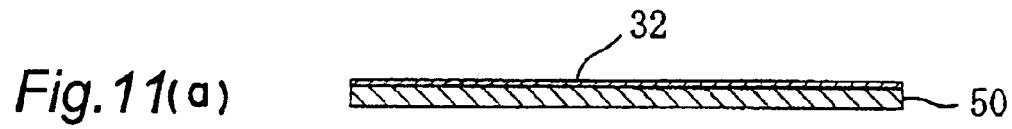
FIGS. 11(a) to 11(d) are sectional views which schematically show steps in a method for producing a member for forming a sheet 15 containing a semi-cured resin.
Figure 11:
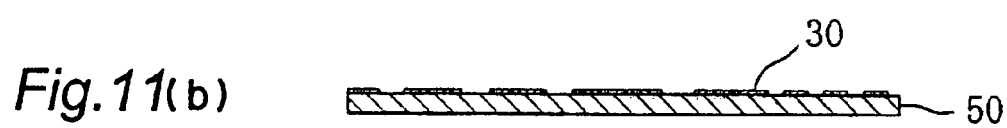
Figure 11:
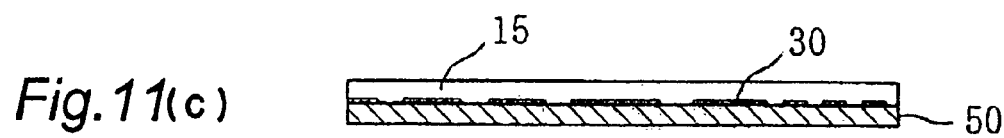
Figure 11:
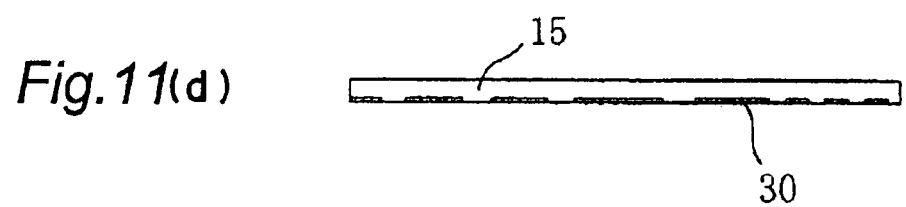
Figure 12:
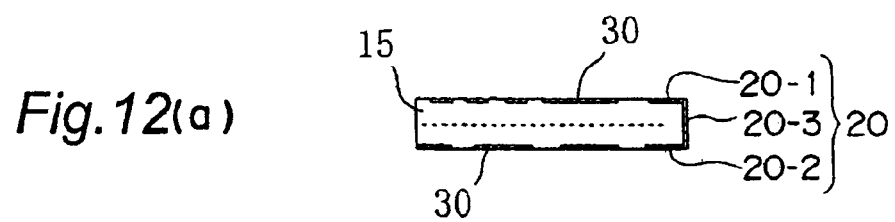
FIGS. 12(a) and 12(b) are sectional views which schematically show a folding step and a heating and pressurizing step.
Figure 12:
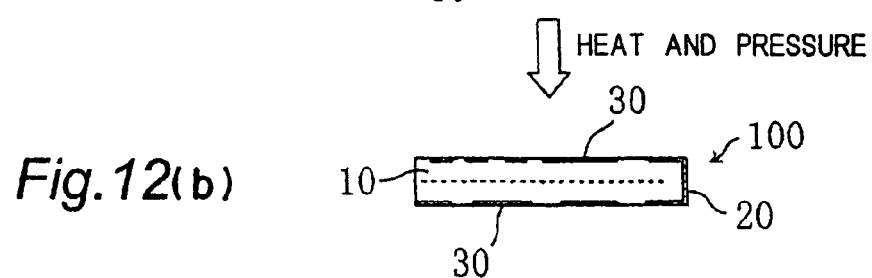
Figure 19:
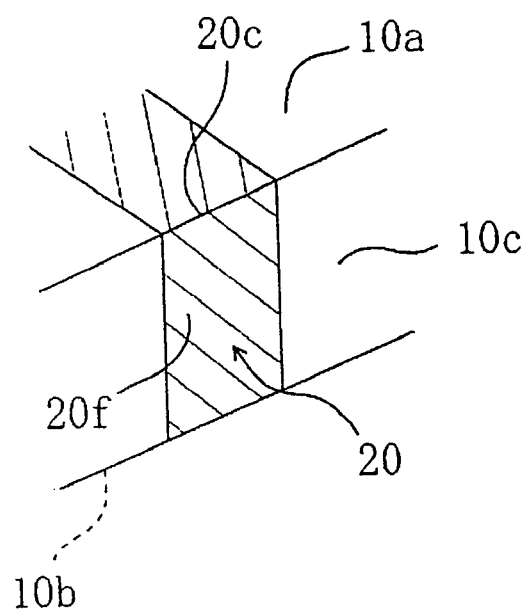

The U/L-shaped side wiring 20 on a surface of the sheet substrate 10 is entirely embedded in the surface of the sheet substrate 10 by forming, through the steps shown in FIGS. 11 to 12, the wiring pattern 30 including the wiring 20 which is to be the U/L-shaped side wiring. That is schematically shown in FIG. 19 which is an enlarged perspective view of a part of the sheet substrate. That is, as illustrated in FIG. 19, top surface 20f (an exposed surface) of the wiring 20 is substantially flush with a surface (for example, a side surface 10c) of the sheet substrate 10. This configuration of the U/L-shaped side wirings 20 suppresses breakage or damage of the wiring 20 and thereby increases reliability of the wiring 20 more effectively as compared with a configuration wherein the wiring 20 (particularly a corner portion 20c) is protruded from the surface of the sheet substrate.

Figure 18:
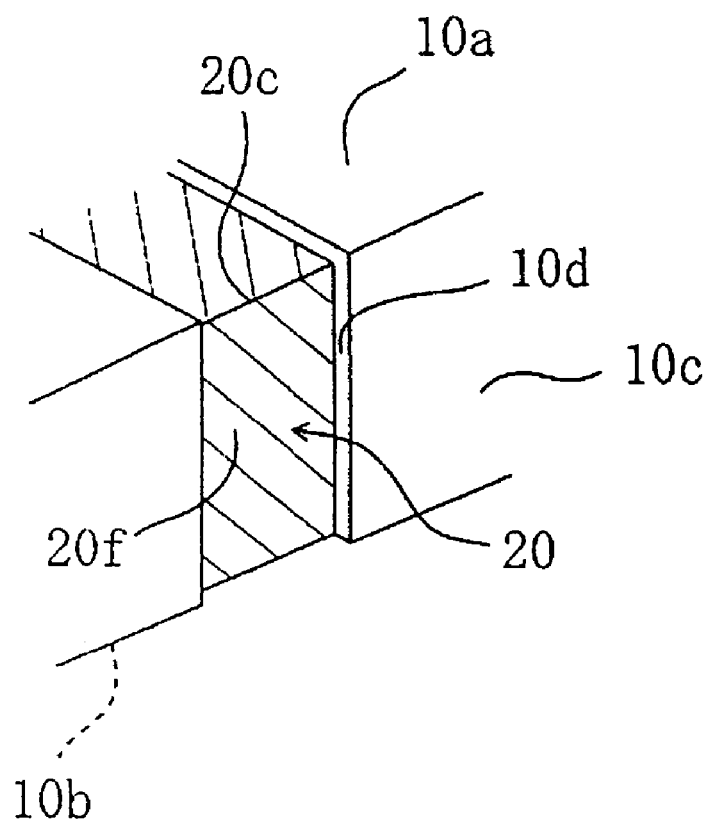
FIGS. 18 to 20 are enlarged views of a substantial part of a U/L-shaped side wiring 20 in the connector sheet of the present invention.

Further, as shown in FIG. 18, when exposed surface 20f of the U/L-shaped side wiring 20 is located at a position which is concave from the side surface 10c of the sheet substrate 10 and thereby located inside the sheet substrate 10, a possibility of contact between the exposed surface 20f and an external thing is significantly reduced, whereby breakage and damage of the U/L-shaped side wiring 20 can be effectively reduced. Particularly, the corner portion 20c of the U/L-shaped side wiring 20 preferably dents in relative to the surface of the sheet substrate (or an edge) as shown in FIG. 18 from a viewpoint of protection of the wiring, since the corner portion 20c tends to contact the external thing. Therefore, exposed surfaces of the upper-surface wiring portion and/or a lower-surface wiring portion of the U/L-shaped side wiring 20 are preferably disposed at positions concave from the surfaces of the sheet substrate, as shown in FIG. 18.

The configuration as shown in FIG. 18, wherein the top (or the exposed) surface 20f of the wiring 20 sinks in relative to the side surface 10c of the sheet substrate 10 and a step 10d is formed, may be realized by the following method. Firstly, in a step of forming the wiring layer 30 shown in FIG. 11(b), a concavity is formed in the carrier sheet 50 by etching away, in addition to an unnecessary portion (that is, a portion which does not form the wiring pattern) of the metal layer 32, a portion of the carrier sheet 50 (for example, a metal sheet) which is beneath the unnecessary portion of the metal layer 32. Next, a step of applying resin material (for example, a composite material) for forming the insulating layer is performed as shown in FIG. 11(d) to provide a sheet wherein the resin material goes over the surface of the wiring layer 30 (that is, a contact plane between the metal layer and the carrier sheet) and enters into the concavity in the carrier sheet 50. This sheet is folded and then heated and pressurized. The carrier sheet is subsequently removed, resulting in the step 10d between the surface of the sheet substrate 10 and exposed surface of the U/L-shaped side wiring 20. This method makes it possible to form step 10d whose height corresponds to a depth of the concavity formed in the carrier sheet.

In a case where the second production method is employed, it is possible to apply a resin or a film, for protecting the U/L-shaped side wiring 20, to the sheet substrate 10 except for a portion where the wiring is disposed, in order to make a step between the top surface 20f of the U/L-shaped side wiring 20 and the surface of the sheet substrate 10 or to make the top surface 20f flush with the surface of the sheet substrate 10.

In a case where the exposed surface 20f of the U/L-shaped side wiring 20 dents from the surface of the connector sheet, a part of a wiring pattern on a circuit board, which part is connected to the connector sheet, may be preferably protruded from a surface of the circuit board. This protruded portion of the wiring pattern on the circuit board and the exposed surface 20f (top surface) of the wiring 20 which is located at a sunken position can be contacted with each other by fitting in, and thereby connection reliability is improved. The wiring pattern on the circuit board may be protruded from the surface of the circuit board by a subtractive method (for example, a method wherein a copper foil is etched away) or an additive method (for example, a method wherein a conductive metal is deposited on an insulating substrate by electroless plating).

Figure 20:
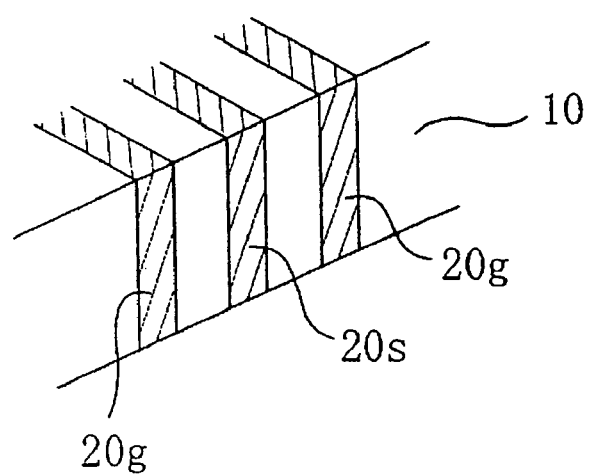

In the connector sheet 100 of the present invention, the U/L-shaped side wirings 20 may be a coplanar line. This makes it possible to constitute a connector sheet which is suitable for a high-speed signal wiring. More specifically, as shown in FIG. 20, when U/L-shaped side wiring 20s is formed as a signal line and U/L-shaped side wirings 20g are formed as ground lines on both sides of signal line 20s, they form a coplanar construction. This construction controls a characteristic impedance and avoids a problem of impedance mismatch between a via and wiring, which problem occurs in a connection member with a via.

In the above, the connector sheet wherein the insulating substrate is the sheet substrate is described as one embodiment of the present invention. It should be noted that the above description is applicable to other connection members of other embodiments.

Embodiment 2

Next, an embodiment of a mount assembly which is constructed by the connector sheet of the present invention and a circuit board is described below.

Figure 14:
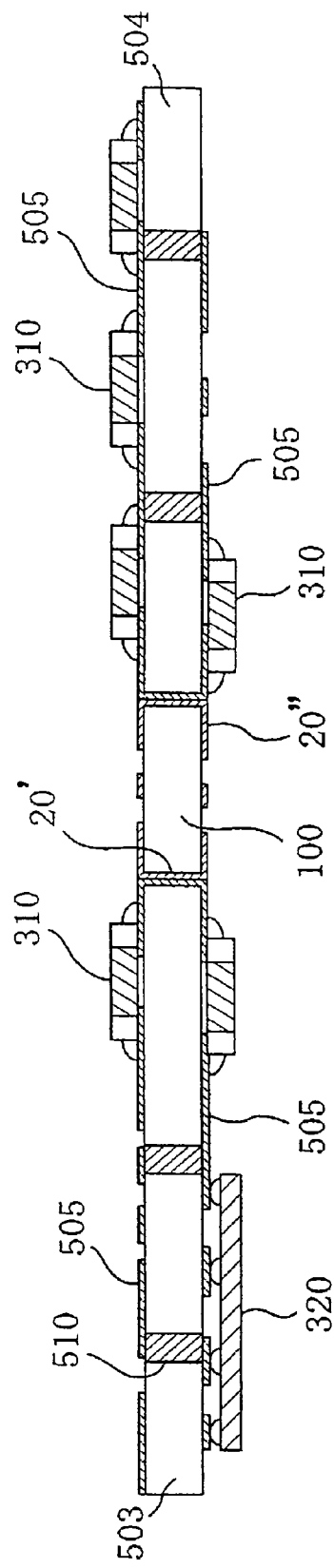
FIG. 14 is a cross-sectional view of a mount assembly in accordance with an embodiment of the present invention.

FIG. 14 shows a mount assembly wherein two circuit boards (for example, printed circuit boards) 503 and 504 are connected in a direction parallel to a principal surface by the connector sheet 100 of the first embodiment. The connector sheet 100 is disposed between the circuit boards 503 and 504 as shown in FIG. 14, and electrically connects them.

In the mount assembly shown in FIG. 14, each of the circuit boards 503 and 504 has wiring patterns 505 (conductor patterns). Each wiring pattern 505 is also formed on at least a part of a side surface of each of the circuit boards 503 and 504. Further, a surface mount electronic component 310 and a semiconductor chip 320 are mounted on the wiring patterns 505.

In this mount assembly, a side-surface wiring portion of U/L-shaped side wiring 20, which is located on one side surface of the connector sheet 100, is connected to the wiring which is located on the side surface of the circuit board 503. This U/L-shaped side wiring 20 forms a wiring pattern on an upper or lower surface of the sheet substrate so that it is connected to another U/L-shaped side wiring 20" located on another side surface. The U/L-shaped side wiring 20" is connected to a wiring located on a side surface of the circuit board 504. Therefore, the circuit boards 503 and 504 are electrically connected by the connector sheet 100.

In the mount assembly shown in FIG. 14, the connector sheet 100 and each of the circuit boards may be connected utilizing adhesiveness of the sheet substrate of the connector sheet 100. In that case, the connector sheet 100 containing a semi-cured resin is connected to the circuit boards and then the resin is completely cured into a completed mount assembly.

Figure 15A:
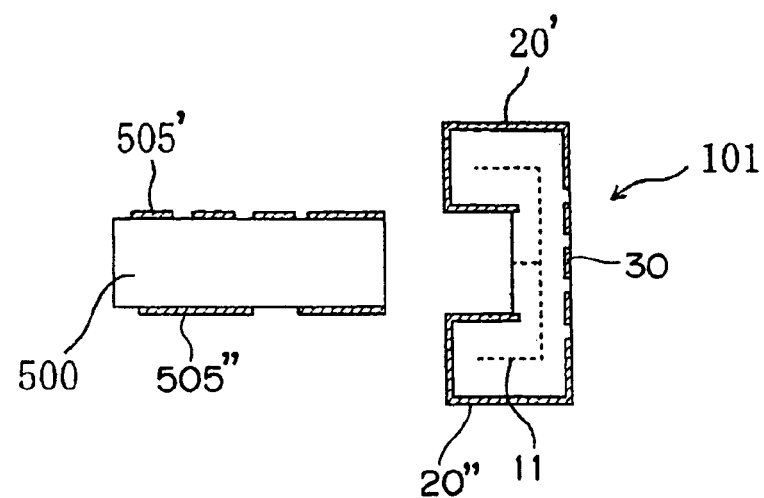
FIGS. 15(a) and 15(b) are sectional views which schematically show a method for using a connector sheet 101.
Figure 15B:
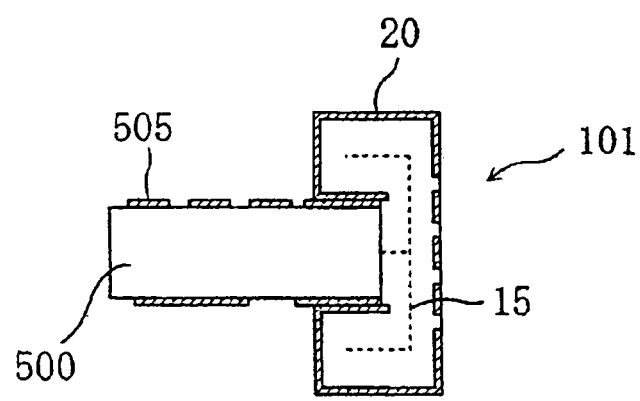

FIGS. 15a and 15b show a method for electrically connecting an upper surface and a lower surface of a double-sided printed wiring board 500 by using a connector sheet 101 whose section is a U-shape.

The connector sheet 101 shown in FIG. 15(a) has a concave portion on the upper surface, and a side surface of the printed wiring board 500 can fit in the concave portion. In FIGS. 15(a) and 15(b), dotted lines show overlapped planes which are formed by folding a sheet containing a semi-cured resin layer in order to produce the connector sheet 101. In the connector sheet 101, U/L-shaped side wirings 20' and 20" also extend inner surfaces which define the concave portion.

When the printed board 500 is fitted in the connector sheet 101, electrical conduction between the upper surface and the lower surface of the printed board 500 can be ensured by the connector sheet 101, as shown in FIG. 15(b). More specifically, a wiring pattern 505' formed on one surface of the printed board 500 is connected to the U/L-shaped side wiring 20' which extends on an inner side surface of the concave portion of the connector sheet. The U/L-shaped side wiring 20' is connected to a wiring pattern 30 formed on a lower surface of the connector sheet 101. The wiring pattern 30 is connected to the U/L-shaped side wiring 20" which extends on another side surface. The U/L-shaped side wiring 20" further extends on an inner side surface of a corner portion to be connected to a wiring pattern 505" formed on another surface of the printed board 500. Therefore, this construction makes it possible to use a cheaper double-sided printed board 500 which has no through holes or vias, or to reduce a production cost of the double-sided printed board 500. Alternatively, a multilayer printed board having three or more wiring layers can be fitted in the concave portion of the connector sheet. Alternatively, a double-sided or a multilayer printed board which has through holes or vias can be fitted in the concave portion of the connector sheet.

The mount assembly of this construction may be produced by a method which includes steps of:

preparing a sheet which includes a wiring layer having at least one wiring, and an insulating layer containing a semi-cured resin;

bending (or folding) the sheet so that the insulating layer forms a concave portion, with parts of the insulating layer facing each other and portions of the at least one wiring facing each other across the insulating layer, with another portion of the at least one wiring extending on a side surface of the insulating layer which is formed by a bent part of the insulating layer, and with still another portion of the at least one wiring extending on an inner side surface of the concave portion;

closely fitting a side surface of a circuit board wherein wiring patterns are formed on both of an upper surface and lower surface, into the concave portion; and curing the resin contained in the insulating layer of the bent sheet.

In other words, the mount assembly can be produced by 1) bending the sheet "A" described in connection with the first embodiment so that the sheet "A" forms a concave portion and the U/L-shaped side wiring also extends an inside surface of the concave portion, 2) fitting a double-sided circuit board within the concave portion so that the circuit board closely contacts the concave portion, and 3) curing the insulating layer of the sheet "A." This method allows the concave portion to be formed depending on a size of a side surface of the circuit board and enables the circuit board and the connector sheet to be connected integrally by using the adhesiveness of an uncured insulating layer, whereby good electrical and physical connection between the circuit board and the connector sheet can be ensured.

Figure 16A:
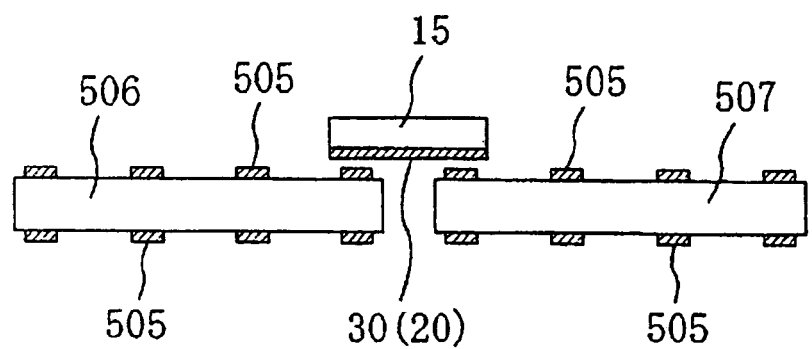
FIGS. 16(a) and 16(b) are sectional views which schematically show a process for electrically connecting circuit boards 506 and 507, and manufacturing a connector sheet 100 at the same time.
Figure 16B:
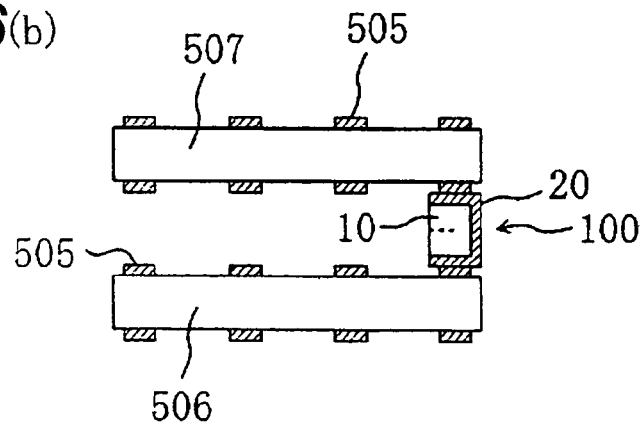

Another mount assembly is shown in FIGS. 16(a) and 16(b). FIGS. 16(a) and 16(b) show a method for producing a mount assembly by fabricating connector sheet 100 and electrically connecting circuit boards 506 and 507 at the same time.

FIG. 16(a) shows a sheet 15 having a wiring pattern 30 formed thereon (see FIG. 11(d)), and circuit boards 506 and 507 having wiring patterns 505. The wiring pattern 30 contains a portion that is to be a U/L-shaped side wiring 20.

Portions of the wiring pattern 30 of the sheet are contacted with portions (preferably portions at a peripheral area) of the wiring patterns 505 of the circuit boards 506 and 507. Next, the circuit boards 506 and 507 are moved so that they are substantially parallel and the sheet 15 is bent. Further, a portion containing the sheet 15 is completely cured by being heated and pressurized, thereby resulting in the mount assembly shown in FIG. 16(*b*). As illustrated in FIGS. 16(*a*) and 16(*b*), the sheet 15 becomes the connector sheet 100 which has the U/L-shaped side wiring 20. The connector sheet 100 previously connects the circuit boards 506 and 507 electrically before it is produced, and therefore, after it is produced.

Figure 17A:
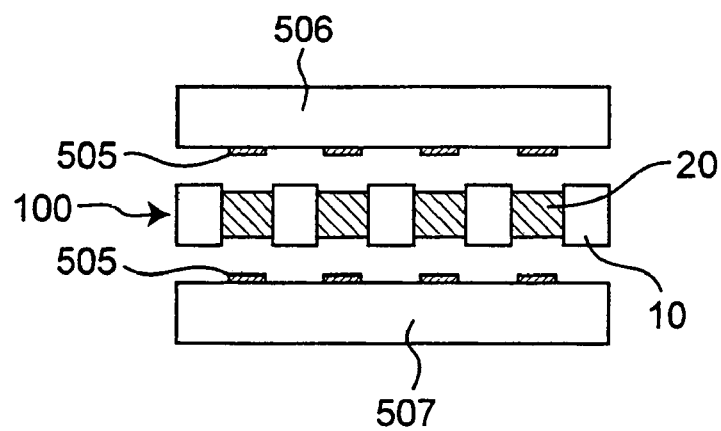
FIGS. 17(a) and 17(b) are sectional views which schematically show a method for producing a mount assembly which includes a connector sheet 100.
Figure 17B:
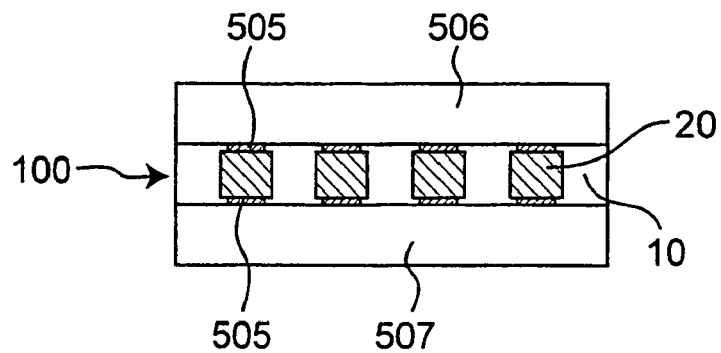

Further, another mount assembly is shown in FIGS. 17(*a*) and 17(*b*). FIGS. 17(*a*) and 17(*b*) show a method for connecting two circuit boards 506 and 507 using a connector sheet wherein exposed surfaces of an upper-surface wiring portion and a lower-surface wiring portion of a U/L-shaped side wiring 20 are located inside relative to surfaces of the connector sheet as shown in FIG. 18.

FIG. 17(*a*) shows an arrangement of the circuit boards 506 and 507 and connector sheet 100. The connector sheet 100 is disposed between the circuit boards 506 and 507 so that protruded electrodes 505 on the circuit boards 506 and 507 coincide with U/L-shaped side wirings 20. As shown in FIG. 17(*b*), the electrodes 505 are fitted in concave portions formed by the U/L-shaped side wirings 20 and sheet substrate 10. Thereby, the electrodes 505 and the U/L-shaped side wirings 20 are electrically connected and the circuit boards 506 and 507 are connected through the U/L-shaped side wirings 20. In this manner, electrical connection between the connection member and the circuit boards may be obtained easily and surely by using the connection member wherein the U/L-shaped side wirings form the concave portions, and connecting protruded portions (protruded electrodes in FIGS. 17(*a*) and 17(*b*)) formed in a wiring pattern of the circuit boards with this concave portion.

Embodiment 3

Next, a connector sheet of another embodiment is described. In a case where the connection member of the present invention is provided as the connector sheet, the connector sheet may be constructed so that is has tackiness under a certain condition, and adhesiveness under another condition. Herein, a connector sheet having both of tackiness and adhesiveness is described.

For describing such a connector sheet, FIG. 1 is referred to for convenience. In connector sheet 100 of this embodiment, both of upper surface 10*a* and lower surface 10*b* have tackiness under a first condition and adhesiveness under a second condition different from the first condition. Herein the first condition may be, for example, a temperature condition in a range of 0° C. to 80° C. More specifically, the first condition may mean that the upper surface 10*a* and the lower surface 10*b* are subjected to a temperature in this temperature range. The temperature of the first condition may be typically room temperature (for example, between about 10° C. and about 40° C.) and may be about at least 50° C. in order to enhance the tackiness. The second condition may be a condition under which a hardening reaction of a material constituting the upper surface 10*a* and the lower surface 10*b* proceeds. The meanings of "tackiness" and "adhesiveness" are as described above.

The upper surface 10*a* and the lower surface 10 of the sheet substrate 10 may be formed of a material selected form (a) a mixture of a silicone resin and a thermosetting resin, (b) a mixture of a thermoplastic resin and a thermosetting resin, and (c) an ultraviolet curing resin and a thermosetting resin. Alternatively, the upper surface 10*a* and the lower surface 10*b* may be constituted by a mixture of two or more materials selected from (a), (b) and (c).

The material (a) is a mixture system of silicone resin/thermosetting resin. In this mixture system, the silicone resin provides the tackiness and the thermosetting resin provides the adhesiveness. The material (b) is a mixture system of thermoplastic resin and thermosetting resin. In this mixture system, the thermosetting in a liquid state swells the solid thermosetting resin to provide the tackiness and the thermosetting resin provides the adhesiveness. The material (c) is a mixture system of UV curing resin and thermosetting resin. In this mixture system, pregelation of the UV curing resin provides the tackiness and the thermosetting resin provides the adhesiveness. As to the tackiness of the material (c), more specifically, a surface of the sheet substrate formed of the material (c) is cured (pre-cured, not post cured) by being irradiated with UV so as to pregelate, whereby the tackiness is generated on the surface.

The upper and lower surfaces 10*a* and 10*b* may be formed of another material as long as the material has tackiness and adhesiveness as described above. For example, a material having a combination of tackiness and adhesiveness may be realized by using only a thermoplastic resin (or substantially only a thermoplastic resin). That is, in a case where a system obtained by adding a solvent to a thermoplastic resin having a sufficiently high softening point is employed, the tackiness is provided by adding the solvent which softens the thermoplastic resin, and the adhesiveness is provided by vaporizing the solvent at a high temperature and then cooling the thermoplastic resin so as to solidify the resin. However, since an adhered portion may be separated in a high temperature region wherein the thermoplastic resin melts, it is desirable to take an appropriate measure so as to maintain reliability at this high temperature. For example, a hardening resin such as a thermosetting resin dissolved in a solvent is effectively added in a material system whose main component is thermoplastic resin.

An adhesion treatment for any material system may be performed using heat, light, water, air, solvent, or an electronic beam. Adhesion may be achieved more strongly and stably by optionally applying pressure during the adhesion.

The connector sheet may have a new function of reparability due to the tackiness and the adhesiveness exhibited under different conditions by the upper and the lower surfaces of the sheet substrate. This is described with reference to FIGS. 21(*a*) to 21(*c*).

Figure 21A:
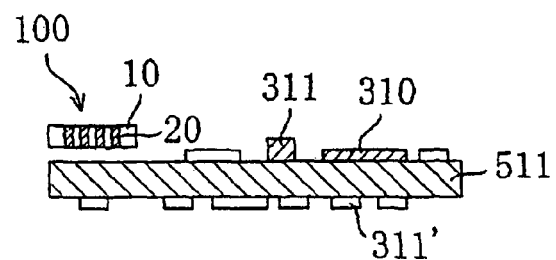
FIGS. 21(a) to 21(c) are sectional views which schematically show a method for electrically connecting circuit boards using a connector sheet 100.
Figure 21B:
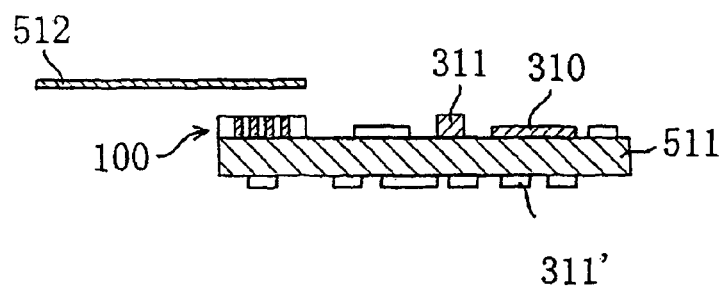
Figure 21C:
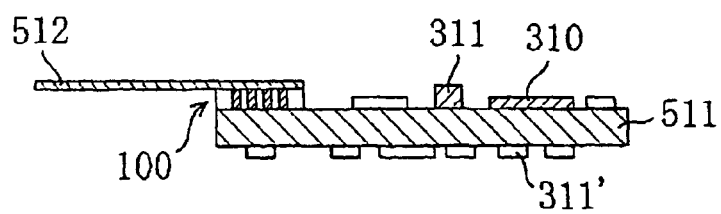

FIGS. 21(*a*) to 21(*c*) show a method for electrically connecting circuit boards using a connector sheet 100. Herein, the connector sheet 100 is exemplified, wherein sheet substrate 10 is formed of a mixture of a silicone resin, an epoxy resin (a thermosetting resin) and an inorganic filler. The silicone resin mainly confers tackiness, while the epoxy resin mainly confers adhesiveness. The inorganic filler serves to control a thermal expansion coefficient after adhesion. The inorganic filler may be, for example, $Al_2O_3$, $SiO_2$, or MgO.

As shown in FIG. 21(*a*), the connector sheet 100 is disposed above a circuit board 511 on which electronic components (310, 311, 311') are mounted. The connector sheet has tackiness under a first condition and adhesiveness under a second condition, as described above.

In FIG. 21(*a*), the circuit board 511 may be, for example, a rigid board (a typical printed board). On the circuit board 511, a circuit pattern is formed and the electronic components (310, 311, and 311') are electrically connected to the circuit pattern. The electronic component 310 is a semiconductor integrated circuit chip (for example, a surface mount IC), and the electronic components 311 and 311' are, for example, surface mount components such as a chip capacitor, a chip inductor, and a chip resistor.

Next, as shown in FIG. 21(*b*), the connector sheet 100 is attached to the circuit board 511 at a predetermined position under the first condition and they are closely contacted with each other by the tackiness of the connector sheet 100. The first condition is a predetermined temperature condition selected from a temperature range between room temperature and 80° C. Since electrical conduction between an upper surface and a lower surface of the connector sheet 100 is ensured by U/L-shaped side wiring 20, the connector sheet 100 may be merely adhered to the circuit board 511. Therefore, the electrical conduction can be made without compressing the connector sheet 100, differently from connection using an anisotropic conductive film.

Next, a circuit board 512 which is to be connected electrically to the circuit board 511 is moved to a position near the connector sheet 100. Then, as shown in FIG. 21(*c*), the circuit board 512 is disposed on the connector sheet 100 and the circuit board 512 is closely adhered to the circuit board 512 using the tackiness of the connector sheet 100. As a result, the circuit boards 511 and 512 are electrically connected to each other through the connector sheet 100. The circuit board 512 is a flexible circuit board and may be formed of a polyimide. A circuit pattern is also formed on the circuit board 512 and an electronic component (such as a surface mount component) may be mounted on the circuit pattern (not shown).

Next, an electrical connection between the circuit boards 511 and 512 is examined in a state as shown in FIG. 21(*c*). This examination may be performed by checking an electrical resistance between the circuit boards 511 and 512 and testing automatically with, for example, a scanner or a multimeter. When this examination shows good electrical connection, the connector sheet 100 and the circuit boards 511 and 512 are adhered under the second condition (which is achieved by raising temperature) A temperature condition as the second condition may be, for example, at least 140° C. (preferably, in a range of 150° C. to 170° C.). When the connector sheet 100 is subjected to the second condition, it functions as an adhesive to provide a permanent fixation of the circuit boards 511 and 512.

When this examination shows poor electrical connection, at least one of the circuit boards 511 and 512 is removed so as to release adhesion between the connector sheet and the at least one of the circuit boards 511 and 512. More specifically, since the connector sheet 100 is adhered to the circuit boards 511 and 512 by its tackiness and can be peeled off under the first condition, repair (exchange of a component) can be easily performed according to a bad result of the examination.

Alternatively, when the examinations show poor electrical connection and there is no problem in the circuit board itself, the steps shown in FIGS. 21(*a*) to 21(*c*) are repeated again so as to electrically connect the circuit boards. The examination may be performed again and then a mount assembly including two circuit boards may be obtained.

In a case where the connector sheet 100 is required to be removed after reaching the state shown in FIG. 21(*c*), a technique of lowering the temperature may be employed in order to reduce the tackiness of the connector sheet 100. In a case where the temperature (the first condition) at which attachment of the connector sheet 100 is performed using its tackiness, is in a range of room temperature to 80° C., an ambient temperature may be lowered below room temperature (for example, below 0° C., and preferably in a range of −10° C. to −20° C.) in order to reduce the tackiness. Alternatively, the connector sheet 100 may be preferably formed such that the tackiness disappears under a third condition that is a temperature condition lower than the temperature condition of the first condition under which the tackiness is exhibited.

The connector sheet having tackiness and adhesiveness enables repair to be performed easily. To the contrary, when connection is made by an anisotropic conductive film, a conduction test can be performed after the anisotropic conductive film has been compressed to be connected to a circuit board completely. For this reason, when the test shows poor conduction, it is impossible to perform repair. That is, in a case of a poor connection, the mount assembly in its entirety including the circuit board should be discarded. Since it is possible to perform the repair by using the connector sheet 100 having tackiness and adhesiveness, the number of components and products which are discarded can be significantly reduced, which contributes to cost reduction. Therefore, the connector sheet 100 having tackiness and adhesiveness makes it possible to produce a mount assembly including a circuit board at a lower cost.

A sheet substrate of the connector sheet having tackiness and adhesiveness may be formed of only the material as described above or may be formed of a layer of the material as described above and a layer of another material. The sheet substrate of a plurality of layers may have a construction consisting of a central layer and an upper layer and a lower layer which sandwich the central layer. In that case, the upper and the lower layers are formed of a material having tackiness and adhesiveness. Material for the central layer may be a polyimide. Alternatively, the central layer may be a woven fabric, a non-woven fabric or a resin sheet. The upper layer and the lower layer may be formed by applying an adhesive which has tackiness and adhesiveness. The upper layer may be formed of a material different from that of the lower material so that the tackiness of the upper surface is different from that of the lower surface.

In a case where the upper surface and the lower surface of the sheet substrate have tackiness and adhesiveness, a releasing film may be attached to either or both of the upper and lower surfaces. The connector sheet can be easily handled by attachment of the releasing film. The releasing film is removed, for example, before attaching the connector sheet to a circuit board.

Embodiment 4

Next, a connection member wherein an insulating substrate is formed of a core layer and an insulating layer is described as another embodiment of the connection member of the present invention.

Figure 22:
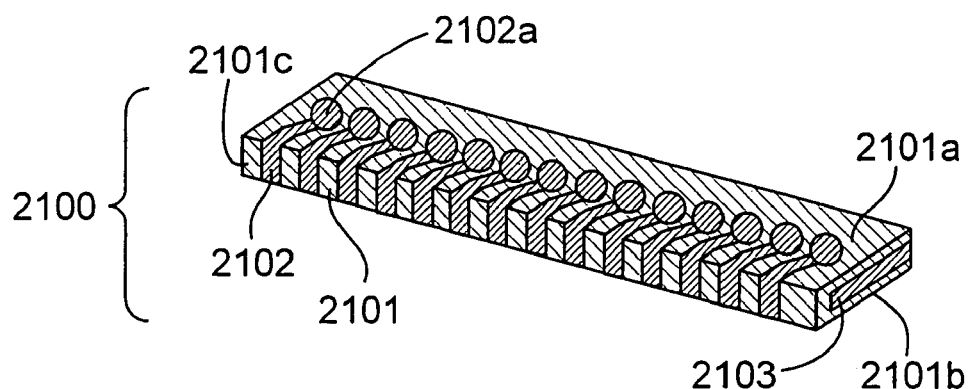
FIG. 22 is a perspective view schematically showing a connection member 2100 in accordance with an embodiment of the present invention.
Figure 23:
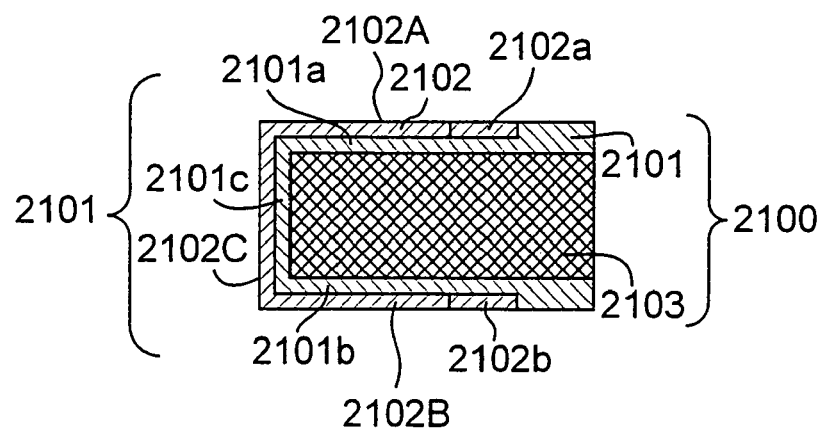
FIG. 23 is a sectional view schematically showing a connection member 2100 in accordance with an embodiment of the present invention.

FIG. 22 is a perspective view schematically showing a construction of a connection member 2100 according to an embodiment of the present invention. FIG. 23 is a schematic sectional view of the connection member shown in FIG. 22. The connection member 2100 shown in FIGS. 22 and 23 has an electrically insulating layer 2101, a plurality of U/L-shaped side wirings 2102 and a core member 2103. The insulating layer 2101 consists of an upper-surface portion 2101*a*, a lower-surface portion 2101*b* opposed to the upper-surface portion 2101*a*, and a side-surface portion 2102*c* which connects the upper-surface portion 2101*a* and the lower-surface portion 2101*b*. One end of U/L-shaped side wiring 2102 exists at a predetermined position on the upper-surface portion 2101*a* of the insulating layer 2101 and therefrom passes on the side-surface portion 2101*c* of the insulating layer 2101 and terminates at a predetermined position on the lower-surface portion 2101*b*.

In this embodiment, each of the upper-surface portion 2101a, the lower-surface portion 2101b and the side-surface portion 2101c of the insulating layer is substantially flat and has an approximately rectangular shape. These portions have upper-surface wiring portion 2102A, lower-surface wiring portion 2102B, and side-surface wiring portion 2102C, respectively, and these wiring portions are integrally connected to form the U/L-shaped side wirings 2102.

Also in the connection member 2100 of this embodiment, electrical conduction between the upper-surface portion 2101a and the lower-surface portion 2101b of the insulating layer 2101 is made by the U/L-shaped side wirings 2102. More specifically, also in this embodiment, the U/L-shaped side wiring 2102 serves to make electrical conduction between the upper-surface portion 2101a and the lower-surface portion 2101b of the insulating layer 2101, and therefore, a via for making electrical conduction between the upper-surface portion 2101a and the lower-surface portion 2101b is not formed in the insulating layer 2101 and the core member 2103. Thus, a via is not required in this connection member 2100.

In one embodiment, the insulating layer 2101 of the connection member 2100 may be formed of a composite material containing a resin (for example, a thermosetting resin and/or a thermoplastic resin) and an inorganic filler. In that case, the thermosetting resin is preferably used as the resin. The electrical insulating layer may be formed of only the thermosetting resin without the inorganic filler. In a case where the inorganic filler is added to the resin, a filler of $Al_2O_3$, $SiO_2$, MgO, BN or AlN may be used. By adding the inorganic filler, various properties of the insulating layer 2101 can be controlled. For this reason, the insulating layer 2101 is preferably formed of the composite material containing the inorganic filler. The change of the property (thermal conductivity and the like) caused by adding the inorganic filler is as described in connection with the connector sheet of the first embodiment, and therefore, a detail thereof is omitted. Further, a solder resist may be formed on a surface of the insulating layer 2101.

The U/L-shaped side wiring 2102 may be formed of any appropriate material, for example, a copper foil. A thickness of the U/L-shaped side wiring 2102 may be in a range of, for example, about 3 μm to about 50 μm. The U/L-shaped side wiring 20 may be formed by etching a copper foil in a conventional manner as described in connection with the first embodiment.

In the construction shown in FIG. 22, terminals (lands) 2102a, which are electrical elements connected to end portions of the U/L-shaped side wirings 2102 are arranged on the upper surface portion 2101a of the insulating layer 2101. That is, in the illustrated embodiment, terminals 2102a are arranged corresponding to a terminal arrangement of a board (such as a mother board) or an electronic component which is to be electrically connected to the connection member 2100. Similarly, terminals 2102b (lands) connected to other end portions of the U/L-shaped side wirings 2102 are arranged on the lower-surface portion 2101b of the insulating layer 2101 corresponding to a circuit board or an electronic component which is to be connected to the connection member 2100.

Figure 25:
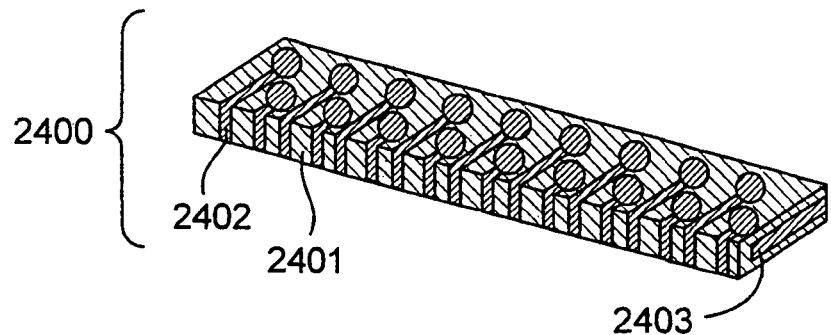
FIG. 25 is a perspective view schematically showing a connection member 2400 in accordance with an embodiment of the present invention.

For example, the electrical elements may be arranged on the lower-surface portion 2101b of the insulating layer 2101 in a zigzag (see FIG. 25) or a grid, and they may be connected to a portion (for example, an end portion) of the U/L-shaped side wiring. Lands as the electrical elements may be arranged in a land grid array (LGA), or may be a ball grid array (BGA) by mounting solder balls that are electrical elements. Each electrical element may be subjected to a surface treatment such as solder plating or tin plating, which facilitates mounting of the board or the electronic component.

A size of the connection member is not limited to a particular one. The size of the connection member may be selected by those skilled in the art depending on a number and size of objects which are connected to the connection member (for example, the electronic component and the board), a number of terminals of the object, and a line/space of the U/L-shaped side wiring of the connection member.

The core member 2103 serves to maintain a shape of the connection member 2100, and therefore the connection member may be formed into various shapes by changing a shape of the core member. Materials for the core member 2103 include a metal, a ceramic, a resin and a resin composition (for example, a compound of a resin and a filler). In a case where the core member 2103 is made of a metal, a desired shape is easily made by machining and production cost is low. In addition, thermal conductivity of the metal is low, which avoids a deficiency in thermal conductivity of a resin interposer and is effective to heat release (diffusion) from a semiconductor device. Further, the core member may be formed of a metal foil, a resin film or a glass cloth so as to have flexibility.

In a conventional connection member, electrical connection between an upper side and a lower side is made by a via, and therefore, it is difficult to provide a core member of a conductive metal in an insulating substrate. In the connection member of the present invention, electrical conduction is made by the U/L-shaped side wiring 2102 which extends on a lateral side of the core, that is, on the side-surface portion of the insulating layer, and therefore a metal core member can be used. Further, the metal member may also function as a shield.

In a case where the core member is formed of a ceramic material, high electrical insulation as well as high thermal conductivity can be conferred to the connection member. A core member of a resin or a resin composition is advantageous in aspects of weight, electrical insulation, machinability and cost.

Figure 26:
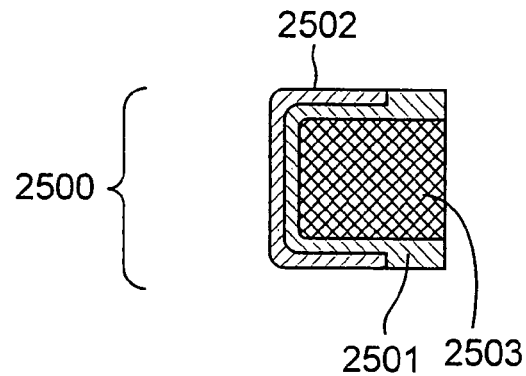
FIG. 26 is a sectional view schematically showing a connection member 2500 in accordance with an embodiment of the present invention.
Figure 27:
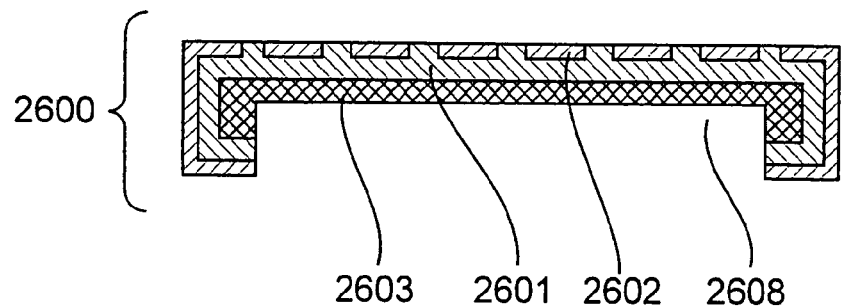
FIG. 27 is a sectional view schematically showing a connection member 2600 in accordance with an embodiment of the present invention.
Figure 28:
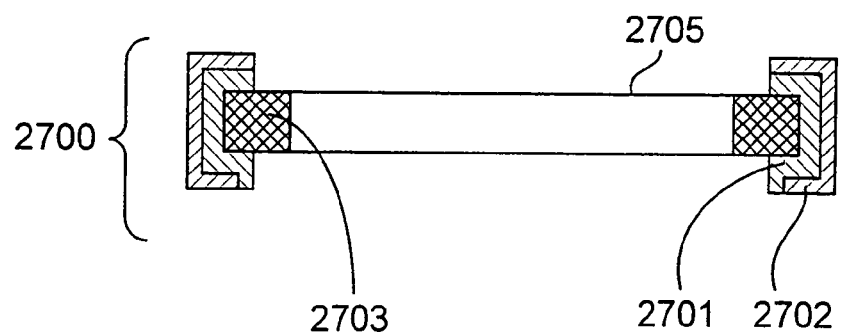
FIG. 28 is a sectional view schematically showing a connection member 2700 in accordance with an embodiment of the present invention.

The shape of the core member is not limited to a particular one and may be selected depending on usage of the connection member. For example, a corner (or edge) portion of core member 2503 of the connection member 2500 may not be sharpened, and may be planed off to be round (FIG. 26). In that case, insulating layer 2501 and/or U/L-shaped side wiring 2502 conform to a shape of the corner portion, so that there is no bent portion with a sharpened edge in the U/L-shaped side wiring, which results in reduction in breakage of the wiring. Further, a core member 2603 which has a concave portion 2608 (FIG. 27) or a core member 2703 which has a hollow center 2705 (FIG. 28) may be used. In FIGS. 27 and 28, insulating layers are denoted by reference numerals 2601 and 2701, respectively, and U/L-shaped side wirings are denoted by reference numerals 2602 and 2702, respectively. FIG. 28 is a sectional view of a connection member, similarly to FIG. 23. The core member 2703 has a rectangular frame shape or a C-shape as a whole when the connection member 2700 is viewed from above. When using connection members 2600 and 2700 shown in FIGS. 27 and 28, an electronic component can be placed in a space formed by the concave portion or the hollow portion, whereby a mounting density is increased.

Figure 29:
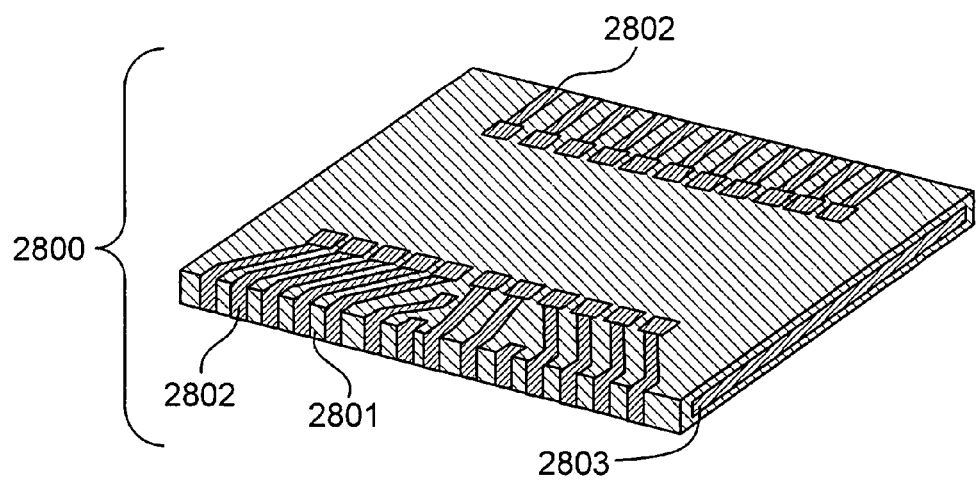
FIG. 29 is a perspective view schematically showing a connection member 2800 in accordance with an embodiment of the present invention.

In another embodiment, U/L-shaped side wirings 2802 may be formed on two or more side surfaces of an electrical insulating layer 2801, as shown in FIG. 29. Connection member 2800 shown in FIG. 29 is provided with the U/L-shaped side wirings 2802 which pass through a front side surface and U/L-shaped side wirings 2802 which pass through a side surface opposite to the front side surface. A core member 2803 is not covered with the insulating layer 2801 and is exposed on side surfaces where U/L-shaped side wiring 2802 does not exist. A number of the side surfaces where the U/L-shaped side wirings pass through may be selected depending on a number of electronic components to be mounted and a number of wirings to be connected, and may be three or four.

Figure 30:
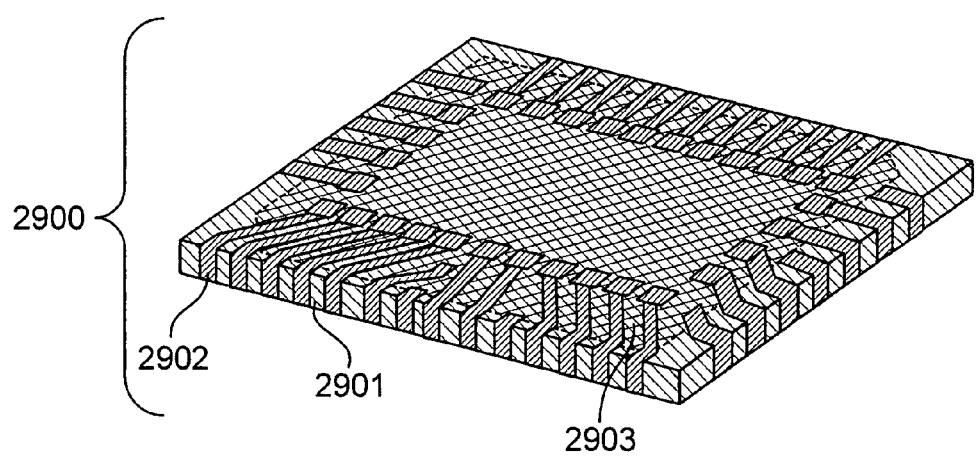
FIG. 30 is a perspective view schematically showing a connection member 2900 in accordance with an embodiment of the present invention.

FIG. 30 shows a connection member 2900 wherein a core member 2903 is completely covered with an electrical insulating layer. In FIG. 30, the core member 2903 enclosed by insulating layer 2901 is shown by shading. In the connection member 2900 shown in FIG. 30, U/L-shaped side wirings 2902 are situated on all of four side surfaces and therefore the U/L-shaped side wirings are located on every exposed surface of an approximate hexahedron.

Figure 31:
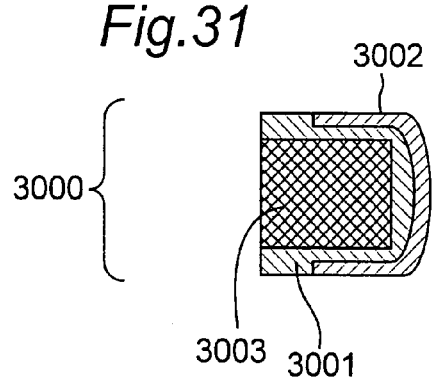
FIG. 31 is a sectional view schematically showing a connection member 3000 in accordance with an embodiment of the present invention.

In the connection member 2100 shown in FIG. 22, the core member 2103 and the insulating layer 2101 disposed around the core member 2103 have an approximate hexahedral shape as a whole. In this specification, the terms "approximate hexahedron" or "approximate rectangle" are used in the sense that they include, in addition to a geometrical hexahedron (a rectangular parallelepiped and a cube) and rectangle (a square or an oblong rectangle), a hexahedron and a rectangle whose corners or edges are rounded and those whose surfaces are not completely flat but curved. For example, the "approximate hexahedron" includes, for example, a connection member 3000 shown in FIG. 31 which has a rounded hexahedral shape as a whole due to a thick insulating layer 3001 which is wrapped around a core member 3003 having sharpened edges. Also in the connection member 3000, breakage of U/L-shaped side wiring 3002 can be reduced.

In a connection member with a core, since a shape of an insulating layer is maintained by the core member, a thickness of the insulating layer can be reduced. Thereby, a thickness of the connection member is reduced or connection reliability is improved. Further, since an upper surface and a lower surface of the connection member can be electrically connected without forming vias in the connection member and with a core similarly to the first embodiment, inconvenience caused by via formation can be avoided. Details thereof are as described in connection with the first embodiment, and therefore omitted here.

Figure 24A:
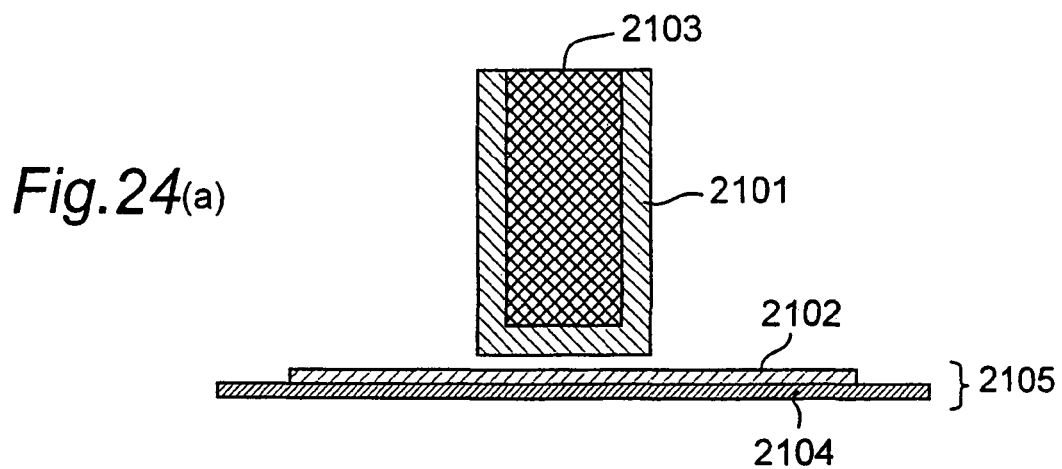
FIGS. 24(a) to 24(c) are sectional views which schematically show a fourth method for producing a connection member.
Figure 24B:
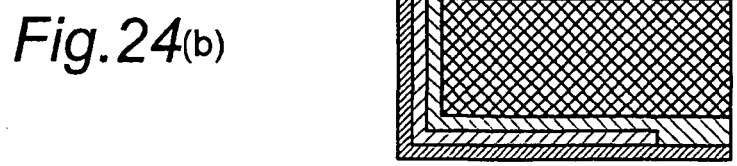
Figure 24C:
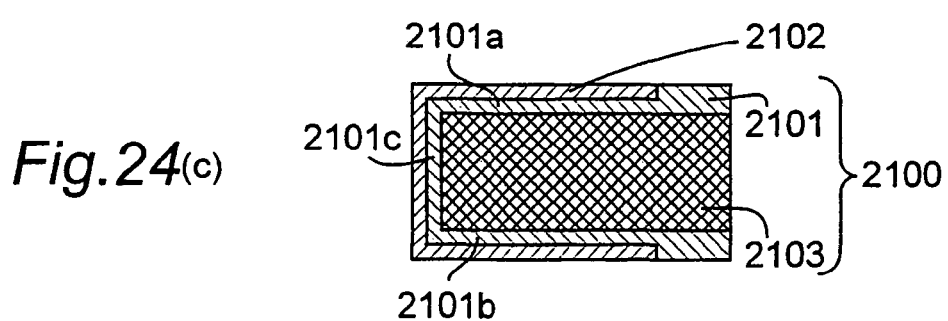

Next, an embodiment of a method for producing a connection member with a core, for example the connection member shown in FIG. 23 is described with reference to FIGS. 24(*a*)-24(*c*) and 32(*a*)-32(*c*). FIG. 24(*a*) is a schematic sectional view similar to FIG. 23. A method shown in FIGS. 24(*a*)-24(*c*) corresponds to a "fourth production method" of the present invention and a method shown in FIGS. 32(*a*)-32(*c*) corresponds to a "third production method" of the present invention.

FIG. 24(*a*) shows a laminate 2105 including a carrier sheet 2104 (or a support sheet) and a wiring layer 2102 formed thereon, and a resin layer 2101 (an electrically insulating layer) formed around a core member 2103.

The wiring layer 2102 may be made from, for example, a copper foil (preferably, an electrolytic copper foil) and the carrier sheet 2104 may be made of, for example, a metal foil (a copper foil or an aluminum foil) or a resin film. A thickness of the wiring layer 2102 may be in a range of about 3 μm to about 50 μm, and a thickness of the carrier sheet 2104 may be in a range of about 25 μm to about 200 μm. Materials for forming this laminate are known as various materials used for producing a circuit board.

Next, the wiring layer 2102 having a predetermined pattern may be formed by any known method, for example, an etching process using a mask. As a result of the process, the wiring layer 2102 is formed so that it includes at least one wiring which is to become a U/L-shaped side wiring finally.

In parallel with formation of the wiring layer, uncured resin layer 2101 is formed by applying a resin material containing a resin onto the core member 2103. This material is to be the insulating layer. An electrically insulating thermosetting resin and/or an electrically insulating thermoplastic resin is used as the resin. A hardening resin (particularly a thermosetting resin) in a semi-cured state (that is, B-stage) is particularly preferred. The resin material may contain a filler as described. In one example, the resin material may contain at least 100 parts by weight (preferably 140 to 180 parts by weight) of an inorganic filler to 100 parts by weight of the thermosetting resin. A thickness of the resin layer 2101 is, for example, in a range of about 5 μm to about 100 μm.

Next, as shown in FIG. 24(*b*), the laminate 2105 is bent along the resin layer 2101 so that the wiring layer 2102 contacts the resin layer 2101. As a result, bent portions of the wiring layer 2102 are opposite to each other across the resin layer and become an upper-surface wiring portion and a lower-surface wiring portion of the U/L-shaped side wiring, respectively, and these portions are connected by a side-surface wiring portion. Thereafter, an electrically insulating layer is formed by curing the resin contained in this bent resin layer. In FIG. 24(*c*), reference numerals 2101*a*, 2101*b* and 2102*c* denote the upper-surface portion, the lower-surface portion and the side-surface portion of the insulating layer, respectively.

The step shown in FIG. 24(*a*) may be a step of forming a laminate covered with a resin layer 3105 by forming a resin layer 3101, which is to be an electrically insulating layer, on a laminate including a carrier sheet 3104 and a wiring layer 3102 formed thereon as shown in FIG. 32(*a*). The resin layer 3101 may be formed by applying a resin material containing preferably a hardening resin (particularly a thermosetting resin) or attaching a sheet of such a material on the laminate. A preferable material for the resin layer is as described in connection with the step shown in FIG. 24(*a*). In this case, the laminate 3105 is bent along a core member 3103 so that the resin layer 3101 contacts the core member 3103, as shown in FIG. 32(*b*). As a result, an upper-surface portion 3101*a*, a lower-surface portion 3101*b*, and a side-surface portion 3101*c* of the insulating layer are formed and a U/L-shaped side wiring 3102 is formed. Thereafter, resin contained in the resin layer is hardened so as to form the insulating layer.

After bending the laminate or the laminate covered with a resin layer, carrier sheet 2104 or 3104 is removed as shown in FIG. 24(*c*) or FIG. 32(*c*). Curing of the resin layer may be performed either before or after removal of the carrier sheet. Alternatively, the curing may be performed before and after the removal of the carrier sheet. In addition or alternatively, the curing of the resin layer may be performed during the removal of the carrier sheet. After this step, a connection member 2100 or 3100 is obtained.

As apparent from the above description, a via which penetrates the insulating layer and possibly the core member does not need to be formed in the third production method and the fourth production method, and therefore, a step of forming a via can be omitted in these production methods. An advantage conferred by this is as described in connection with the first embodiment, and details thereof are omitted here.

In a case where the connection member is produced as shown in FIGS. 24(*a*)-24(*c*), the U/L-shaped side wiring 2102 is entirely embedded within a surface portion of the insulating layer 2101. That is, an exposed surface of the U/L-shaped side wiring 2102 is substantially flush with an exposed surface of the insulating layer 2101 and these exposed surfaces are co-planar. An effect provided by this construction (suppression of breakage of the U/L-shaped side wiring 2102) is as described in connection with the first embodiment.

Alternatively, the exposed surface of the U/L-shaped side wiring 2102 may be concave from the exposed surface of the insulating layer 2101 on the side-surface portion 2101c so that it is located at a position inside the insulating layer 2101. An advantage provided by this construction is as described in connection with the first embodiment. Particularly, if the corner portion of the U/L-shaped side wiring 2102 is protruded from the exposed surface of the insulating layer 2101, the corner portion tends to contact an external thing. Therefore, it is particularly preferable that the corner portion dents inside relative to the exposed surface of the insulating layer 2101. To this end, each of the exposed surfaces of the U/L-shaped side wiring 2102 on the upper-surface portion 2101a and/or the lower-surface portion 2101b of the insulating layer 2101 may be preferably concave from the exposed surface of the insulating layer.

A configuration wherein the exposed surface of the U/L-shaped side wiring 2102 is inside relative to the exposed surface on the side-surface portion 2101c of the insulating layer 2101 to form a step, may be obtained by a method which is similar to the method described in connection with the first embodiment. Specifically, a concavity is formed in the carrier sheet 2104 by etching away, in addition to an unnecessary portion of the metal layer, a portion of the carrier sheet 2104 which is beneath the unnecessary portion of the metal layer during formation of the wiring layer 2102 shown in FIG. 24(a). Next, a step of folding a carrier sheet and the metal layer along the resin layer formed on the core member, and a step of heating and pressurizing, are performed to provide a connection member wherein resin material enters into the concavity in the carrier sheet 2104 and a step is formed between the exposed surface of the insulating layer 2101 and the exposed surface of the U/L-shaped side wiring 2102 in a finished connection member. Also in the method shown in FIGS. 32(a)-32(c), a step may be formed by removing an extra portion of the carrier sheet 3104 to form a concave portion, and then forming the resin layer 3102. Easily understood is a configuration of the connection member wherein a step is formed between the U/L-shaped side wiring and the insulating layer, by referring to FIG. 18.

A resin or a film may be applied to a surface of the insulating layer 2101 as a solder resist layer for protecting the U/L-shaped side wiring 2102. In that case, exposed surfaces of the U/L-shaped side wirings 2102 may be concave from or flushed with an exposed surface of the solder resist layer (for example, a solder resist layer formed on the side-surface portion 2101c) of the insulating layer 2101. This resist layer is advantageously provided in that a spread of the solder is prevented upon mounting.

Also in the third and the fourth production methods, since the laminate or the laminate covered with a resin layer is bent (or folded) to shape the connection member, a three-dimensional construction can be easily produced depending on a bending manner. For example, in a case where the core member has a shape with at least one of a convex portion and a concave portion, the laminate or the laminate covered with a resin layer can be bent along the core member and then the resin layer is cured completely, resulting in a connection member having at least one of the convex portion and the concave portion as a whole.

The third and the fourth production methods make it possible to produce a connection member without forming a via. An advantage of not performing a step of forming a via is as described above in connection with the first embodiment and that description is omitted here.

Embodiment 5

A component mount assembly is described with reference to FIG. 33. FIG. 33 is a sectional view schematically showing a component mount assembly 3210 which includes a connection member with a core 3200, and a printed board 3206 which is connected to the connection member. U/L-shaped side wirings 3202 are connected to terminals as electrical elements which are arranged in an area array. In this embodiment, a mounting manner of BGA (Ball Grid Array) type which uses solder balls 3208 is employed. Alternatively, a mounting manner of LGA (Land Grid Array) type may be used.

The connection member 3200 shown in FIG. 33 has an electrically insulating layer 3201, a plurality of U/L-shaped side wirings 3202 and a core member 3203. The U/L-shaped side wirings 3202 extend from an upper-surface portion of the insulating layer 3201 toward a lower-surface portion of the insulating layer 3201 through a side-surface portion of the insulating layer 3201. In the embodiment shown in FIG. 33, a semiconductor device 3205 is mounted on the connection member 3200 and connected to the U/L-shaped side wirings 3202. The printed board 3206 is mounted on a lower surface of the connection member via the U/L-shaped side wirings 3202. Therefore, the semiconductor device 3205 and the printed board 3206 are connected via the connection member 3200

In the component mount assembly 3210 shown in FIG. 33, the semiconductor device may be, for example, a bare chip. The semiconductor device 3205 may be mounted by a flip chip method or a wire bonding method on the connection member 3200 via bumps 3207 which are, as electrical elements, connected to the U/L-shaped side wirings 3202. An underfilling may be formed between the semiconductor device 3205 and the upper-surface portion of the insulating layer 3201. The underfilling may improve adhesion between the semiconductor device and the insulating layer. Further, a difference in thermal expansion between the semiconductor device and the insulating layer can be relieved by selecting an appropriate material for the underfilling.

In the embodiment shown in FIG. 33, the connection member 3200 of the present invention functions as an interposer (an intermediate board). Such usage of the connection member can convert a peripheral terminal arrangement of a bare chip into an area array arrangement, which facilitates mounting of the bare chip.

Embodiment 6

Figure 34:
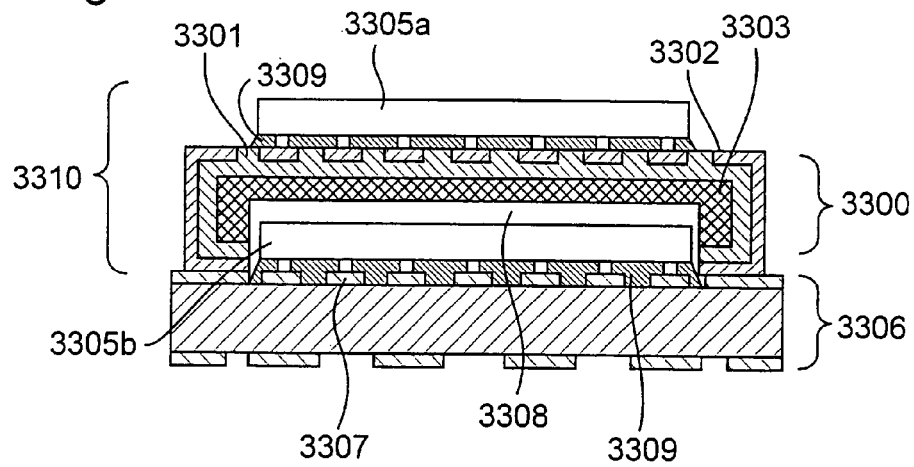
FIG. 34 is a sectional view of a connection member 3300 and a mount assembly 3310 in accordance with embodiments of the present invention.

Another embodiment of the component mount assembly which includes a connection member with a core is described below with reference to FIG. 34. FIG. 34 is a sectional view schematically showing a component mount assembly 3310 including a connection member with a core 3300, and a printed board 3306 connected to the connection member 3300.

The connection member 3300 shown in FIG. 34 has an electrically insulating layer 3301, a plurality of U/L-shaped side wirings 3302 and a core member 3303. The U/L-shaped side wirings 3302 extend from an upper-surface portion of the insulating layer 3301 toward a lower-surface portion of the insulating layer 3301 through a side-surface portion of the insulating layer 3301. In the embodiment shown in FIG. 34, the core member 3303 is of a U-shape having a concave portion on its lower surface and the insulating layer 3301 is formed along a circumference of the core member 3303, whereby the connection member is of a U-shape having a concave portion 3308 as a whole.

In the embodiment shown in FIG. 34, the connection member 3300 functions as a connection member which can be used for three dimensional mounting. More specifically, a semiconductor device 3305*a* is mounted on an upper surface of the connection member 3300 and connected to the U/L-shaped side wirings 3302. The printed board 3306 is mounted on a lower surface of the connection member 3300 through the U/L-shaped side wirings 3302. As a result, the semiconductor device 3305*a* and the printed board 3306 are electrically connected via the connection member 3300. Further, another electronic component (such as a chip part (or a chip component) or a semiconductor device) mounted on the printed board 3306 is placed within the concave portion 3308. In the illustrated embodiment, underfillings 3309 are formed under the semiconductor device 3305*a* and the electronic component 3305*b*.

Usage of the connection member 3300 enables, in addition to the semiconductor device 3305*a*, another semiconductor device 3305*b* to be mounted within the same area viewed from above FIG. 34 so that both devices are overlapped vertically in the printed board 3306. As a result, more electronic components can be mounted even if a mounting area is small. The electronic component mounted on the connection member 3300 and/or the printed board 3306 is not limited to a bare semiconductor chip, and may be another electronic component such as a chip part.

Figure 35:
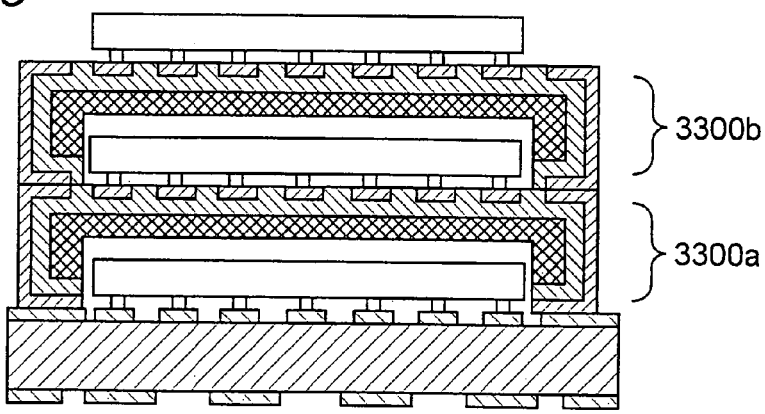
FIG. 35 is a sectional view which schematically shows a construction of mount assembly wherein two connection members of the present invention are stacked.

FIG. 35 shows a mount assembly wherein a plurality of connection members 3300 shown in FIG. 34 are stacked. More specifically, a second connection member 3300*b* is disposed above a first connection member 3300*a*. Further, each of concave portions in the connection members accommodates a semiconductor device which is connected to a connection member or a printed board which is placed under each concave portion. Furthermore, a semiconductor device is mounted on the second connection member. In other words, this mount assembly has a construction wherein another connection member is disposed on the mount assembly shown in FIG. 34 and another semiconductor is mounted on this another connection member. Two connection members are electrically connected in a predetermined manner through a U/L-shaped side wiring and/or an electrical element connected to the U/L-shaped side wiring. Here, the semiconductor device located within the concave portion of the first connection member 3300*a* may be a semiconductor memory and the semiconductor device located within the concave portion of the second connection member 3300*b* may be an LSI (for example, a logic LSI).

In a variant of the illustrated embodiment, a number of the connection members may be three or more so that a multilayer connection member is constructed. These stacked connection members may be of the same type or different types. Alternatively, instead of a connection member with a core, another connection member of the present invention (for example, the connector sheet according to the first embodiment) or a conventional connection member may be combined with the connection member with a core.

Embodiment 7

Figure 36:
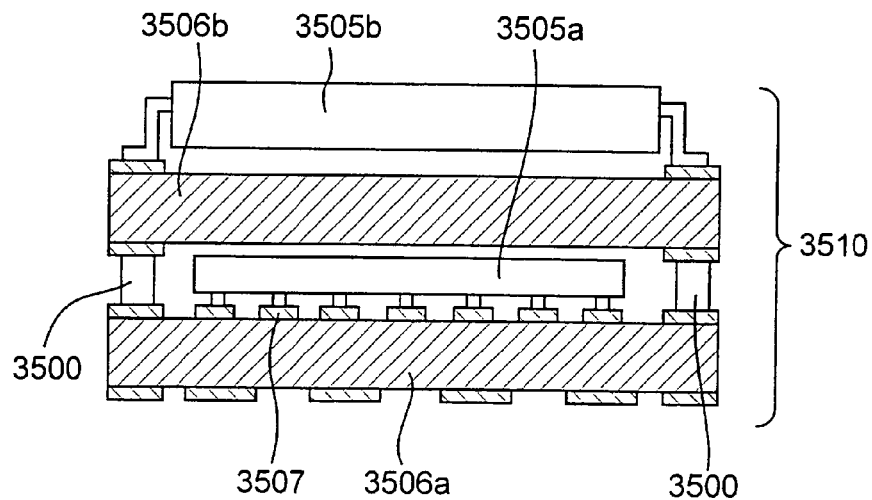
FIG. 36 is a sectional view which schematically shows a construction of mount assembly 3510 in accordance with an embodiment of the present invention.

Another embodiment of the component mount assembly including the connection member with a core is described with reference to FIG. 36. FIG. 36 is a schematic sectional view of a component mount assembly 3510 constituted by printed boards 3506*a* and 3506*b* which are connected by a connection member with a core 3500. In FIG. 36, details of the connection member 3500 are not illustrated, but the connection member 3500 has a U/L-shaped side wiring for connecting the boards disposed on an upper surface and a lower surface of the connection member.

The connection member 3500 shown in FIG. 36 electrically connects the printed boards 3506*a* and 3506*b* and retains these boards integrally. In the illustrated embodiment, connection members exist on the left and right sides in this figure. They may be two separate connection members shown in, for example, FIG. 23, or a single connection member shown in, for example, FIG. 28. Semiconductor devices 3505*a* and 3505*b* are mounted on the printed boards 3506*a* and 3506*b*, respectively. Usage of the connection member 3500 shown in FIG. 36 makes it possible that, in addition to the semiconductor device 3505*a*, another semiconductor device 3505*b* is mounted in the same area viewed from above that both devices are overlapped vertically. As a result, more electronic components can be mounted even if a mounting area is small. By adjusting a height (or a thickness) of the connection member, a component can be accommodated within a space defined by the connection member 3500 and the printed boards 3506*a* and 3506*b*. A shape and size of a connection member with a core may be easily designed by machining the core member, and therefore, they are optimized depending on a required embodiment. Therefore, a construction as shown in FIG. 35 can be easily realized by the connection member with a core.

The connection member 3500 has a small size. Further, in the same footprint, a maximum number of the U/L-shaped side wirings which can be formed in the connection member 3500 is larger than a maximum number of vias which can be formed in a connection member with vias. Therefore, the connection member 3500 can reduce an area required for connection and it can be connected to a printed board with a fine pitch. Connection of the connection member 3500 to the printed boards 3506*a* and 3506*b* may be made using a known mounting technique (such as a solder mounting and a mounting with use of a conductive adhesive). Therefore, the connection member 3500 can be used as a member for constituting a mount assembly without involving new investment in plant and equipment. A connection method for connecting the connection member 3500 to the printed circuit board 3506*a* may be different from the connection method for connecting the connection member 3500 to the printed circuit board 3506*b*. For example, the former may be a method wherein an anisotropic conductive film is used, and the latter may be a reflow soldering method.

The connection member 3500 may be easily dimensioned into a normal size of a chip part (for example, so called "1005" or "1608"). The connection member of such a size may be mounted on a printed board using a conventional mounting apparatus and may be placed at any position, whereby, a short wiring connection can be made and freedom of design a the mount assembly is increased.

Figure 37:
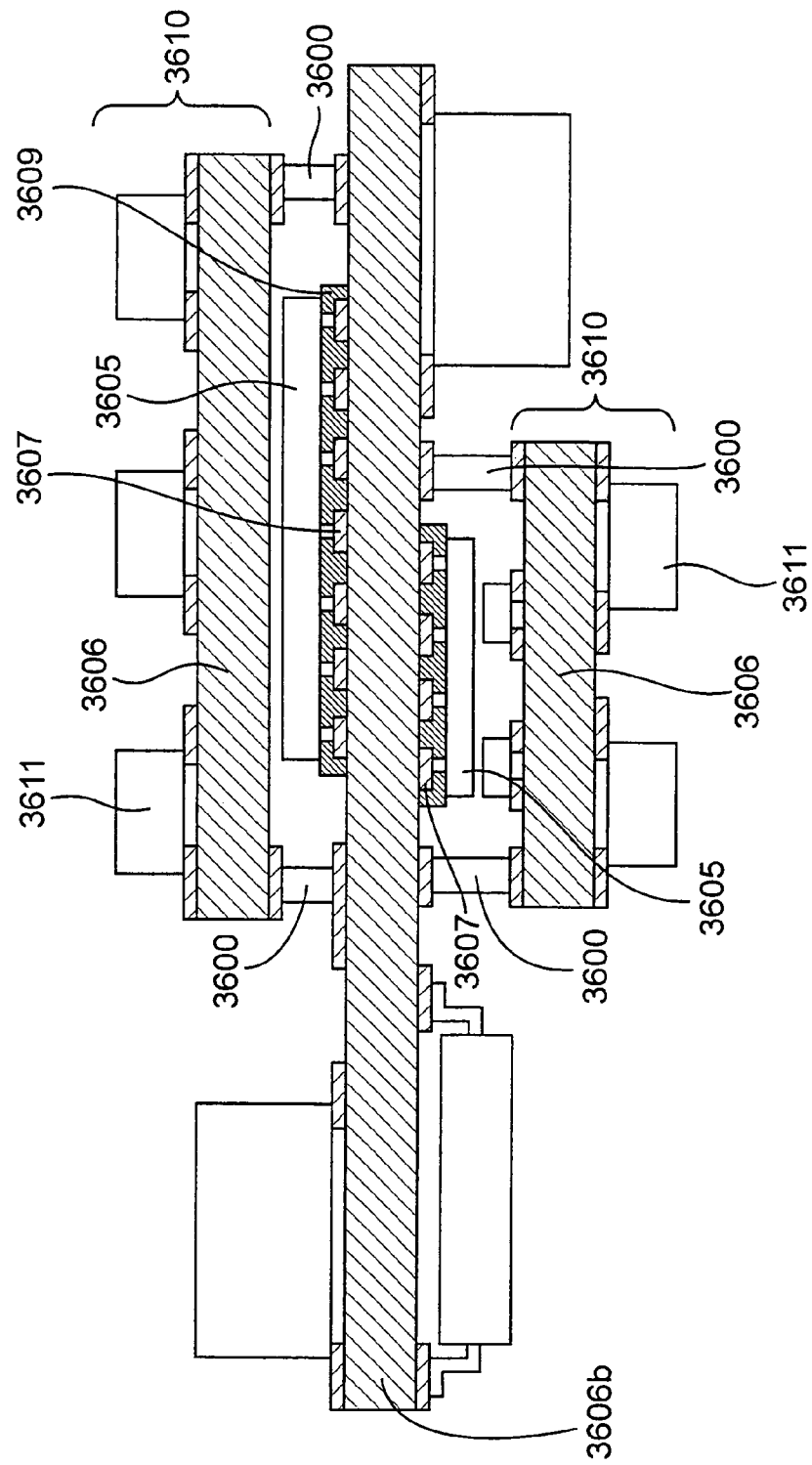
FIG. 37 is a sectional view which schematically shows a construction of mount assembly 3610 in accordance with an embodiment of the present invention.

Further, as shown in FIG. 37, a construction can be realized, wherein a plurality of component mount assemblies 3610 (wherein electronic components 3611 are mounted) are mounted on a single printed board 3606b using a plurality of connection members 3600 of the present invention. Thereby, a higher mounting density can be achieved depending on design and component height. In the illustrated embodiment, the component mount assemblies 3610 are constructed so that the printed board 3606 is connected on an upper surface of the connection member 3600 and the electronic components 3611 are mounted on the printed board 3606. A semiconductor device 3605 is mounted on the printed board 3606b and is placed within a space defined by connection member 3600 and a lower surface of the printed board 3606. The semiconductor device 3605 is connected to bumps 3607 on a surface of the printed board 3606b and an underfilling 3609 is formed. Although four connection members are shown in FIG. 37, the number of the connection members is not limited. Further, the electronic component constituting the mount assembly may not be limited to a semiconductor device, and may be another electronic component such as a chip part.

Embodiment 8

A method for continuously producing a connection member with a core is described with reference to FIG. 38. FIG. 38 schematically shows steps in the method for producing the connection member with a core. The connection member of the present invention can be continuously produced by a method which includes a step wherein a roller is employed.

As shown in FIG. 38, a carrier sheet 3704 which has a wiring layer 3702 (which includes a portion to be a U/L-shaped side wiring) formed by processing a metal layer is supplied from a roller 3712. A resin layer 3701b is formed on a surface of the wiring layer which is moving together with the carrier sheet toward the right side in the figure, by applying a resin 3701 using a blade 3713 into a constant thickness. As a result, a laminate covered with a resin layer 3715 is obtained which includes a carrier sheet 3704, a wiring layer 3702 and a resin layer 3701b. Next, a core member 3073 is supplied on a resin layer side, and the laminate 3715 is bent so as to wrap the core member 3703 at a position indicated by an arrow 3714 into a desired shape as shown at the right end in the figure. Subsequently, the resin is cured by being heated and pressurized. After curing the resin, the laminate is cut at a position indicated by an arrow 3716, As a result, a connection member with a core of the present invention is obtained. This cutting may be performed before curing the resin. The illustrated method shows how to continuously perform the third production method which is described with reference to FIG. 32. When many U/L-shaped side wirings are formed at the same time in the connection member produced by this method, the connection member may be optionally divided into two or more connection members.

The production method shown in FIG. 38 can be applied to the fourth production method. In that case, a resin layer is formed around a core member 3703 by applying a resin 3701 to the core member 3703, and the resin is not applied to the carrier sheet 3704. Further, a laminate of the carrier sheet 3704 and the wiring layer 3702 is bent into a predetermined shape at a position indicated by the arrow 3714 so as to cover the core member 3703 which is covered with the resin layer, and then the resin is cured by heating.

In a variation of the production method shown in FIG. 38, instead of applying a resin, a resin in a sheet form may be laminated on the wiring layer or may be placed around the core member.

The production method shown in FIG. 38 may be also applied to the first method which is described in connection with the first embodiment. In that case, a connection member without a core may be obtained by bending a laminate covered with a resin layer without supplying a core member.

The production method shown in FIG. 38 is advantageous since it makes possible continuous production of the connection member using the roll and a necessary conveying device is simple. Further, the continuous production of the connection member contributes to a shorter waiting time of a manufacturing apparatus and less work force compared with a batch-type production.

Embodiment 9

A method for producing a large number of connection members with a core at the same time is described with reference to FIGS. 39(a)-39(g). This production method shown in FIGS. 39(a)-39(g) corresponds to a "fifth production method."

Firstly, a laminate including a carrier sheet 3804 and a metal layer 3802 formed thereon is prepared as shown in FIG. 39(a). Next, as shown in FIG. 39(b), a wiring layer 3802 is formed by a conventional processing method. The wiring layer 3802 includes many portions which are to be U/L-shaped side wirings so that, when the laminate is bent at a plurality of positions, each of the portions makes a U/L-shaped side wiring at each bent position. FIGS. 39(a) and 39(b) correspond to the step (5-A) of the fifth production method.

Next, as shown in FIG. 39(c), step (5-B) of bending the laminate is performed so that the wiring layer 3802 is inside. This step may be performed by, for example, press working. This bending is performed such that the U/L-shaped side wirings are formed at a plurality of positions, and the wiring after bending forms a concave portion 3808 as shown in FIG. 39(c).

Next, as shown in FIG. 39(d), step (5-c') of introducing a resin 3801 which is to form an electrically insulating layer is performed, and then step (5-c") of inserting a core member 3803 into this introduced resin within the concave portion is performed. Thereafter, as shown in FIG. 39(e), the resin is cured to form insulating layer 3801 (step (5-D)). Finally, as shown in FIG. 39(f), step (5-E) of removing the carrier sheet 3804 is performed so as to obtain each connection member 3800. The resin is introduced in an amount to form the insulating layer between the core member and the wiring layer. The connection member shown in FIG. 39(f) may be optionally divided into two or more connection members. Insertion of the core member shown in FIG. 39(d) may be performed using a frame-type core member 3820 wherein core members 3803 are formed together as shown in FIG. 39(g), whereby many core members can be easily inserted in the concave portions 3808 at the same time.

This production method is advantageous particularly when a plurality of (particularly, many) many connection members are produced at the same time. This production method may be performed for producing a connection member without a core. In that case, step (5-C) of pouring the resin into the concave portion is performed to fill the concave portion with the resin without inserting a core member. Alternatively, in the fifth production method, the laminate may not necessarily be bent so as to form the concave portion, but it may be bent so that the at least one wiring forms a rectangular ring (that is, two U/L-shaped side wirings are formed in a final module). Alternatively, the laminate may be bent within an appropriate metal tool and a space between the wiring portions may be closed by the metal tool and the carrier sheet. When any place in the carrier sheet does not communicate with a space formed by the bending (that is, a space formed by bending the laminate is completely enclosed by the laminate and/or the metal tool), a hole for injecting the resin (and for inserting the core member, if necessary) is formed in the laminate or the metal tool and the resin (and the core member, if necessary) is put in the space. By selecting an appropriate folding manner, the U/L-shaped side wirings can be disposed on two or more side surfaces (for example, all of four side surfaces) of a hexahedron.

Embodiment 10

Figure 40:
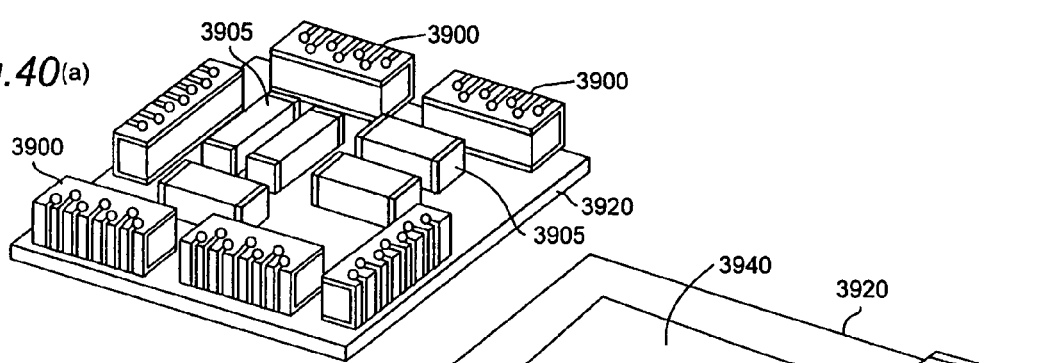
FIGS. 40(a) and 40(b) are perspective views of a sub-board on which a connection member of the present invention is mounted, and a circuit board on which the sub-board is mounted.
Figure 40:
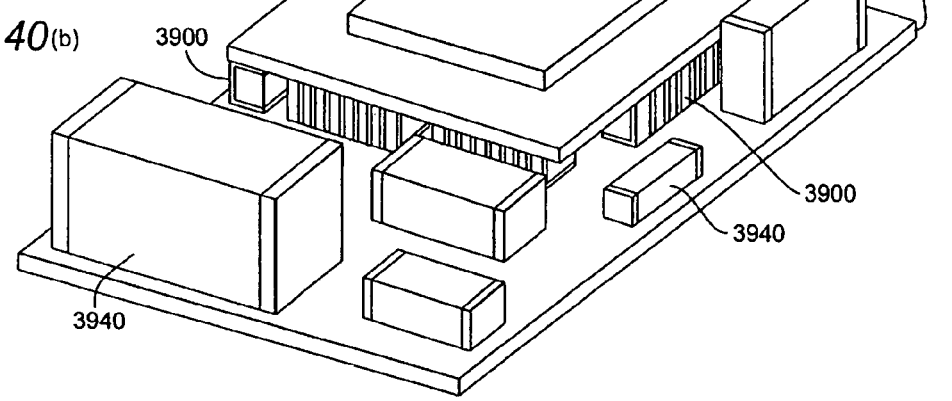

In FIG. 40(a), a sub-board 3920 including a connection member of the present invention is schematically shown in perspective view. The sub-board 3920 shown in FIG. 40(a) has six connection members 3900 which are mounted on a peripheral region of one surface thereof, and five electronic components 3905 which are mounted on an internal region. Each of the connection members is a connection member with a core. A wiring pattern is formed on the sub-board (not shown) and the electronic components and the connection members are connected in a predetermined manner. A component (for example, a circuit component) may be mounted on another surface of the sub-board.

FIG. 40(b) schematically shows that the sub-board shown in FIG. 40(a) is reversed and mounted on another circuit board 3930. Various other electronic components 3940 are mounted on the circuit board 3930. The sub-board shown in FIG. 40(a) has a circuit component 3940 (not seen in FIG. 40(a)) mounted on a surface where the connection members are not mounted. The sub-board 3920 and the circuit board 3930 are electrically connected by the connection members 3900. In this illustrated embodiment, heights of the connection members 3900 are preferably constant for better connection between the sub-board 3920 and the circuit board 3930. In a connection member with a core, the core member contributes to shape retainment. Therefore, a connection member having a relatively uniform shape can be mass-produced by making a core member of same dimensions. Therefore, a plurality of connection members with cores are suitable for use at the same time as shown in FIGS. 40(a) and 40(b).

Embodiment 11

An interposer which is an embodiment of the connection member of the present invention is described below. A basic construction is the same as that of a connector sheet which is described above. Therefore, it should be noted that a description as to the matter described in the first embodiment may be omitted.

Figure 41:
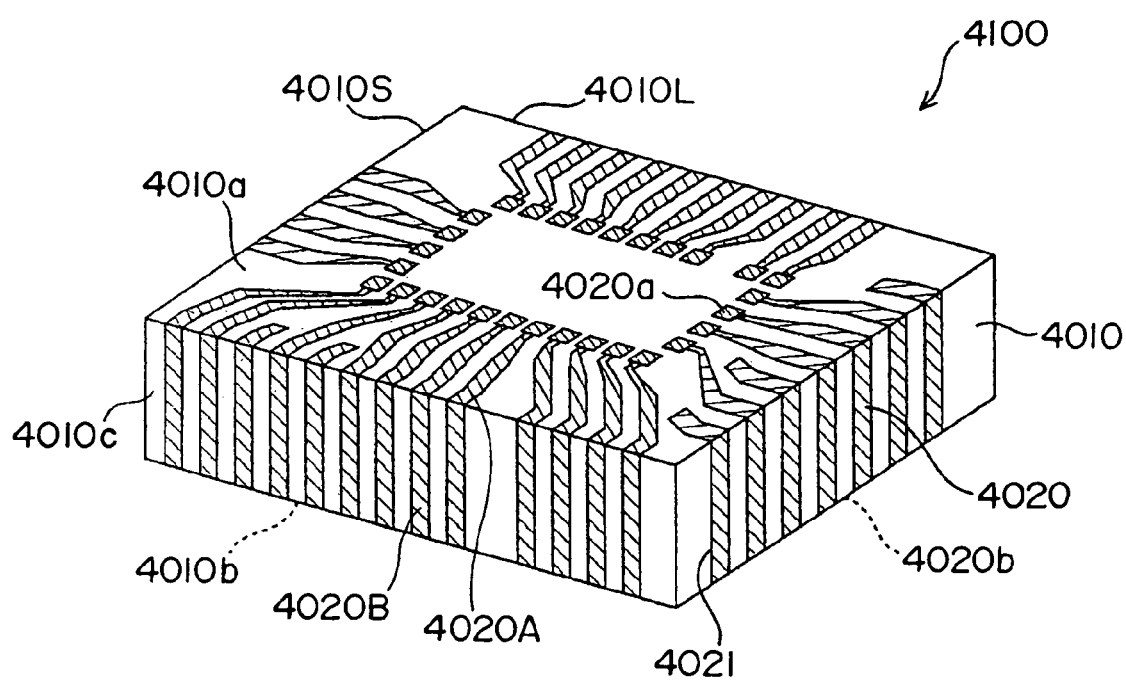
FIG. 41 is a perspective view schematically showing an interposer 4100 in accordance with an embodiment of the present invention.

FIG. 41 schematically shows an interposer of the present invention in perspective view. An illustrated interposer 4100 includes a rigid substrate 4010 as an electrically insulating plate substrate, and a plurality of U/L-shaped side wirings 4020. The rigid substrate 4010 has an upper surface 4010a, a lower surface 4010b which is opposite to the upper surface 4010a and a side surface 4010c which is adjacent and connects the upper surface 4010a and the lower surface 4010b. Each of the U/L-shaped side wirings 4020 has an upper-surface portion 4020A, a lower-surface wiring portion (not shown) and a side-surface portion 4020B. An end portion of the upper-surface wiring portion 4020A is connected to a land 4020a which is a terminal, and an end portion of the lower-surface wiring portion is connected to a land 4020b which is a terminal.

As shown in FIG. 41, in the interposer 4100, electrical conduction between the upper surface 4010a and the lower surface 4010b of the rigid substrate 4010 is made only by the U/L-shaped side wirings 4020. Therefore, in this interposer, the rigid substrate 4010 has no vias which ensure electrical conduction between the upper surface 4010a and the lower surface 4010b.

The interposer 4100 may be, for example, an organic interposer which is formed of a material containing an organic material and the rigid substrate 4010 may be formed of a composite material containing a resin (for example, a thermosetting resin and/or a thermoplastic resin) and an inorganic filler. In this embodiment, the thermosetting resin is employed as the resin. In this embodiment, the rigid substrate 4010 may be formed of only the thermosetting resin without using the inorganic filler. Further, the thermosetting resin may be, for example an epoxy resin. In a case where the inorganic filler is added to the resin, a filler of $Al_2O_3$, $SiO_2$, MgO, BN or AlN may be used. By adding the inorganic filler, various properties of the rigid substrate can be controlled. For this reason, the rigid substrate is preferably formed of the composite material containing the inorganic filler. In another embodiment, the rigid substrate may be formed of a ceramic material. Further, a resist layer may be provided on a surface of the rigid substrate 4010 and thereby a short circuit of solder can be prevented.

The wirings 4020 may be formed by etching a copper foil and a thickness of the wirings 4020 may be in a range of about 3 µm to about 50 µm. A number of the wirings 4020 may be at least sixteen. In the interposer shown in FIG. 41, thirty U/L-shaped side wirings 4020 are provided. In the interposer shown in FIG. 41, a plurality of (for example, four) dummy wirings 4021, each of which is not connected to either terminal 4020a or 4020b, is formed. The dummy wirings 4021 serve to even a wiring density. The dummy wirings can be utilized as a wiring for examination. Further, the dummy wirings 4021 are used for examination of matching between the interposer 4100 and a printed board to which the interposer 4100 is mounted. Alternatively, a constant (for example, a characteristic impedance) of the interposer and/or a circuit board can be adjusted by mounting a test component (for example, a component for adjusting a circuit constant). The test component (or the component for adjusting a circuit constant) may be a chip component (such as a chip inductor, a chip resistor and a chip capacitor), and the component may be removed in a final product stage or may remain.

A maximum number of the wirings 4020 depends on a dimension of the interposer 4100, and it is determined in consideration of line and space (L/S) of the side-surface wiring portions and the upper-surface wiring portions of the wirings 4020. For example, the maximum number of the U/L-shaped side wirings 4020 may be about five hundred in an interposer which is adapted to a general mounting area. Of course, more than five hundred U/L-shaped side wirings 4020 may be provided. In that case, it is desired that an area of the interposer 4100 and a number of the U/L-shaped side wirings are balanced, and the area of the interposer avoids being too large in order for the interposer to play its primary role as an intermediate board.

In the interposer 4100 shown in FIG. 41, lands 4020a are arranged in a peripheral region of the upper surface 4010a of the rigid substrate 4010. That is, in this interposer, ends (lands) of the U/L-shaped side wirings 4020 are arranged in a peripheral manner corresponding to a terminal arrangement of a bare chip so that the bare chip (a bare IC) is mounted on the upper surface 4010a of the rigid substrate 4010. An arrangement of lands 4020 on the lower surface 4010b of the rigid substrate 4010 may correspond to a terminal arrangement of a printed board (such as a mother board) where the interposer 4100 is mounted. For example, the lands 4020b may be arranged in a grid pattern. Specifically, the lands 4020b may form a land grid array (LGA) or a ball grid array (BGA) by attaching solder balls to the lands 4020b. In this illustrated embodiment, the U/L-shaped side wirings 4020 and the lands 4020a and 4020b may be formed together from, for example, a copper foil.

A dimension of the interposer 4100 depends on a size of a surface mount component which is to be mounted on the interposer 4100, a size of a printed board where the interposer 4100 is mounted, and a line-space and a number of wirings on the interposer 4100 and it is not limited to a particular one. In the illustrated construction, an upper surface area of the rigid substrate 4010 may be at most 200 mm$^2$, and the number of the terminals connected to the U/L-shaped side wirings 4020 may be at least sixteen on the upper surface. This dimension and terminal number are exemplary ones. The interposer 4100 shown in FIG. 41 has thirty terminals connected to the U/L-shaped side wirings 4020.

In the interposer 4100, the rigid substrate 4010 is an approximate hexahedron and the upper surface 4010a of the rigid substrate 4010 is an approximate rectangle. The meanings of the "approximate hexahedron" and the "approximate rectangle" are described above. A shape of the interposer may have a curved surface, and a strictly geometrical shape does not have much significance for the interposer, as long as a function of the interposer is ensured. Therefore, although the rigid substrate is illustrated as a hexahedron without any curve in FIG. 41, a side surface of the rigid substrate may be a curved surface in another embodiment. When the interposer is produced according to a method described below, the side surface tends to be curved. Thus, the U/L-shaped side wirings may be easily formed if this curved side surface is acceptable.

In the illustrated embodiment, the upper surface 4010a of the rigid substrate 4010 is an approximate rectangle consisting of long sides 4010L and narrow sides 4010S. A length of the long sides 4010L may be, for example, three times a length of the narrow side 4010S. In this embodiment, a width of a portion of the wirings 4020, which portion is disposed on the side surface 4010c of the rigid substrate 4010, is at most 0.25 mm and a space between the wirings 4020 on the side surface 4010c is at most 0.3 mm. A thickness of the rigid substrate 4010 is, for example, in a range of about 0.1 mm to 2 mm.

As described in connection with the first embodiment, it is necessary to employ a square substrate in order to form as many through holes (or vias) as possible in the interposer. In other words, it is impossible to form more through holes in a substrate of an oblong rectangular shape or an elliptical shape compared to the square substrate. To the contrary, in a case of the interposer 4100 of the present invention, the U/L-shaped side wirings 4200 can be arranged by defining the line-space (L/S) of the U/L-shaped side wirings 4020. Therefore, it is possible to form many U/L-shaped side wirings 4020 not only in the square substrate, but also in a rectangular substrate (for example, a rectangle wherein the length of the long side 4010L is at least 1.4 times the length of the narrow side 4010S) effectively.

In the interposer shown in FIG. 41, the U/L-shaped side wirings 4020 are disposed on every side surface of hexahedral rigid substrate 4010 in order that more U/L-shaped side wirings 4020 are formed. A position and a number of the U/L-shaped side wirings are not limited to the illustrated embodiment. For example, the U/L-shaped side wirings 4020 may be only on the side surfaces adjacent the long sides 4010L, and not on the side surfaces adjacent the narrow side 4010S, since more U/L-shaped side wirings 4020 can be arranged on the side surface adjacent the long side 4010L than on the side surface adjacent the narrow side 4010S.

Figure 42A:
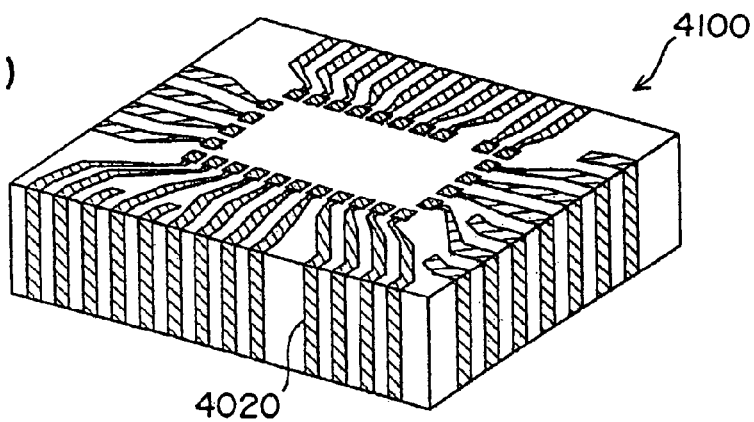
FIG. 42(a) is a perspective view schematically showing an interposer 4100 of the present invention.
Figure 42B:
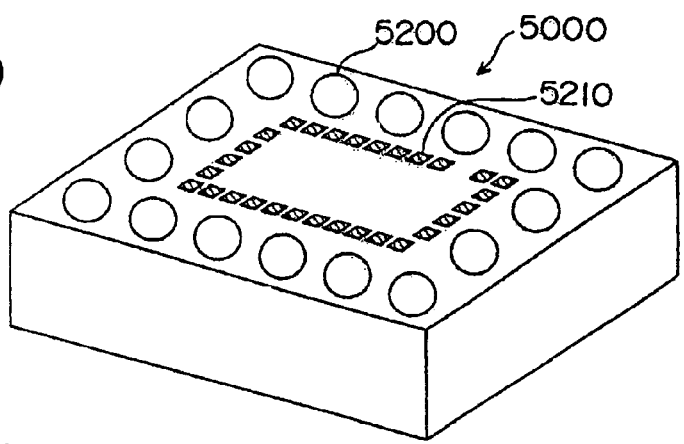
FIG. 42(b) is a perspective view schematically showing an interposer with vias 5000.
Figure 42C:
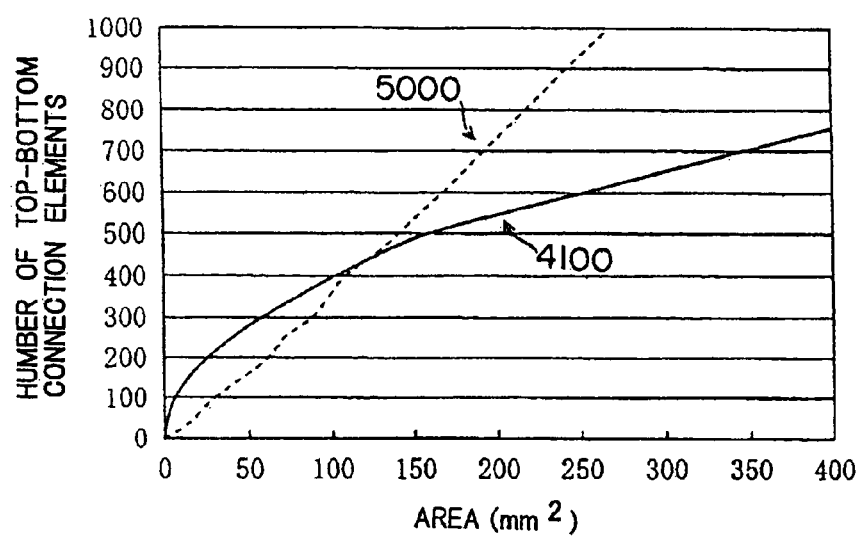
FIG. 42(c) is a graph which shows a relationship between an upper surface area of an interposer and a number of top-bottom connection elements between the upper and lower surfaces.

Further, referring to FIGS. 42(a)-42(c), the interposer 4100 of the present invention is compared with an interposer with a via 5000 wherein vias 5200 (through holes) are formed.

FIG. 42(a) schematically shows a construction of the interposer of the present invention and FIG. 42(b) schematically shows a construction of the interposer with a via 5000. In both of FIGS. 42(a) and 42(b), a mounting surface for a semiconductor chip is shown as an upper surface. In the embodiment shown in FIG. 42(b), lands 5200 connected to the vias and terminals 5210 (terminals for mounting the semiconductor chip) arranged in a peripheral pattern are shown on the upper surface of the interposer 5000. FIG. 42(c) shows a relationship between an area (mm$^2$) of the upper surface of the interposer and a number of connection elements (i.e. the wirings 4020 or the vias 5200) which connect the upper surface and the lower surface. A solid line in FIG. 42(c) is a curve as to the interposer 4100 of this embodiment shown in FIG. 42(a), and a dotted line in FIG. 42(c) is a curve as to the interposer with a via 5000 shown in FIG. 42(b).

For convenience of comparison, shapes of the upper and lower surfaces of the interposers shown in FIGS. 42(a) and 42(b) are made square. This square shape is most advantageous to the interposer with a via shown in FIG. 42(b). A line-space of the wirings 4020 shown in FIG. 42(a) is 0.05 mm/0.05 mm on the side surface, and a pad pitch of the vias 5200 shown in FIG. 42(b) is 0.5 mm.

As to the interposer shown in FIG. 42(b), a line-space (L/S) of the wirings which extend from the terminals 5210 should be considered as a constraint, but the constraint imposed by the wirings extended from the terminals 5210 is not considered in FIG. 42(b) for simplifying a discussion. Further, since each via 5200 is required to be connected to a land in an actual interposer, the "via" 5200 used herein means the "land." Therefore, the size of the mounting surface for a semiconductor chip, which is shown in FIG. 42(b), is determined by a land diameter and a space between the lands. Furthermore, in both of the interposers shown in FIGS. 42(a) and 42(b), a board mounting surface, which is the lower surface of the interposer, requires lands adapting to a circuit board. However, constraints for forming a land on the lower surface would be the same as those for forming a land on the upper surface. Therefore, a comparison between the interposers shown in FIGS. 42(a) and 42(b) is discussed based on the constraints for the semiconductor chip mounting surface (the upper surface).

Under such a condition, a relationship between an area and a number of connection elements for two interposers (4100 and 5000) is as illustrated in a graph shown in FIG. 42(c). As shown in FIG. 42(c), as the area of the interposer is smaller (about at most 120 mm$^2$), the number of the connection elements (i.e. the number of U/L-shaped side wirings) is larger in the interposer 4100 than those (the number of vias) in the interposer 5000.

In FIG. 42(c), both interposers are compared for an area of 50 mm$^2$, the number of vias formed in the interposer 5000 is about 150, while the number of U/L-shaped side wirings is about 300 in the interposer 4100 according to the present invention. Results shown in FIG. 42(c) are those for an interposer having a square upper surface. For an interposer having an oblong rectangular upper surface, as a ratio of long side to narrow side is larger, an interposer of the present invention can be provided with more connection elements (U/L-shaped side wirings) within a smaller area as compared to an interposer with vias.

Construction of the connection member of the present invention makes it possible to form many connection elements (that is, the U/L-shaped side wirings) between the upper and the lower surfaces in the interposer having a smaller area, whereby an interposer with a smaller mounting area which is adapted to a fine pitch and a high pin count can be obtained. Further, as the area of the interposer 4100 of the present invention is smaller, it represents an excellent characteristic since a path of the U/L-shaped side wirings 4020 becomes shorter. In other words, when the area of the interposer 4100 is small, a line length of the U/L-shaped side wirings becomes short, which provides an advantage that propagation delay of a signal wiring is eliminated or reduced. From this view point, the area of the upper surface 4010a of the rigid substrate 4010 in the interposer 4100 of this embodiment may be preferably at most 200 mm$^2$.

Figure 43:
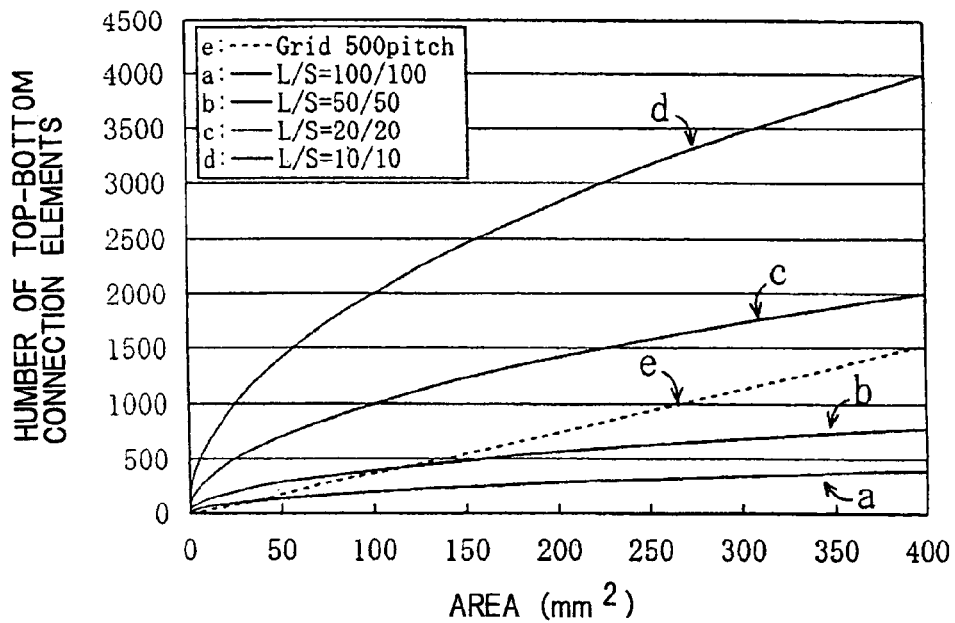
FIG. 43 is a graph which shows a relationship between an upper surface area of an interposer and a number of top-bottom connection elements for each line/space.

FIG. 43 is a graph showing numbers of connection elements (that is, the U/L-shaped side wirings 4020) in the interposer 4100 for different line-spaces of the side-surface wiring portions of the U/L-shaped side wirings 4020. Curves "a", "b", "c" and "d" in FIG. 43 correspond to the interposers wherein the line-spaces (unit; μm) of the U/L-shaped side wirings are 100/100, 50/50, 20/20 and 10/10, respectively. Curve "e" (indicated by a dotted line) in FIG. 43 corresponds to the interposer with vias shown in FIG. 42(b) wherein a pitch of its via grid is 500 μm. The curves "b" and "e" shown in FIG. 43 correspond to the solid line and the dotted line shown in FIG. 42(c), respectively. Each curve shown in the graph of FIG. 43 illustrates a relationship between an area and a number of the connection elements for an interposer of a square shape, similarly to the interposer shown in FIG. 42.

As apparent from FIG. 43, an interposer wherein L/S is 20/20 (curve "c") and an interposer wherein L/S is 10/10 (curve "d") can be provided with more connection elements within a certain area compared to the interposer with vias over an entire x-axis region. An interposer wherein L/S is 100/100 (curve "a") can be provided with more connection elements compared to the interposer with vias in an area of at most 30 mm$^2$. A comparison of the curves "c", "d" and "e" at an area of 200 mm$^2$ shows that values (the number of the connection elements) of the curves "c" and "d" are respectively about 1.9 times and about 3.8 times the value of the curve "e." A comparison of the curves "c", "d" and "e" at an area of 100 mm$^2$ shows that values (the number of the connection elements) of the curves "c" and "d" are respectively about 2.7 times and about 5.5 times the value of the curve "e."

Figure 44:
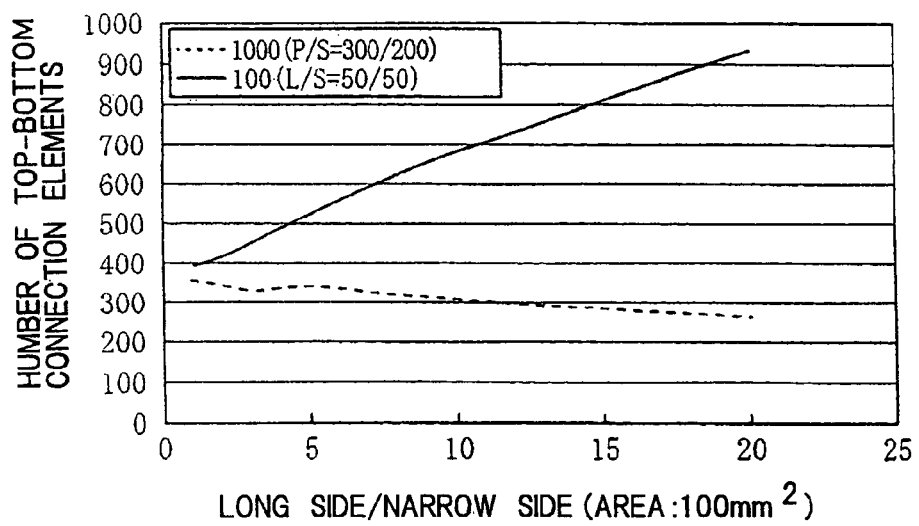
FIG. 44 is a graph which shows a relationship between a ratio of long side/narrow side on an upper surface of an interposer and a number of top-bottom connection elements for each line/space.
Figure 45:
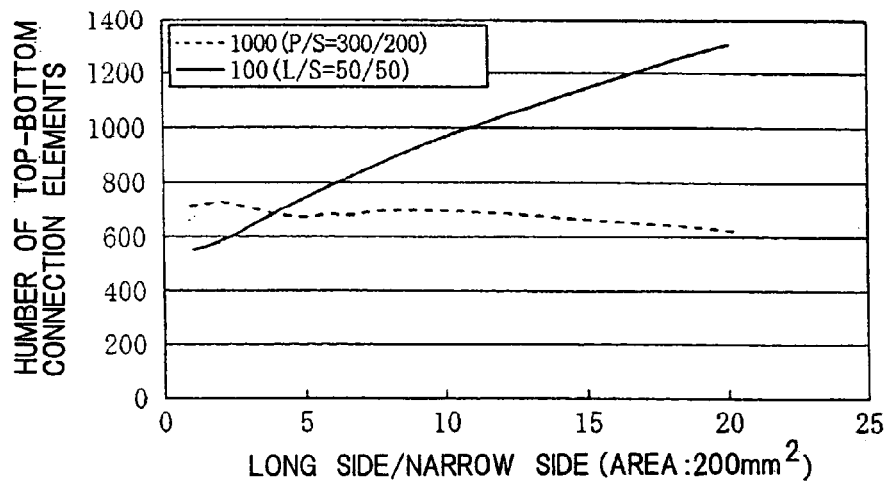
FIG. 45 is a graph which shows a relationship between a ratio of long side/narrow side on an upper surface of an interposer and a number of top-bottom connection elements for each line/space.
Figure 46:
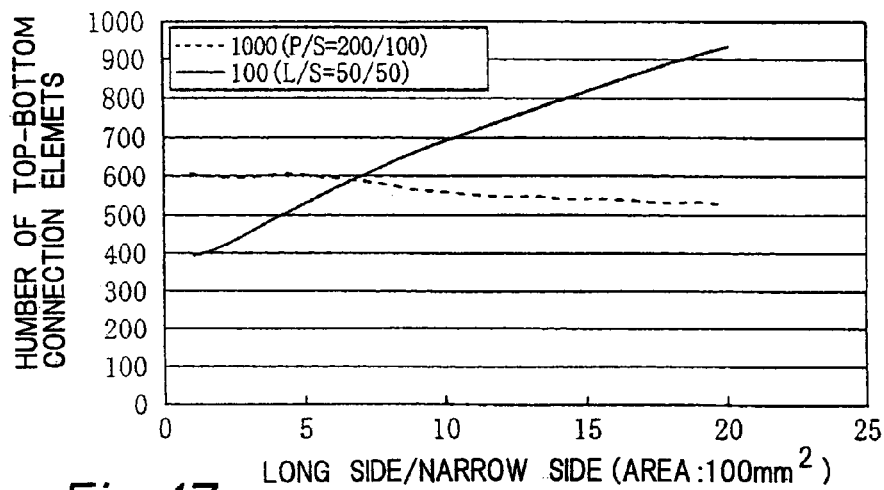
FIG. 46 is a graph which shows a relationship between a ratio of long side/narrow side on an upper surface of an interposer and a number of top-bottom connection elements for each line/space.

Next, an advantage of the interposer according to the present invention which is achieved when a shape of the interposer is a rectangle is described with reference to FIGS. 44 to 46. Each of FIGS. 44 to 46 is a graph wherein a horizontal axis represents a ratio of long side to narrow side on the upper surface of the interposer and a vertical axis represents a number of top-bottom connection elements. In any of FIGS. 44 to 46, a solid line represents the interposer shown in FIG. 42(a), and a dotted line represents the interposer with vias shown in FIG. 42(b). The graphs of FIGS. 44 and 46 are obtained when the area of the upper surface of the interposer is fixed to 100 mm$^2$, and the graph of FIG. 45 is obtained when the area of the upper surface of the interposer is fixed to 200 mm$^2$.

In FIG. 44, a solid line represents the interposer 4100 wherein a line/space (unit; μm) is 50/50, and a dotted line represents the interposer 5000 wherein a pad/space (unit; μm) is 300/200. In FIG. 45, the solid line represents the interposer 4100 wherein a line/space is 50/50, and the dotted line represents the interposer 5000 wherein the pad/space is 300/200. In FIG. 46, the solid line represents the interposer 4100 wherein the line/space is 50/50, and the dotted line represents the interposer 5000 wherein the pad/space is 200/100.

The graphs shown in FIGS. 44 to 46 illustrate that as a ratio of long side/narrow side is larger (that is, a shape is more elongated), more connection elements can be formed in the interposer 4100, while a possible number of vias is decreased in the interposer 5000.

In a case of a liquid crystal display (LCD) driver IC, the ratio of long side/narrow side may be often at least ten. Therefore, the interposer 4100 of the present invention may be suitable for such an elongated semiconductor chip.

Figure 47:
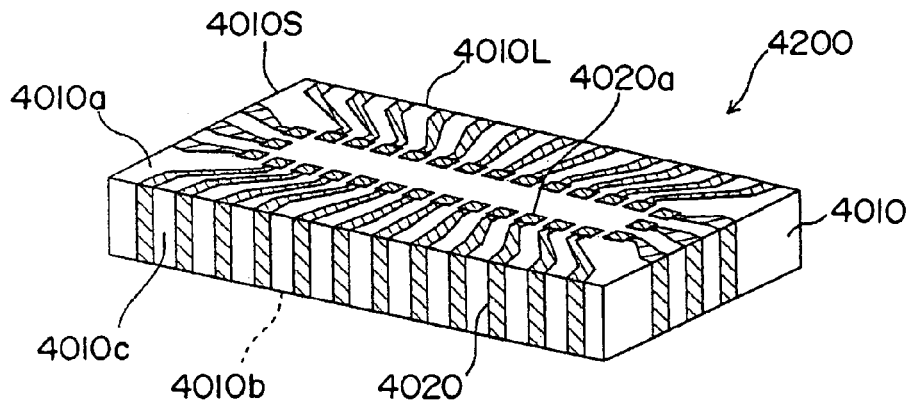
FIG. 47 is a perspective view schematically showing an interposer 4200 in accordance with an embodiment of the present invention.

FIG. 47 schematically shows a construction of an interposer 4200 suitable for combination with an elongated semiconductor chip. In rigid substrate 4010 of the interposer 4200 shown in FIG. 47, a length of a long side 4010L may be, for example, ten times a length of a narrow side 4010S. Herein, lands 4020a, which are terminals connected to U/L-shaped side wirings 4020, are arranged in a peripheral region of an upper surface 4010a of the rigid substrate 4010. Other elements denoted by other reference numerals are as described in connection with FIG. 41.

Figure 48:
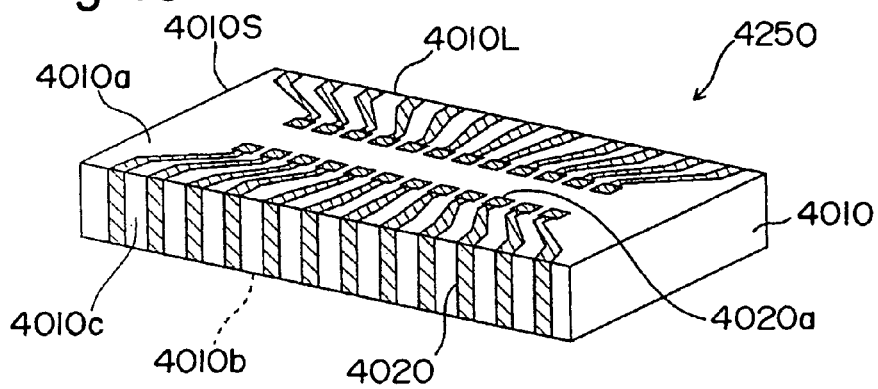
FIG. 48 is a perspective view schematically showing an interposer 4250 in accordance with an embodiment of the present invention.

FIG. 48 schematically shows an interposer 4250 which is a variation of the interposer 4200 shown in FIG. 47. In this interposer 4250, a U/L-shaped side wiring 4020 is not provided on a side surface adjacent narrow side 4010S. In a variation of the construction shown in FIG. 48, lands 4020a may be arranged along the narrow side 4010S as shown in FIG. 47 and U/L-shaped side wirings 4020 may be formed so that the wirings 4020 extend from the lands to a side surface 4010c adjacent long side 4010L.

Figure 49:
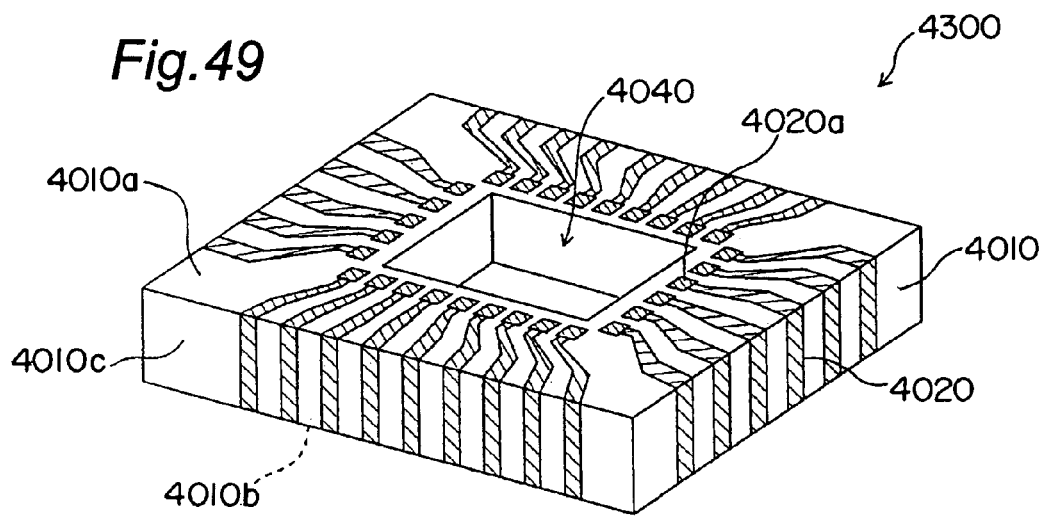
FIG. 49 is a perspective view schematically showing an interposer 4300 in accordance with an embodiment of the present invention.

A shape of upper surface 4010a of rigid substrate 4010 is not limited to a square or a rectangle, and may be another shape. FIG. 49 schematically shows a construction of an interposer 4300 wherein an upper surface 4010a (and a lower surface 4010b) of rigid substrate 4010 has a rectangular frame shape. In a center of the rigid substrate 4010 of the interposer 4300, an opening 4040 is formed, whereby the upper surface 4010a of the rigid substrate 4010 takes a rectangular frame shape when viewed from above. Terminals 4020a connected to U/L-shaped side wirings 4020 are formed around the opening 4040. The opening 4040 of the rigid substrate 4010 makes it possible to further mount a component on a region which is exposed from the opening 4040, thereby resulting in an increase in mounting area. Further, when a semiconductor chip is mounted on the interposer 4300, a rear surface of the semiconductor chip is exposed through the opening 4040 and thereby the opening 4040 can be used as a hole for cooling. In order to enhance a cooling function of the opening 4040, it is preferable that a through hole is formed in a circuit board which is beneath the opening 4040, or a notch or a bore which communicates with the opening 4040 is preferably formed in a portion of the interposer 4300. Alternatively, a shape of the rigid substrate 4010 may be a "U"-shape, not a rectangular frame shape. The rigid substrate 4010 of a rectangular shape may be produced by punching a solid rectangular rigid substrate.

Figure 50:
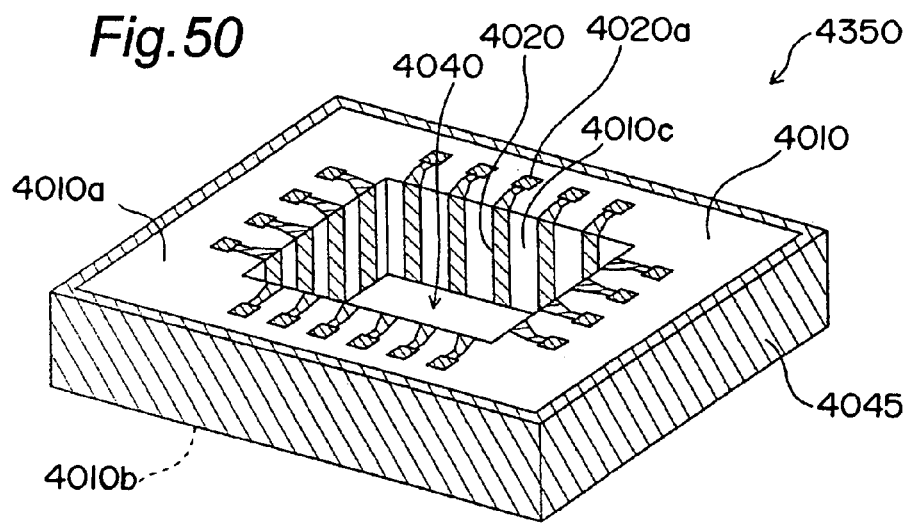
FIG. 50 is a perspective view schematically showing an interposer 4350 in accordance with an embodiment of the present invention.

FIG. 50 shows a construction of an interposer 4350 which is a variation of the interposer 4300 shown in FIG. 49. In the interposer 4300 shown in FIG. 49, the U/L-shaped side wirings 4020 are arranged on outer circumferential side surfaces 4010c. In the interposer 4350 shown in FIG. 50, side-surface wiring portions of U/L-shaped side wirings 4020 are placed on side surfaces 4010c which are wall surfaces (inner surfaces) of opening 4040 of rigid substrate 4010 having a square frame shape. Further, a shield layer 4045 (for example, a metal shield layer) is formed on an outer circumferential surface of the rigid substrate 4010. A shield function conferred by this shield layer 4045 can reduce noise.

Next, a production method for producing the interposer 4100 (or 4200 or 4250) is described with reference to FIG. 51 and FIGS. 52(*a*) to 54(*b*).

Figure 51:
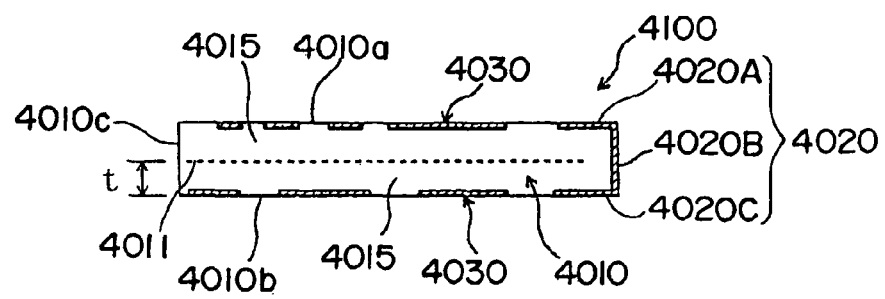
FIG. 51 is a sectional view schematically showing a construction of an interposer 4100 in accordance with an embodiment of the present invention.
Figure 52A:
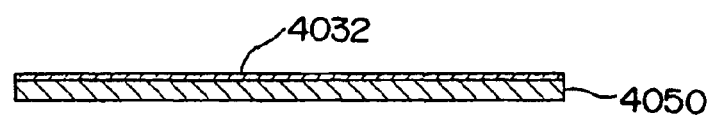
FIGS. 52(a) to 52(d) are sectional views which schematically show steps in a method for producing a member for forming a sheet 4015 containing a semi-cured resin.
Figure 52B:
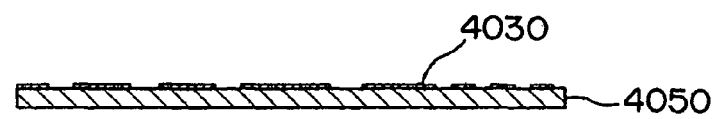
Figure 52C:
Figure 52D:
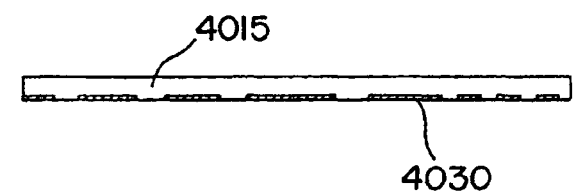

FIG. 51 and FIGS. 52(*a*) to 54(*b*) are the same as FIG. 10 and FIGS. 11(*a*) to 13(*b*) as described above except for the reference numerals. That is, also when the connection member of the present invention is provided as an interposer, the interposer is produced by a method similar to the production method of the connector sheet. Therefore, description as to matters which have been described above with reference to FIG. 10 and FIGS. 11(*a*) to 13(*b*) is simplified.

FIG. 51 schematically shows a sectional construction of an interposer produced by a production method shown FIGS. 52(*a*) to 54(*b*). This interposer has wiring patterns 4030 as electrical elements on upper surface 4010*a* and lower surface 4010*b* of rigid substrate 4010. U/L-shaped side wirings 4020 are formed as a part of the wiring pattern 4030. In FIG. 51, an overlapped plane of a sheet 4015 is indicated by a dotted line 4011 for easily understanding that the rigid substrate is formed by folding the sheet 4015. In FIG. 51, "t" corresponds to a thickness of the sheet 4015.

Figure 53A:
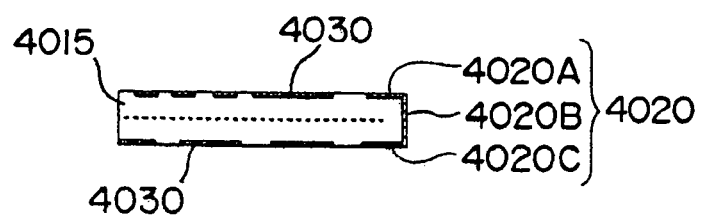
FIGS. 53(a) and 53(b) are sectional views which schematically show a folding step and a heating and pressurizing step.
Figure 53B:
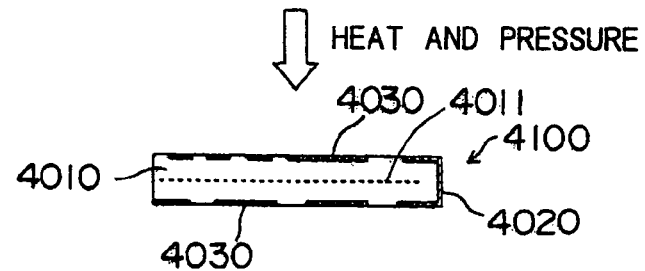

The production method shown in FIGS. 52(*b*) to 54(*b*) corresponds to a first production method. FIGS. 52(*a*) to 52(*d*) show step (1-A) of forming a sheet "A" including a wiring layer and an insulating layer containing a semi-cured resin. FIG. 53(*a*) shows step (1-B) of folding the sheet "A" 4015 and FIG. 53(*b*) shows the (1-C) of curing semi-cured resin.

FIG. 52(*a*) shows a step of preparing a laminate wherein a metal layer 4032 is laminated on one surface of a carrier sheet 4050. The metal layer 4032 may be formed of, for example, a copper foil and the carrier sheet may be formed of, for example, a metal foil (such as a copper foil or an aluminum foil) or a resin sheet. Thicknesses of the metal layer 4032 and the carrier sheet 4050 may be, for example, in a range of about 3 μm to about 50 μm and in a range of about 25 μm to about 200 μm, respectively.

FIG. 52(*b*) shows a step of forming wiring layer 4030 having a predetermined pattern by processing the metal layer 4032. This processing method has been described above and it is omitted here.

FIG. 52(*c*) shows a step of forming an insulating layer 4015 by applying a resin to the carrier sheet 4050. The resin may be an insulating thermosetting resin and/or an insulating thermoplastic resin. A semi-cured hardening resin is particularly preferably used and a semi-cured thermosetting resin is more particularly preferably used. The resin may contain a filler as described above. Thickness "t" of the insulating layer 4015 may be, for example, in a range of about 50 μm to 100 μm. An appropriate material for the insulating layer is as described above in connection with the first embodiment, and therefore, details thereof are omitted. Further, in a case where the insulating layer is formed of a composite material of a thermosetting resin and an inorganic filler, a mixing ratio of the thermosetting resin and the inorganic filler, and a preferable inorganic filler and a tendency of property changing by addition of the inorganic filler are as described above in connection with the connector sheet of the first embodiment, and therefore details thereof are omitted.

FIG. 52(*d*) shows a step of obtaining a sheet of the insulating layer 4015 having the wiring layer 4030 by removing the carrier sheet 4050. In this illustrated method, a folding step is performed after removing the carrier sheet. Alternatively, the folding step may be performed without removing the carrier sheet and then the carrier sheet may be removed.

FIG. 53(*a*) shows a step of folding the sheet of the insulating layer 4015. In this illustrated embodiment, the sheet is bent in half. That is, the insulating layer 4015 is folded such that parts thereof are opposed to and contact each other on a plane indicated by the dotted line 4011, and portions 4020A and 4020C of at least one wiring 4020 constituting the wiring layer become an upper-surface wiring portion and a lower-surface wiring portion which face each other across the insulating layer 4015, and another portion 4020B of the at least one wiring becomes a side-surface wiring portion which extends on a side surface of the folded insulating layer 4015. Therefore, the wiring 4020 consisting of the upper-surface wiring portion 4020A, the lower-surface wiring portion 4020C and the side-surface wiring portion 4020B constitutes at least one wiring which extends from the upper surface to the lower surface of the insulating layer 4015 through the side surface of the insulating layer 4015, that is, a U/L-shaped side wiring.

FIG. 53(*b*) shows a step of heating and pressurizing the construction shown in FIG. 53(*a*). After this step, overlapped parts of the insulating layer become one rigid substrate 4010 and thereby interposer 4100 is obtained. In FIG. 53(*b*), the contact plane 4011 of the insulating layer is indicated by the dotted line; however, an overlapped plane may not exist distinctly after curing.

Figure 54A:
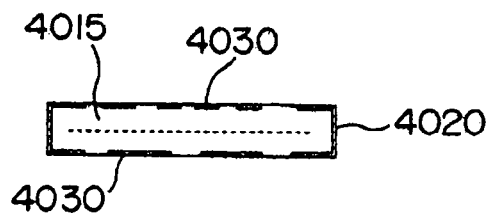
FIGS. 54(a) and 54(b) are sectional views which schematically show a folding step and a heating and pressurizing step.
Figure 54B:
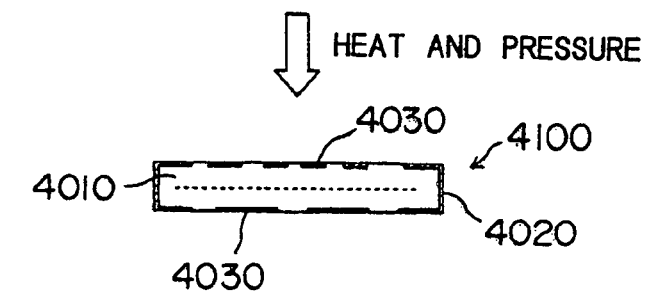

The interposer 4100 may be formed into another configuration depending on a folding manner of the sheet of the insulating layer 4015. For example, the sheet may be folded together with the wiring layer at two positions and then heated and pressurized as shown in FIG. 54(*a*). As a result, produced is an interposer wherein U/L-shaped side wirings 4020 exist on two side surfaces as shown in FIG. 54(*b*). Also in FIG. 54(*b*), a contact face of the insulating layer is indicated by the dotted line; however, the contact face may not exist distinctly after curing.

The interposer may be produced by a second production method. In that case, the rigid substrate 4010 is obtained by folding a sheet of the insulating layer 4015 which does not have the wiring layer (more specifically, a sheet containing a semi-cured resin) and then completely curing the sheet, and then wiring layer 4030 is formed on the rigid substrate 4010 to provide the interposer 4100. A wiring pattern may be formed by, for example, bending a wiring pattern formed on a carrier sheet along a surface of the rigid substrate so that the wiring pattern closely contacts the rigid substrate, and then transferring the wiring pattern to the rigid substrate.

Folding of the sheet may be performed so that a side surface is curved in any production method. Such folding may be performed more easily than folding the sheet so that the side surface is flat.

The production method described with reference to FIGS. 51 to 54(*b*) does not need forming of a via penetrating the rigid substrate, and therefore, a step of forming such via can be omitted in this production method. An advantage resulting from this is as described in connection with the first embodiment and details thereof are omitted here.

Figure 55:
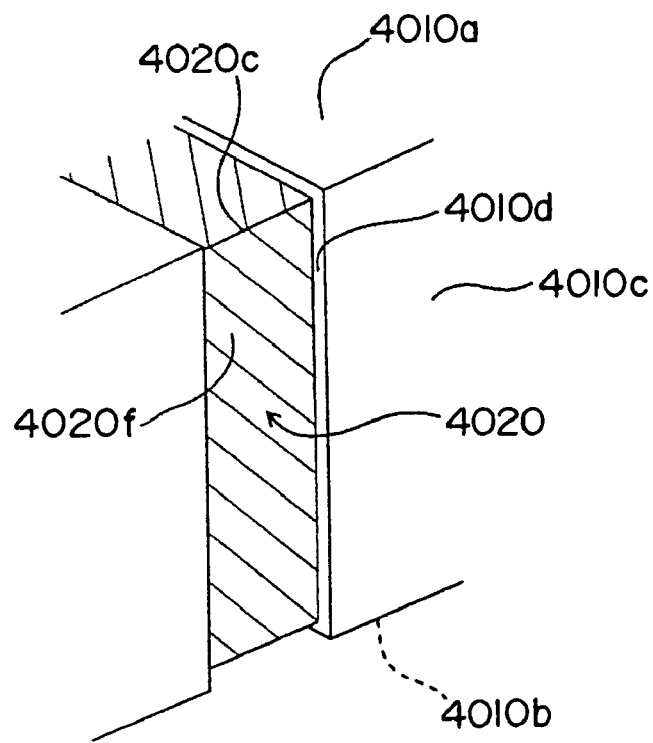
Figure 56:
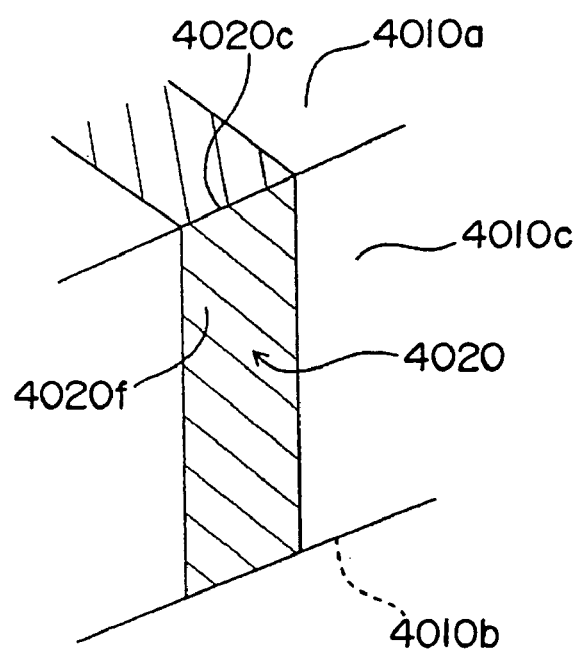

At least a portion of the wiring 4020 on the side surface 4010*c* of the rigid substrate 4010 is embedded in the side surface 4010*c* of the rigid substrate 4010 by forming the wiring 4020 through the steps shown in FIGS. 52(*a*) to 53(*b*). This is schematically shown in FIG. 55 which is an enlarged perspective view of a part of the rigid substrate. That is, as illustrated in FIG. 55, top surface 4020*f* (exposed surface) of U/L-shaped side wiring 4020 is substantially flush with a surface (for example, side surface 4010*c*) of the rigid substrate 4010. This effect given by this configuration (that is, suppression of breakage of the U/L-shaped side wirings and the like) is as described in connection with the first embodiment.

Further, as shown in FIG. 55, when exposed surface 4020*f* of the U/L-shaped side wiring 4020 is concave from the side surface 4010*c* of the rigid substrate 4010 and thereby located inside the rigid substrate 4010, a possibility of contact between the exposed surface 4020*f* and an external thing is significantly reduced, whereby breakage and damage of the U/L-shaped side wiring 4020 can be effectively reduced. A corner portion 4020*c* of the U/L-shaped side wiring 4020 is particularly preferably concave from the surface of the rigid substrate (or an edge) as shown in FIG. 55 from a viewpoint of protection of the wiring, since the corner portion 4020*c* tends to contact the external thing. Therefore, exposed surfaces of the upper-surface wiring portion and/or the lower-surface wiring portion of the U/L-shaped side wiring 4020 are preferably disposed at positions which are sunken from surfaces of the sheet substrate, as shown in FIG. 55.

According to a method similar to the method described in connection with the first embodiment, a step 4010*d* may be formed by denting the top surface 4020*f* (or the exposed surface) of the U/L-shaped side wiring 4020 from the side surface 4010*c* of the rigid substrate 4010 as shown in FIG. 55.

In a case where the interposer is produced according to the second production method, it is possible to apply a resin or a film, for protecting the U/L-shaped side wiring 4020, to the rigid substrate 4010 in order to dent the exposed surface 4020*f* of the U/L-shaped side wiring 4010 relative to the surface (for example, the side surface 4010*c*) of the rigid substrate 4010 or in order to make the exposed surface 4010*f* flush with the surface of the rigid substrate 4010.

In the interposer of the present invention, the U/L-shaped side wirings 4020 may be a coplanar line. This makes it possible to constitute an interposer which is suitable for high-speed signal wiring. More specifically, as shown in FIG. 57, when U/L-shaped side wirings 4020*s* are formed as a signal line and U/L-shaped side wirings 4020*g* are formed as ground lines on both side of the signal line, they form the coplanar line. This makes it possible to control a characteristic impedance and avoid a problem of impedance mismatch between a via and wiring, which problem occurs in an interposer with a via.

Embodiment 11

Next, a method for producing an interposer of a three-dimensional construction is described. In this production method of the present invention, a rigid substrate is formed by folding a sheet containing a semi-cured resin, and therefore, an upper surface or a lower surface of the rigid substrate may be formed into a shape having a concave portion or a convex portion.

FIGS. 58(*a*) to 58(*e*) show steps included in a production method of an interposer having the concave portion. Firstly, as shown in FIG. 58(*a*), a sheet 4015 wherein a wiring layer 4030 is formed (that is, a sheet containing a semi-cured resin) is prepared. Next, as shown in FIGS. 58(*b*) and 58(*c*), the sheet 4015 is bent into a shape having a concave portion. Thereafter, the sheet 4015 is heated and pressurized, resulting in an interposer 4100 of a three-dimensional shape (here, a "U"-shape) as shown in FIG. 58(*d*).

The interposer 4100 shown in FIG. 58(*d*) may become an interposer which can be mounted three-dimensionally as shown in FIG. 58(*e*). More specifically, a lower surface of the interposer 4100 is connected to a printed board 4060 and chip parts 4062 mounted to the printed board 4060 are disposed between the interposer 4100 and the printed board 4060. On an upper surface of the interposer 4100, an electronic component 4064 (such as a semiconductor chip) is mounted. That is, the electronic component 4064 and the chip parts 4062 can be mounted three-dimensionally in the same area viewed from above. As a result, more electronic components may be mounted even if a mounting area is small.

In light of an essential function of the interposer, a semiconductor chip having a fine pitch or a high pin count may be preferably disposed on at least one surface (for example, the upper surface) of the interposer 4100. For example, a semiconductor chip wherein a pitch of terminals is at most 150 μm, or a semiconductor chip having at least sixteen terminals may be preferably disposed. A mount assembly constituted by such a semiconductor chip and the interposer 4100 can reduce a load to a printed board (a parent board) since a terminal gap in the terminal pitch is broadened by the interposer 4100. On the interposer 4100, a surface mount device (such as a chip device; for example, a chip inductor, a chip resistor, or a chip capacitor) may be mounted instead of the semiconductor device. Alternatively, both of a semiconductor chip and the surface mount device may be mounted on the interposer 4100

Figure 59A:
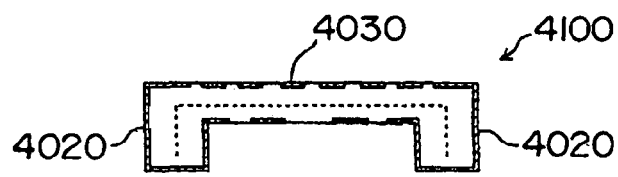
FIGS. 59(a) to 59(c) are sectional views which schematically show interposers 4100 in accordance with embodiments of the present invention.
Figure 59B:
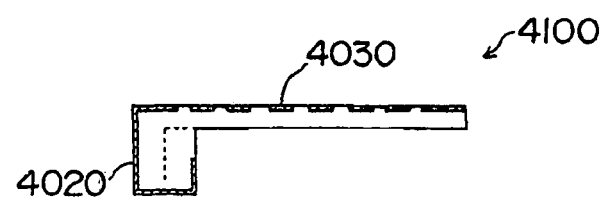
Figure 59C:
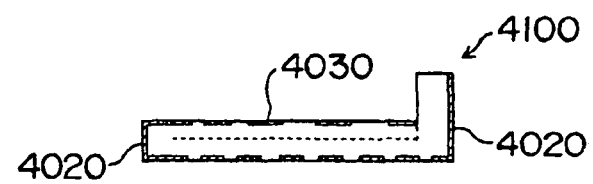

The interposer 4100 may be formed into any of shapes shown in FIGS. 59(*a*) to 59(*c*). Each of these shapes can be obtained by folding a sheet containing semi-cured resin so that an overlapped plane is made as indicated by dotted line 4011.

Figure 60A:
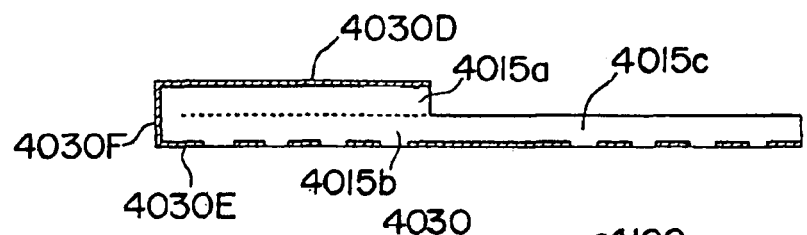
FIGS. 60(a) and 60(b) are sectional views which schematically show steps in a method for producing an interposer 4100 inside which a shield member 4035 (a shield layer) is provided.
Figure 60B:
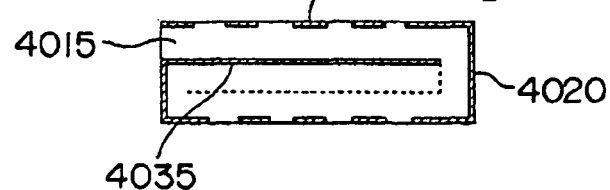

Further, the interposer of the present invention may be fabricated so that it has a shield layer in a rigid substrate. More specifically, the shield layer may be easily formed by folding a sheet as shown in FIGS. 60(*a*) and 60(*b*). Firstly, a left side of an insulating layer of a sheet 4015 similar to the sheet shown in FIG. 52(*d*) is folded together with a wiring disposed under the insulating layer, so that portions 4015*a* and 4015*b* of the insulating layer are opposed to each other as shown in FIG. 60(*a*), and portions 4030D and 4030E of bent wiring are opposed to each other across opposed portions 4015*a* and 4015*b* of the insulating layer, while a remaining portion 4030F of wiring extends on a side surface of the opposed portions 4015*a* and 4015*b* of the insulating layer.

Next, as shown in FIG. 60(*b*), the right side portion 4015*c* of the insulating layer is bent together with the wiring which is positioned under the portion 4015*c*, so that the portion 4015*c* is placed on the wiring portion 4030D and the portions 4015*a*, 4015*b* and 4015*c* are opposed to each other so as to form the U/L-shaped side wiring 4020, and thereby the wiring portion 4030D which has been bent is interposed in the insulating layer and becomes the shield member 4035. In this case, the shield member 4035 is made of the same material as that of the U/L-shaped side wiring 4020.

Embodiment 12

Figure 61:
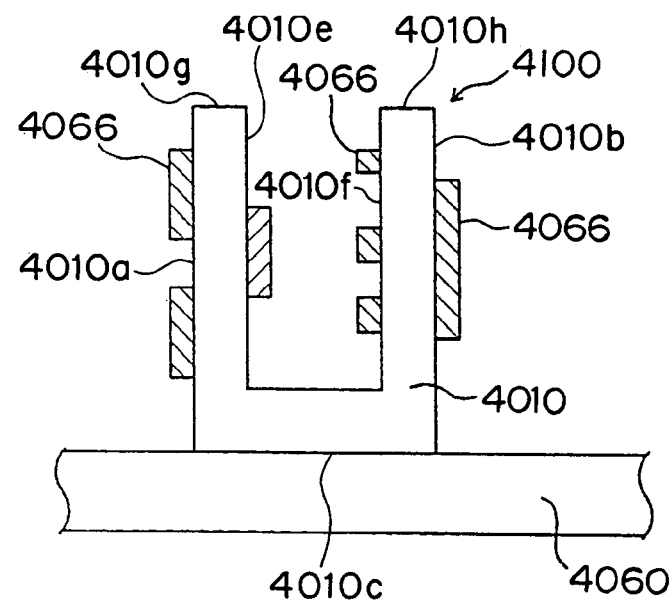
FIG. 61 is a sectional view which schematically shows a construction of an interposer 4100 in accordance with an embodiment of the present invention.

Referring to FIGS. 61 to 66, various embodiments of interposers of the present invention are described as a twelfth embodiment. FIG. 61 shows an interposer 4100 of a "U"-shape. This interposer has inner surfaces 4010*e* and 4010*f* which are opposed to an upper surface 4010*a* and a lower surface 4010*b*, respectively, so that components can be mounted on the inner surfaces 4010*e* and 4010*f*. A U/L-shaped side wiring (not shown) is formed on a side surface 4010*c* of rigid substrate 4010. The U/L-shaped side wiring may be formed on a side surface 4010*g* which connects the upper surface 4010*a* and the inner surface 4010*e*, and on a side surface 4010*h* which connects the lower surface 4010*b* and the inner surface 4010*f*. In that case, upper- and lower-surface wiring portions of the U/L-shaped side wiring formed on the side surface 4010g are disposed on the surfaces 4010a and 4010e, and upper- and lower-surface wiring portions of the U/L-shaped side wiring formed on the side surface 4010h are disposed on the surfaces 4010b and 4010g. As shown in FIG. 61, the side surface 4010c is mounted on printed board 4060 so as to make a connection between electronic components 4066 mounted on the upper surface 4010a, the lower surface 4010b and the inner surface 4010c and the printed board. In FIG. 61, each electronic component is mounted vertically. A mount assembly shown in FIG. 61 has an advantage in that heat can be effectively diffused from the electronic components 4066.

Figure 62:
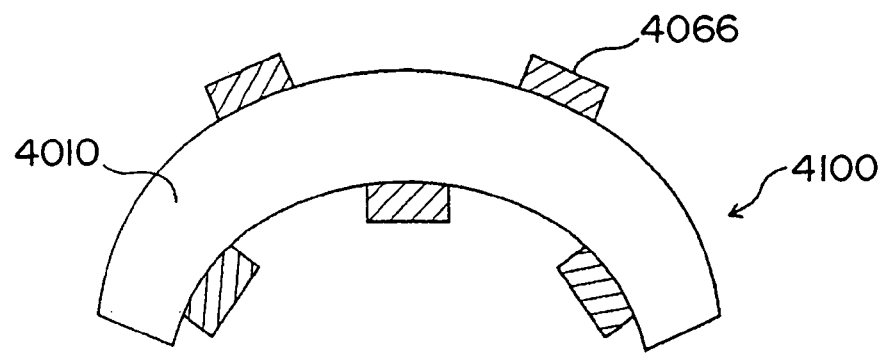
FIG. 62 is a sectional view which schematically shows a construction of an interposer 4100 in accordance with an embodiment of the present invention.

FIG. 62 is an example of an interposer which has a curved shape. In FIG. 62, reference numeral 4066 denotes an electronic component, and U/L-shaped side wiring is not shown. This interposer can be used in an antenna or an LED lighting.

In the interposer described above, the U/L-shaped side wiring is a U-shaped side wiring which extends on three surfaces, that is, a side surface, an upper surface and a lower surface of a rigid substrate. In another preferred embodiment, the U/L-shaped side wiring does not extend on at least one of the upper surface and the lower surface. In other words, the U/L-shaped side wiring may be an L-shaped side wiring which extends on a side surface and either the upper surface or the lower surface of the rigid substrate. Also, the L-shaped side wiring may be flush with a surface of the rigid substrate or may be protruded from the surface of the rigid substrate. Alternatively, the L-shaped side wiring exists at a position which is concave from the side surface and the upper (or the lower) surface of the rigid substrate. Such an L-shaped side wiring is shown in FIG. 63.

Figure 63:
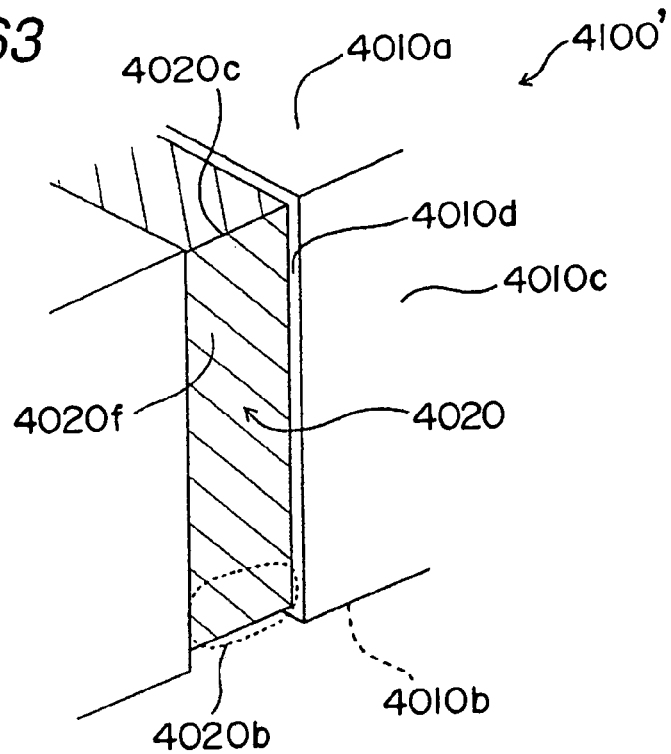
FIG. 63 is an enlarged view of a substantial part of a U/L-shaped side wiring 4020 in an interposer 4100' of the present invention.

In interposer 4100' shown in FIG. 63, one end portion 4020b of U/L-shaped side wiring 4020 is located at a bottom end (that is, a boundary portion between the side surface 4010c and lower surface 4010b (or a corner portion)). The U/L-shaped side wiring 4020 does not extend on the lower surface 4010b. In this case, terminals for being connected with a printed board may not be provided on the lower surface.

Figure 64:
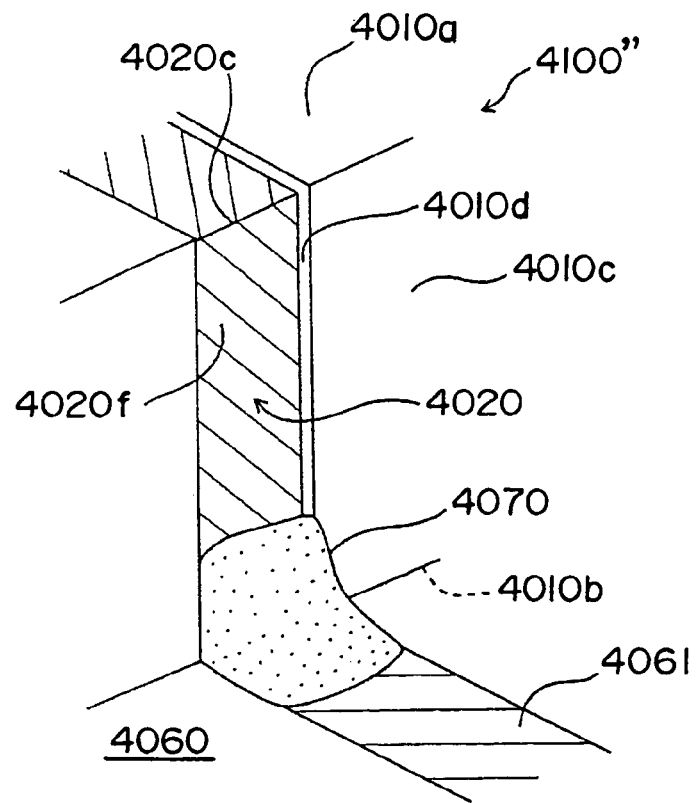
FIG. 64 is an enlarged view of a substantial part which shows soldering of the interposer 4100' of FIG. 63 to a printed board 4060.

FIG. 64 schematically shows an embodiment of mounting the interposer 4100' shown in FIG. 63 on a printed board 4060. A solder connection portion 4070 is formed on the end portion 4020b of the U/L-shaped side wiring 4020 (see FIG. 63) so as to electrically connect the interposer 4100' with a wiring pattern 4061 of the printed board 4060. In the interposer 4100' shown in FIG. 64, the U/L-shaped side wiring defines a recess whose depth from the side surface of the rigid substrate corresponds to a step 4010d, whereby a groove portion is formed in the side surface 4010c. This groove portion is advantageous because it serves as a guide as well as a dam for storing solder. Further, when soldering shown in FIG. 64 is employed as a mounting method, solder sticking can be easily checked by observing the printed board 4060 from above (for example, in a vertical direction). The interposer 4100' wherein the U/L-shaped side wiring 4020 terminates on the side surface facilitates an examination of a solder connection portion after soldering.

Figure 65:
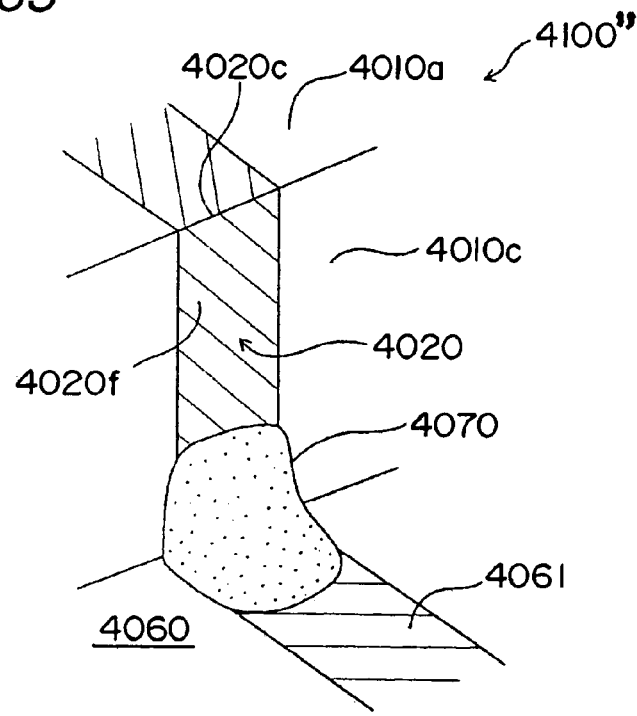
FIG. 65 is an enlarged view of a substantial part which shows soldering of an interposer 4100" to a printed board 4060.

FIG. 65 shows an interposer 4100" wherein U/L-shaped side wiring 4020 is of an L-shape and exposed surface 4020f, that is a top surface of the U/L-shaped side wiring 4020, is coplanar with side surface 4010c of rigid substrate 4010. Also, when there is no step 4010d (or when the top surface 4020f of the U/L-shaped side wiring 4020 protrudes from the side surface 4010c), solder connection portion 4070 can be provided at an end portion of the U/L-shaped side wiring 4020 so as to connect the interposer 4100" and wiring pattern 4061 of a printed board 4060 by soldering. Also in this case, a solder connection portion can be easily examined.

From a viewpoint of solder connection, end portions 4020b of U/L-shaped side wirings 4020 are preferably spaced with a constant interval on the side surface 4010c of the rigid substrate 4010 of the interposer 4100' or 4100" shown in any of FIGS. 63 to 65. In this case, not only the end portions, but also side-surface wiring portions of the U/L-shaped side wirings may be arranged with a constant interval on the side surface of the rigid substrate.

Figure 66:
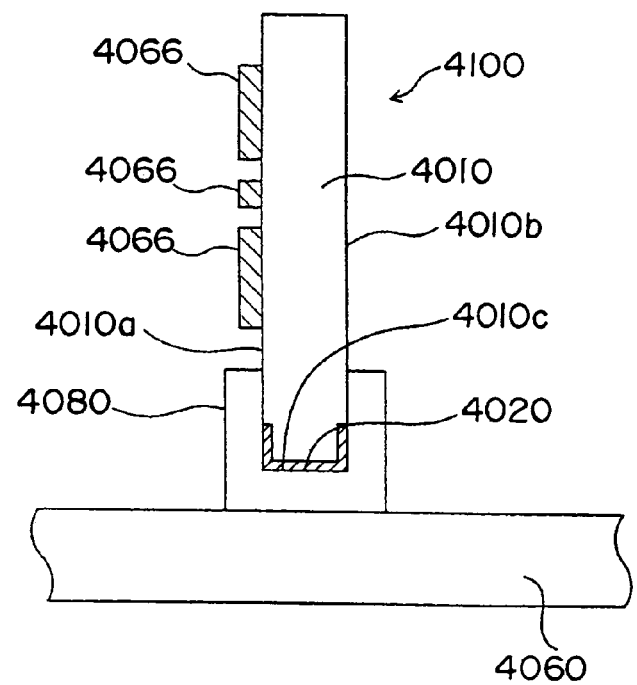
FIG. 66 is a sectional view which shows a construction wherein an interposer 4100 of the present invention is mounted on a printed board 4060 via a connector 4080.
Figure 67:
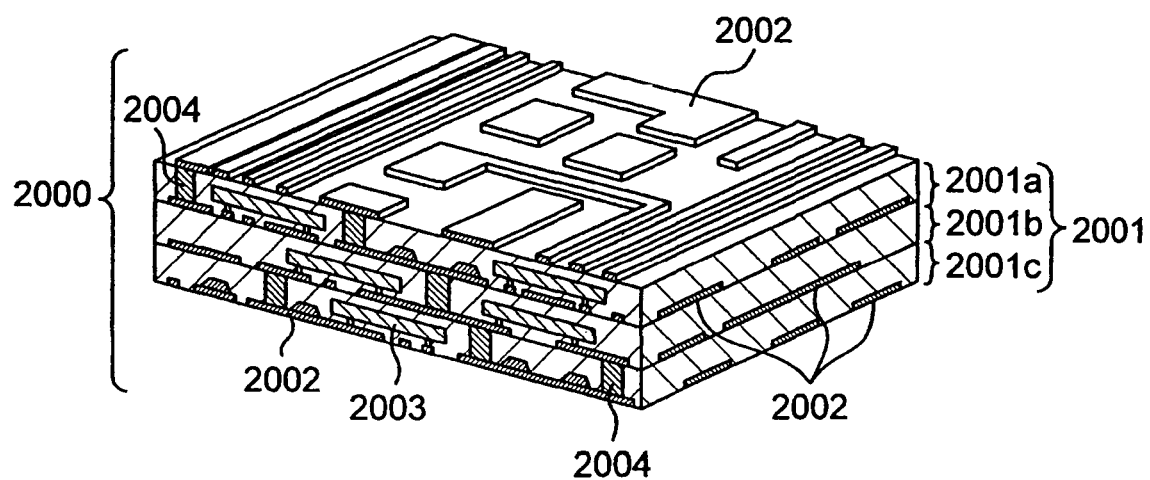
FIG. 67 is a perspective view schematically showing a conventional module with a built-in component 2000.

The interposer of any embodiment described above can be mounted as shown in FIG. 66 since the U/L-shaped side wiring 4020 extends on the side surface 4010c of the rigid substrate 4010. For example, a mount assembly including the interposer 4100 as illustrated in FIG. 41 and electronic components 4066 (such as chip parts or semiconductor chips) mounted thereon may be fitted into a connector (mechanical connector) 4080 which is disposed on a printed board 4060 (a mother board). In this case, a mount assembly and the printed board 4060 are electrically connected via the connector 4080 since the side-surface wiring portion of the U/L-shaped side wiring 4020 in the interposer 4100 and the connector 4080 are electrically and physically connected. The connector 4080 is constructed such that the side surface 4010c of the interposer 4100 is fitted thereonto. The connector 4080 makes it possible to mount electronic component 4066 vertically, whereby many components can be mounted in an electronic device whose mounting area is small. Although FIG. 66 shows the interposer shown in FIG. 41, vertical mounting may be applicable to any connection member as described above.

Electronic devices with small mounting areas include portable electronic device such as a cellular phone and a PDA. That is, an assembly which includes the electronic components 4066, the interposer 4100, the connector 4080 and the printed board 4060 facilitates vertical mounting of electronic components. The electronic component 4066 may be mounted also on the lower surface 4010b of the rigid substrate 4010 of the interposer 4100 depending on a wiring pattern of the interposer 4100.

Although the embodiments of the present invention are described with reference to the drawings, it should be noted the present invention is not limited to the embodiments and various changes and modifications may be made in the invention without departing from the spirit and the scope of the present invention.

The present invention provides a connection member which can be produced relatively efficiently, and it can be preferably used as, for example, a connector sheet, a connection member with a core, and an interposer, in order to electrically connect a circuit board to another circuit board or connect a circuit board to an electronic component. Therefore, the connection member of the present invention can be preferably used in various electronic devices, particularly a portable electronic device such as a cellular phone.

As described in the above, the present invention provides, as a first mode, a connection member which includes:

an insulating substrate which has an upper surface and a lower surface which is opposite to the upper surface, and a side surface which connects the upper and the lower surfaces; and at least one wiring which includes i) a side-surface wiring portion which is disposed on at least a part of the side surface and ii) at least one of an upper-surface wiring portion and a lower-surface wiring portion, with the upper-surface wiring portion being connected to the side-surface wiring portion and disposed on at least a part of the upper surface, and the lower-surface wiring portion being connected to the side-surface wiring portion and disposed on at least a part of the lower surface (this wiring is referred to as a "particular wiring" hereinafter)

The present invention provides, as a second mode, the connection member according to the first mode wherein electrical conduction between the upper surface and the lower surface is made by the particular wiring.

The present invention provides, as a third mode, the connection member according to the first mode, wherein the particular wiring electrically connects an electrical element on the upper surface and an electrical element on the lower surface.

The present invention provides, as a fourth mode, the connection member according to the first mode wherein at least one end portion of the particular wiring is electrically connected to an electrical element, and the particular wiring and the electrical element are formed together.

The present invention provides, as a fifth mode, the connection member according to the third mode wherein the electrical element(s) is one or more elements selected from a group consisting of a wiring pattern, a land, a pad, a terminal, a solder ball and a bump.

The present invention provides, as a sixth mode, the connection member according to the second mode, wherein no vias are formed in the insulating substrate.

The present invention provides, as a seventh mode, the connection member according to the first mode wherein a ratio of a length of the side surface of the insulating substrate to a width of the side-surface wiring portion of the particular wiring is at least one.

The present invention provides, as an eighth mode, the connection member according to the first mode which includes at least two particular wirings, wherein a narrowest pitch of side-surface wiring portions of the particular wirings is at most 0.4 mm.

The present invention provides, as a ninth mode, the connection member according to the first mode, wherein the insulating substrate is formed of a material containing a resin.

The present invention provides, as a tenth mode, the connection member according to the first mode, wherein the insulating substrate is formed of a composite material containing a resin and an inorganic filler.

The present invention provides, as a eleventh mode, the connection member according to the tenth mode, wherein the resin is at least one of a thermosetting resin and a thermoplastic resin.

The present invention provides, as a twelfth mode, the connection member according to the first mode, wherein at least a part of the side-surface wiring portion of the particular wiring is embedded in the side surface of the insulating substrate.

The present invention provides, as a thirteenth mode, the connection member according to the twelfth mode, wherein a top surface of the side-surface portion of the particular wiring is disposed at an interior position of the insulating substrate relative to the side surface of the insulating substrate.

The present invention provides, as a fourteenth mode, the connection member according to the twelfth mode, wherein a portion of the particular wiring which is placed at a corner of the insulating substrate is disposed at an interior position of the insulating substrate relative to a surface of the insulating substrate which surface defines the corner.

The present invention provides, as a fifteenth mode, the connection member according to the first mode, wherein a plurality of particular wirings define a coplanar line.

The present invention provides, as a sixteenth mode, the connection member according to the first mode which is formed by bending a sheet containing a semi-cured resin and then curing this bent sheet.

The present invention provides, as a seventeenth mode, the connection member according to the sixteenth mode, wherein the sheet includes a wiring pattern that has, as a part, a wiring which is to constitute the particular wiring of the connection member.

The present invention provides, as a eighteenth mode, the connection member according to the first mode, wherein the upper surface of the insulating substrate has an approximate rectangular shape consisting of long sides and narrow sides shorter than the long sides.

The present invention provides, as a nineteenth mode, the connection member according to the eighteenth mode, wherein the particular wiring is arranged so that the side-surface wiring portion is disposed on only a side surface adjacent a long side.

The present invention provides, as a twentieth mode, the connection member according to the first mode, wherein the upper surface of the insulating substrate has an L-shape, a U-shape, or a rectangular frame shape.

The present invention provides, as a twenty-first mode, the connection member according to the first mode, wherein at least one of the upper surface and the lower surface of the insulating substrate has at least one of a concave portion and a convex portion.

The present invention provides, as a twenty-second mode, the connection member according to the first mode, wherein the insulating substrate is a sheet substrate.

The present invention provides, as a twenty-third mode, the connection member according to the twenty-second mode, wherein the upper surface of the sheet substrate is flat and at least eight particular wirings are provided.

The present invention provides, as a twenty-fourth mode, the connection member according to the twenty-second mode, wherein at least one of the upper surface and the lower surface of the sheet substrate has at least one of a concave portion and a convex portion, and at least one of the upper-surface portion and the lower-surface portion of the particular wiring further extends on at least one of an inner side surface of the concave portion and a protruded side surface of the convex portion.

The present invention provides, as a twenty-fifth mode, the connection member according to the twenty-second mode, wherein the upper surface and the lower surface of the sheet substrate have tackiness under a first condition, and adhesiveness under a second condition that is different from the first condition and is a condition under which a hardening reaction of a material constituting the upper surface and the lower surface proceeds.

The present invention provides, as a twenty-sixth mode, the connection member according to the twenty-fifth mode, wherein the material constituting the upper surface and the lower surface is selected from a group consisting of a mixture of a silicone resin and a thermosetting resin, a mixture of a thermoplastic resin and a thermosetting resin, and a mixture of a UV-curing resin and a thermosetting resin.

The present invention provides, as a twenty-seventh mode, the connection member according to the twenty-sixth mode, wherein the first condition is a temperature condition in a range of 0° C. to 80° C.

The present invention provides, as a twenty-eighth mode, the connection member according to the twenty-sixth mode, wherein the second condition is a temperature condition under which a post-curing reaction of the thermosetting resin proceeds.

The present invention provides, as a twenty-ninth mode, the connection member according to the first mode, wherein the insulating substrate includes:

(1) a core member; and (2) an electrically insulating layer which covers at least a part of the core member, and has an upper-surface portion which is disposed on at least a part of an upper surface of the core member, a lower-surface portion which is disposed on at least a part of a lower surface of the core member which is opposite to the upper surface of the core member, and a side-surface portion which is disposed on at least a part of a side surface of the core member and connects the upper-surface portion and the lower-surface portion, and the upper-surface wiring portion of the particular wiring is disposed on at least a part of the upper-surface portion of the electrically insulating layer, the lower-surface wiring portion of the particular wiring is disposed on at least a part of the lower-surface portion of the electrically insulating layer, and the side-surface wiring portion of the particular wiring is disposed on at least a part of the side-surface portion of the electrically insulating layer.

The present invention provides, as a thirtieth mode, the connection member according to the twenty-ninth mode which does not have a via penetrating the electrically insulating layer.

The present invention provides, as a thirty-first mode, the connection member according to the twenty-ninth mode wherein the electrically insulating layer is formed of only a resin or a material containing a resin and a filler.

The present invention provides, as a thirty-second mode, the connection member according to the thirty-first mode wherein the resin is at least one of a thermosetting resin and a thermoplastic resin.

The present invention provides, as a thirty-third mode, the connection member according to the twenty-ninth mode wherein the electrically insulating layer and the core member have flexibility.

The present invention provides, as a thirty-fourth mode, the connection member according to the twenty-ninth mode wherein the core member is formed of a metal.

The present invention provides, as a thirty-fifth mode, the connection member according to the thirty-fourth mode wherein at least a part of a surface of the core member which contacts the electrically insulating layer is roughened.

The present invention provides, as a thirty-sixth mode, the connection member according to the twenty-ninth mode wherein at least one of corner portions of the core member is chamfered.

The present invention provides, as a thirty-seventh mode, the connection member according to the twenty-ninth mode wherein a part of the core member is exposed.

The present invention provides, as a thirty-eighth mode, the connection member according to the twenty-ninth mode wherein the side-surface portion of the electrically insulating layer is curved.

The present invention provides, as a thirty-ninth mode, the connection member according to the first mode wherein the insulating substrate is a plate substrate.

The present invention provides, as a fortieth mode, the connection member according to the thirty-ninth mode wherein at most five hundred particular wirings are provided.

The present invention provides, as a forty-first mode, the connection member according to the thirty-ninth mode wherein one end portion of the particular wiring is disposed in a peripheral region of the upper surface of the plate substrate.

The present invention provides, as a forty-second mode, the connection member according to the thirty-ninth mode wherein one end portion of the particular wiring is arranged in a grid on a lower surface of the plate substrate.

The present invention provides, as a forty-third mode, the connection member according to the thirty-ninth mode wherein an area of the upper surface of the plate substrate is at most 200 mm$^2$, and at least sixteen particular wirings are provided.

The present invention provides, as a forty-fourth mode, the connection member according to the thirty-ninth mode wherein the upper surface of the plate substrate has an approximate rectangular shape consisting of long sides and narrow sides shorter than the long sides, and a length of the long sides is at most three times a length of the narrow sides.

The present invention provides, as a forty-fifth mode, the connection member according to the thirty-ninth mode wherein the upper surface of the plate substrate has an approximate rectangular shape consisting of long sides and narrow sides shorter than the long sides, and a length of the long sides is at least ten times a length of the narrow sides.

The present invention provides, as a forty-sixth mode, the connection member according to the thirty ninth mode wherein a width of the side-surface wiring portion of the particular wiring is at most 0.25 mm, and a space between the side-surface wiring portions of the particular wirings is at most 0.3 mm.

The present invention provides, as a forty-seventh mode, the connection member according to the thirty-ninth mode which has a shield layer within the plate substrate.

The present invention provides, as a forty-eighth mode, the connection member according to the thirty-ninth mode wherein the plate substrate is an approximate hexahedron in which the upper surface and the lower surface each have an approximately rectangular shape.

The present invention provides, as a forty-ninth mode, the connection member according to the forty-eighth mode wherein a plurality of the particular wirings are arranged so that the side-surface wiring portions are disposed on all of four side surfaces of the approximate hexahedron.

The present invention provides, as a fiftieth mode, the connection member according to the thirty-ninth mode wherein the plate substrate has an opening in its center and has a rectangular frame shape, and the side-surface wiring portion of the particular wiring is disposed on a side surface which defines the opening, and a shield layer is provided on an outer circumferential surface of the plate substrate.

The present invention provides, as a fifty-first mode, the connection member according to the thirty-ninth mode wherein the plate substrate has a U-shape or a C-shape.

The present invention provides, as a fifty-second mode, the connection member according to the thirty-ninth mode wherein the particular wiring has only the upper-surface wiring portion and the side-surface wiring portion.

The present invention provides, as a fifty-third mode, the connection member according to the fifty-second mode wherein an end portion of the side-surface wiring portion of the particular wiring is disposed on a boundary portion between the side surface and the lower surface of the plate substrate.

The present invention provides, as a fifty-fourth mode, the connection member according to the fifty-second mode wherein end portions of the side-surface wiring portions of the particular wirings are disposed with a constant interval on the side surface of the plate substrate.

The present invention provides, as a fifty-fifth mode, the connection member according to the fifty-second mode wherein a guide groove which leads to the particular wiring is formed on a part of the side surface of the plate substrate.

The present invention provides, as a fifty-sixth mode, a mount assembly which includes at least one connection member according to the first mode and at least two circuit boards, wherein the connection member is disposed between the circuit boards.

The present invention provides, as a fifty-seventh mode, the mount assembly according to the fifty-sixth mode, wherein one circuit board is connected to the connection member by a mounting method different from a mounting method by which the other circuit board is connected to the connection member.

The present invention provides, as a fifty-eighth mode, a mount assembly according to the fifty sixth-mode which includes:
a first circuit board having a wiring pattern on a side surface; and
a second circuit board having a wiring pattern on a side surface;
wherein the wiring pattern formed on the side surface of the first circuit board is connected to a side-surface wiring portion on one side surface of the connection member, and the wiring pattern formed on the side surface of the second circuit board is connected to a side-surface wiring portion on another side surface of the connection member, whereby the first and the second circuit boards are electrically connected.

The present invention provides, as a fifty-ninth mode, the mount assembly according to the fifty-sixth mode wherein:
an exposed surface of the particular wiring formed in the connection member is concave from a surface of the connection member;
a wiring pattern formed on the circuit board has a portion protruded from a surface of the circuit board; and
the concave exposed surface of the particular wiring of the connection member and the protruded wiring portion of the circuit board contact each other by a fitting operation.

The present invention provides, as a sixtieth mode, a component mount assembly which includes the connection member according to the first mode and an electronic component disposed on at least one of the upper surface and the lower surface of the connection member,
wherein the electronic component is electrically connected to the particular wiring or an electrical element electrically connected to the particular wiring of the connection member.

The present invention provides, as a sixty-first mode, the component mount assembly according to the sixtieth mode wherein the electronic component is a first electronic component, another connection member according to the first mode is disposed on the first electronic component, and a second electronic component is disposed on an upper surface of the another connection member.

The present invention provides, as a sixty-second mode, the component mount assembly according to the sixty-first mode wherein the first electronic component is one of a semiconductor memory and an LSI, and the second electronic component is one of a semiconductor memory and an LSI.

The present invention provides, as a sixty-third mode, a mount assembly, which includes a first connection member which is the connection member according to the twenty-ninth mode and a second connection member which is another connection member,
wherein the second connection member is disposed on at least one of the upper surface and the lower surface of the first connection member and is electrically connected to the particular wiring or an electrical element connected to the particular wiring of the first connection member.

The present invention provides, as a sixty-fourth mode, a mount assembly which includes:
a circuit board wherein wiring patterns are formed on both surfaces; and
a connection member according to the twenty-second mode, in which a concave portion is formed by bending a sheet containing a semi-cured resin and the particular wiring has a portion extending on an inner side surface of the concave portion,
wherein the side surface of the circuit board fits in the concave portion; and
the wiring pattern formed on one surface of the circuit board is electrically connected with the wiring pattern formed on the other surface of the circuit board via the wiring portion extending on the inner side surface of the concave portion.

The present invention provides, as a sixty-fifth mode, the mount assembly according to the sixty-fourth mode, wherein a via is not formed in the circuit board.

The present invention provides, as a sixty-sixth mode, an electronic device which includes the mount assembly according to the sixtieth mode and a casing for housing the mount assembly.

The present invention provides, as a sixty-seventh mode, a method for producing the connection member according to the first mode, which includes forming the particular wiring by bending a wiring layer that has at least one wiring formed in one plane.

The present invention provides, as a sixty-eighth mode, the method according to the sixty-seventh mode which includes:
(1-A) preparing a sheet which includes a wiring layer having at least one wiring, with the sheet having an insulating layer containing a semi-cured resin;
(1-B) bending the sheet so that parts of the insulating layer face each other and portions of the at least one wiring face each other across the insulating layer, and another portion of the at least one wiring extends on a side surface of the insulating layer which is formed by a bent part of the insulating layer; and
(1-C) curing the resin contained in the insulating layer of this bent sheet.

The present invention provides, as a sixty-ninth mode, the method according to the sixty-eighth mode wherein the insulating layer is formed of a composite material containing a thermosetting resin and an inorganic filler.

The present invention provides, as a seventieth mode, the method according to the sixty-ninth mode wherein the composite material contains at least 100 parts by weight of an inorganic filler relative to 100 parts by weight of a thermosetting resin.

The present invention provides, as a seventy-first mode, the method according to the seventieth mode wherein step (1-A) includes steps of:
(1-$a$) preparing a laminate which includes a carrier sheet and a metal layer formed thereon;
(1-$b$) processing the metal layer so as to form a wiring layer having at least one wiring; and
(1-$c$) forming an insulating layer containing a semi-cured resin on the wiring pattern.

The present invention provides, as a seventy-second mode, the method according to the seventy-first mode, wherein, in step (1-$b$), the wiring layer is formed by etching the metal layer such that, in addition to an unnecessary portion of the metal layer, a portion of the carrier sheet which is beneath the unnecessary portion of the metal layer is removed.

The present invention provides, as a seventy-third mode, the method according to the sixty-eighth mode, wherein, in step (1-B), the sheet is bent so that it has an approximate hexahedral shape.

The present invention provides, as a seventy-fourth mode, the method according to the sixty-eighth mode, wherein, in the step (1-B), the sheet is bent so that a plate substrate having at least one of a concave portion and a convex portion is formed.

The present invention provides, as a seventy-fifth mode, the method according to the sixty-seventh mode which includes:

(2-A) preparing a sheet containing a semi-cured resin;
(2-B) bending the sheet;
(2-C) forming an insulating substrate by curing the sheet after step (2-B); and
(2-D) forming on the insulating substrate at least one wiring which includes i) a side-surface wiring portion which is disposed on at least a part of a side surface and ii) at least one of an upper-surface wiring portion and a lower-surface wiring portion, with the upper-surface wiring portion being connected to the side-surface wiring portion and disposed on at least a part of an upper surface, and the lower-surface wiring portion being connected to the side-surface wiring portion and disposed on at least a part of a lower surface.

The present invention provides, as a seventy-sixth mode, the method according to the sixty-seventh mode which includes steps of:

(3-A) forming a wiring layer including at least one wiring on at least a part of a surface of a carrier sheet;
(3-B) forming on the surface of the carrier sheet a resin layer containing a hardening resin so as to cover the wiring layer with the resin layer;
(3-C) disposing a core member on the resin layer and bending the carrier sheet with the resin layer in contact with the core member so that portions of the at least one wiring face each other across the resin layer, and the core member and another portion of the at least one wiring extends on a side surface of the resin layer which is formed by a bent part of the resin layer; and
(3-D) curing the resin contained in the resin layer so as to form the insulating layer; and
(3-E) removing the carrier sheet so as to expose the wiring layer.

The present invention provides, as a seventy-seventh mode, the method according to the sixty-seventh mode which includes steps of:

(4-A) forming a wiring layer including at least one wiring on at least a part of a surface of a carrier sheet;
(4-B) forming a resin layer containing a hardening resin on a surface of a core member so as to cover at least a part of the surface of a core member;
(4-C) bending the carrier sheet around the core member with the resin layer in contact with the wiring layer so that portions of the at least one wiring face each other across the resin layer and the core member and another portion of the at least one wiring extends on a side surface of the resin layer;
(4-D) curing the resin contained in the resin layer so as to form the insulating layer; and
(4-E) removing the carrier sheet so as to expose the wiring layer.

The present invention provides, as a seventy-eighth mode, the method according to the sixty-seventh mode which includes steps of:

(5-A) forming a wiring layer including at least one wiring on at least a part of a surface of a carrier sheet;
(5-B) bending the carrier sheet with the wiring layer inside so that portions of the at least one wiring face each other and a space is formed between these opposed portions;
(5-C) forming a resin layer by introducing a material containing a hardening resin into the space;
(5-D) curing the resin contained in the resin layer so as to form the insulating layer; and
(5-E) removing the carrier sheet so as to expose the wiring layer.

The present invention provides, as a seventy-ninth mode, the method according to the seventy-eighth mode wherein step (5-C) is performed as a process including steps of:

(5-c') introducing a material containing a hardening resin into the space; and
(5-c") inserting a core member into the material introduced into the space.

The present invention provides, as an eightieth mode, a method for producing a mount assembly which includes steps of:

connecting wirings on two circuit boards with a wiring layer of a sheet which includes an insulating layer containing a semi-cured resin, with the wiring layer having at least one wiring;
bending the sheet so that parts of the insulating layer face each other and portions of the at least one wiring face each other across the insulating layer, and another portion of the at least one wiring extends on a side surface of the insulating layer which is formed by a bent part of the insulating layer; and
curing the resin contained in the insulating layer of this bent sheet.

The present invention provides, as an eighty-first mode, a method for producing the mount assembly according to the sixty-fourth mode which includes steps of:

preparing a sheet which includes a wiring layer having at least one wiring and an insulating layer containing a semi-cured resin;
bending the sheet so that the insulating layer forms a concave portion, with parts of the insulating layer facing each other and portions of the at least one wiring facing each other across the insulating layer, with another portion of the at least one wiring extending on a side surface of the insulating layer which is formed by a bent part of the insulating layer, and with still another portion of the at least one wiring extending on an inner side surface of the concave portion;
closely fitting a side surface of a circuit board, wherein wiring patterns are formed on both of an upper surface and lower surface thereof, into the concave portion; and
curing the resin contained in the insulating layer of this bent sheet.

What is claimed is:

1. A method for producing a connection member, comprising:

providing an insulating substrate having an upper surface, a lower surface opposite said upper surface, and a side surface interconnecting said upper and lower surfaces; and providing wiring having a side-surface wiring portion disposed on at least a part of said side surface, and also having at least one of
(i) an upper-surface wiring portion disposed on at least a part of said upper surface and connected to said side-surface wiring portion, and
(ii) a lower-surface wiring portion disposed on at least a part of said lower surface and connected to said side-surface wiring portion, wherein providing said insulating substrate and providing said wiring comprises bending a semi-cured resin sheet having thereon at least one wiring extending in a plane such that parts of said semi-cured resin sheet face each other, a portion of said at least one wiring corresponding to said side-surface wiring portion extends on a bent part of said semi-cured resin sheet, and a portion of said at least one wiring corresponding to said upper-surface wiring portion faces a portion of said at least one wiring corresponding to said lower-surface wiring portion across said semi-cured resin sheet, and further comprising:

curing said semi-cured resin sheet after having been bent such that said at least one wiring is disposed directly on the cured rigid resin.

2. A method for producing a connection member, comprising:

providing an insulating substrate having an upper surface, a lower surface opposite said upper surface, and a side surface interconnecting said upper and lower surfaces; and providing wiring having a side-surface wiring portion disposed on at least a part of said side surface, and also having at least one of
  (i) an upper-surface wiring portion disposed on at least a part of said upper surface and connected to said side-surface wiring portion, and
  (ii) a lower-surface wiring portion disposed on at least a part of said lower surface and connected to said side-surface wiring portion, wherein providing said insulating substrate comprises bending a semi-cured resin sheet, and then curing said semi-cured resin sheet, and providing said wiring comprises disposing said side-surface wiring portion directly on at least a part of a side surface of the cured resin sheet, and at least one of
  (i) disposing said upper-surface wiring portion directly on at least a part of an upper surface of the cured resin sheet, and
  (ii) disposing said lower-surface wiring portion directly on at least a part of a lower surface of the cured resin sheet.

3. A method for producing a connection member, comprising:

providing an insulating substrate having an upper surface, a lower surface opposite said upper surface, and a side surface interconnecting said upper and lower surfaces; and providing wiring having a side-surface wiring portion disposed on at least a part of said side surface, and also having at least one of
  (i) an upper-surface wiring portion disposed on at least a part of said upper surface and connected to said side-surface wiring portion, and
  (ii) a lower-surface wiring portion disposed on at least a part of said lower surface and connected to said side-surface wiring portion, wherein providing said insulating substrate and providing said wiring comprises
  (i) forming at least one wiring on at least a part of a surface of a carrier sheet,
  (ii) forming on said surface of said carrier sheet a resin layer containing a hardening resin so as to cover said at least one wiring with said resin layer,
  (iii) disposing a core member on said resin layer and bending said carrier sheet with said resin layer in contact with said core member such that a portion of said at least one wiring corresponding to said side-surface wiring portion extends on a bent part of said resin layer, and a portion of said at least one wiring corresponding to said upper-surface wiring portion faces a portion of said at least one wiring corresponding to said lower-surface wiring portion across said resin layer and said core member, and further comprising:
  curing said resin layer; and
  removing said carrier sheet so as to expose said at least one wiring.

4. A method for producing a connection member, comprising:

providing an insulating substrate having an upper surface, a lower surface opposite said upper surface, and a side surface interconnecting said upper and lower surfaces; and providing wiring having a side-surface wiring portion disposed on at least a part of said side surface, and also having at least one of
  (i) an upper-surface wiring portion disposed on at least a part of said upper surface and connected to said side-surface wiring portion, and
  (ii) a lower-surface wiring portion disposed on at least a part of said lower surface and connected to said side-surface wiring portion, wherein providing said insulating substrate and providing said wiring comprises
  (i) forming at least one wiring on at least a part of a surface of a carrier sheet,
  (ii) forming a resin layer containing a hardening resin on a surface of a core member so as to cover at least a part of said surface of said core member;
  (iii) bending said carrier sheet around said core member with said resin layer in contact with said at least one wiring such that a portion of said at least one wiring corresponding to said side-surface wiring portion extends on a bent part of said resin layer, and a portion of said at least one wiring corresponding to said upper-surface wiring portion faces a portion of said at least one wiring corresponding to said lower-surface wiring portion across said resin layer and said core member, and further comprising:
  curing said resin layer; and
  removing said carrier sheet so as to expose said at least one wiring.

5. A method for producing a connection member, comprising:

providing an insulating substrate having an upper surface, a lower surface opposite said upper surface, and a side surface interconnecting said upper and lower surfaces; and providing wiring having a side-surface wiring portion disposed on at least a part of said side surface, and also having at least one of
  (i) an upper-surface wiring portion disposed on at least a part of said upper surface and connected to said side-surface wiring portion, and
  (ii) a lower-surface wiring portion disposed on at least a part of said lower surface and connected to said side-surface wiring portion, wherein providing said insulating substrate and providing said wiring comprises
  (i) forming at least one wiring on at least a part of a surface of a carrier sheet,
  (ii) bending said carrier sheet such that portions of said at least one wiring corresponding to said upper-surface wiring portion and said lower-surface wiring portion face each other across a space,
(iii) forming a resin layer by introducing a material containing a hardening resin into said space,
(iv) curing said resin layer, and
(v) removing said carrier sheet so as to expose said at least one wiring.

6. The method according to claim 5, wherein forming a resin layer by introducing a material containing a hardening resin into said space comprises
(i) introducing said material into said space, and then
(ii) inserting a core member into said material.

7. A method for producing a mount assembly, comprising:
connecting wirings on two circuit boards with at least one wiring on a semi-cured resin sheet;
bending said semi-cured resin sheet such that parts of said semi-cured resin sheet face each other, portions of said at least one wiring face each other across said semi-cured resin sheet, and another portion of said at least one wiring extends on a side surface of said semi-cured resin sheet, with said side surface being formed by a bent part of said semi-cured resin sheet; and
curing said semi-cured resin sheet wherein said at least one wiring is disposed directly on the cured rigid resin.

8. A method for producing a mount assembly, comprising:
bending a semi-cured resin sheet having at least one wiring thereon such that said semi-cured resin sheet forms a concave portion, parts of said semi-cured resin sheet face each other, portions of said at least one wiring face each other across said semi-cured resin sheet, another portion of said at least one wiring extends on a side surface of said semi-cured resin sheet, with said side surface being formed by a bent part of said semi-cured resin sheet, and still another portion of said at least one wiring extends on an inner side surface of said concave portion;
fitting into said concave portion a side surface of a circuit board having wiring patterns on an upper surface and a lower surface of said circuit board, respectively, so as to electrically interconnect said wiring patterns via said portion of said at least one wiring extending on the inner side surface of said concave portion; and
curing said semi-cured resin sheet after having been bent wherein said at least one wiring is disposed directly on the cured rigid resin.

* * * * *